United States Patent
Yamane et al.

(10) Patent No.: US 10,957,962 B2
(45) Date of Patent: Mar. 23, 2021

(54) MAGNETORESISTIVE EFFECT DEVICE

(71) Applicant: TDK CORPORATION, Tokyo (JP)

(72) Inventors: Takekazu Yamane, Tokyo (JP);
Tetsuya Shibata, Tokyo (JP); Tsuyoshi Suzuki, Tokyo (JP); Junichiro Urabe, Tokyo (JP); Atsushi Shimura, Tokyo (JP)

(73) Assignee: TDK CORPORATION, Tokyo (JP)

( * ) Notice: Subject to any disclaimer, the term of this patent is extended or adjusted under 35 U.S.C. 154(b) by 10 days.

(21) Appl. No.: 16/340,471

(22) PCT Filed: Oct. 23, 2017

(86) PCT No.: PCT/JP2017/038106
§ 371 (c)(1),
(2) Date: Apr. 9, 2019

(87) PCT Pub. No.: WO2018/084007
PCT Pub. Date: May 11, 2018

(65) Prior Publication Data
US 2019/0245254 A1    Aug. 8, 2019

(30) Foreign Application Priority Data
Nov. 7, 2016    (JP) .............................. JP2016-216854

(51) Int. Cl.
*H01P 1/218* (2006.01)
*H03B 15/00* (2006.01)
(Continued)

(52) U.S. Cl.
CPC ................ *H01P 1/218* (2013.01); *G11B 5/39* (2013.01); *H01L 43/08* (2013.01); *H03B 15/00* (2013.01)

(58) Field of Classification Search
CPC ........... H01P 1/218; G11B 5/39; H01L 43/08; H03B 15/00
(Continued)

(56) References Cited

U.S. PATENT DOCUMENTS

2015/0214953 A1*    7/2015    Lee ........................ H01L 21/822
                                                                327/510

FOREIGN PATENT DOCUMENTS

| JP | 2009-194070 A | 8/2009 |
| JP | 2016-143701 A | 8/2016 |

(Continued)

OTHER PUBLICATIONS

Beaujour et al., "Ferromagnetic resonance study of polycrystalline cobalt ultrathin films," Journal of Applied Physics, 2006, vol. 99, pp. 08N503-1-08N503-3.
(Continued)

*Primary Examiner* — Benny T Lee
*Assistant Examiner* — Hafizur Rahman
(74) *Attorney, Agent, or Firm* — Oliff PLC

(57) ABSTRACT

A magnetoresistive effect device includes an input port, an input-side signal line, an MR unit including a magnetoresistive effect element and a magnetic-field generating signal line, and an output unit including a magnetoresistive effect element, an output-side signal line, and an output port. The magnetoresistive effect device further includes a DC application terminal. The magnetoresistive effect element is connected to the output port via the output-side signal line in the output unit. The input-side signal line is arranged so that a high frequency magnetic field generated from the input-side signal line is applied to the magnetoresistive effect element in the MR unit. In the MR unit, the magnetoresistive effect element is connected to the magnetic-field generating signal line. The magnetic-field generating signal line is arranged so
(Continued)

that a high-frequency magnetic field generated from magnetic-field generating signal line is applied to the magnetoresistive effect element in the output unit.

23 Claims, 25 Drawing Sheets

(51) Int. Cl.
*G11B 5/39* (2006.01)
*H01L 43/08* (2006.01)

(58) Field of Classification Search
USPC .......................................................... 333/175
See application file for complete search history.

(56) References Cited

FOREIGN PATENT DOCUMENTS

| WO | 2007/032149 A1 | 3/2007 |
| WO | 2011/039843 A1 | 4/2011 |

OTHER PUBLICATIONS

Schumacher et al., "Precessional switching of the magnetization in microscopic magnetic tunnel junctions (invited)," Journal of Applied Physics, May 15, 2003, vol. 93, No. 10, Parts 2 & 3, pp. 7290-7294.

Bilzer et al., "Vector network analyzer ferromagnetic resonance of thin films on coplanar waveguides: Comparison of different evaluation methods," Journal of Applied Physics, 2007, vol. 101, pp. 074505-1-074505-5.

Kalarickal et al., "Ferromagnetic resonance linewidth in metallic thin films: Comparison of measurement methods," Journal of Applied Physics, 2006, vol. 99, pp. 093909-1-093909-7.

Jan. 9, 2018 International Search Report issued in International Patent Application No. PCT/JP2017/038106.

Konishi et al., "Radio-frequency amplification property of the MgO-based magnetic tunnel junction using field-induced ferromagnetic resonance," Applied Physics Letters, 2013, vol. 102, pp. 162409-1 to 162409-4.

\* cited by examiner

MAGNETORESISTIVE EFFECT DEVICE

TECHNICAL FIELD

The present invention relates to a magnetoresistive effect device including a magnetoresistive effect element.

BACKGROUND ART

The speed of wireless communication has increased in recent years with the increasing functions of mobile communication terminals, such as mobile phones. Since the communication speed is proportional to the band width of frequencies that are used, the number of frequency bands necessary for communication is increased. Accordingly, the number of high-frequency filters that are required to be mounted in the mobile communication terminals is increased. Spintronics has been studied in recent years as a field that is probably applicable to new high-frequency components. One phenomenon that has received attention is the ferromagnetic resonance phenomenon, which is caused by a magnetoresistive effect element (refer to NPL 1). Application of an alternating magnetic field to a ferromagnetic film of the magnetoresistive effect element causes ferromagnetic resonance in magnetization of the ferromagnetic film, and the magnetization of the ferromagnetic film greatly oscillates at frequencies near a ferromagnetic resonance frequency. The ferromagnetic resonance frequency of the ferromagnetic film is generally within a high-frequency band from several gigahertz to several tens of gigahertz.

CITATION LIST

Non Patent Literature

NPL 1: Journal Of Applied Physics 99, 08N503, 17 Nov. 2006

SUMMARY OF INVENTION

Technical Problem

Although the magnetoresistive effect element may be applied to a high-frequency device utilizing the ferromagnetic resonance phenomenon, specific configurations to apply the magnetoresistive effect element to a high-frequency device, such as a high-frequency filter, have not been proposed. Accordingly, the present invention aims to provide a magnetoresistive effect device capable of realizing a high-frequency device, such as a high-frequency filter, which includes a magnetoresistive effect element.

Solution to Problem

In order to achieve the above object, a magnetoresistive effect device according to the present invention includes an input port into which a high-frequency signal is to be input; an input-side signal line which is connected to the input port and through which high-frequency current corresponding to the high-frequency signal input into the input port flows; an MR unit including a magnetoresistive effect element and a magnetic-field generating signal line; and an output unit including a magnetoresistive effect element, an output-side signal line, and an output port. The magnetoresistive effect device further includes a DC application terminal so as to be capable of applying DC current or DC voltage to the magnetoresistive effect element in the MR unit and the magnetoresistive effect element in the output unit. The magnetoresistive effect element includes a first ferromagnetic layer, a second ferromagnetic layer, and a spacer layer arranged between the first ferromagnetic layer and the second ferromagnetic layer. The magnetoresistive effect element in the output unit is connected to the output port via the output-side signal line. The input-side signal line is arranged so that a high-frequency magnetic field generated from the input-side signal line is applied to the magnetoresistive effect element in the MR unit. In the MR unit, the magnetoresistive effect element is connected to the magnetic-field generating signal line so that high-frequency current output from the magnetoresistive effect element flows through the magnetic-field generating signal line. The magnetic-field generating signal line is arranged so that a high-frequency magnetic field generated from the magnetic-field generating signal line is applied to the magnetoresistive effect element in the output unit.

A magnetoresistive effect device according to the present invention includes an input port into which a high-frequency signal is to be input; an input-side signal line which is connected to the input port and through which high-frequency current corresponding to the high-frequency signal input into the input port flows; an N-number MR units (N is a natural number not smaller than two) each including a magnetoresistive effect element and a magnetic-field generating signal line; and an output unit including a magnetoresistive effect element, an output-side signal line, and an output port. The magnetoresistive effect device further includes a DC application terminal so as to be capable of applying DC current to the magnetoresistive effect elements in the N-number MR units and the magnetoresistive effect element in the output unit. The magnetoresistive effect element includes a first ferromagnetic layer, a second ferromagnetic layer, and a spacer layer arranged between the first ferromagnetic layer and the second ferromagnetic layer. The magnetoresistive effect element in the output unit is connected to the output port via the output-side signal line. The input-side signal line is arranged so that a high-frequency magnetic field generated from the input-side signal line is applied to the magnetoresistive effect element in a first MR unit in the MR units. In each of the MR units, the magnetoresistive effect element is connected to the magnetic-field generating signal line so that high-frequency current output from the magnetoresistive effect element flows through the magnetic-field generating signal line. The magnetic-field generating signal line in an M-th MR unit (M is a natural number that meets $1 \leq M \leq N-1$) in the MR units is arranged so that a high-frequency magnetic field generated from the magnetic-field generating signal line in the M-th MR unit is applied to the magnetoresistive effect element in an M+1-th MR unit in the MR units. The magnetic-field generating signal line in an N-th MR unit in the MR units is arranged so that a high-frequency magnetic field generated from the magnetic-field generating signal line in the N-th MR unit is applied to the magnetoresistive effect element in the output unit.

Advantageous Effects of Invention

According to the present invention, it is possible to provide a magnetoresistive effect device capable of realizing a high-frequency device, such as a high-frequency filter, which includes a magnetoresistive effect element.

DESCRIPTION OF EMBODIMENTS

Preferred embodiments of the present invention will herein be described in detail with reference to the attached drawings. The present invention is not limited by the content described in the following embodiments. Components described below include components easily supposed by persons skilled in the art, components substantially equivalent to each other, and components within equivalent ranges. In addition, the components described below may be appropriately combined with each other. Furthermore, the components may be omitted, replaced, or modified in various manners without departing from the spirit and scope of the present invention.

First Embodiment

Figure 1:
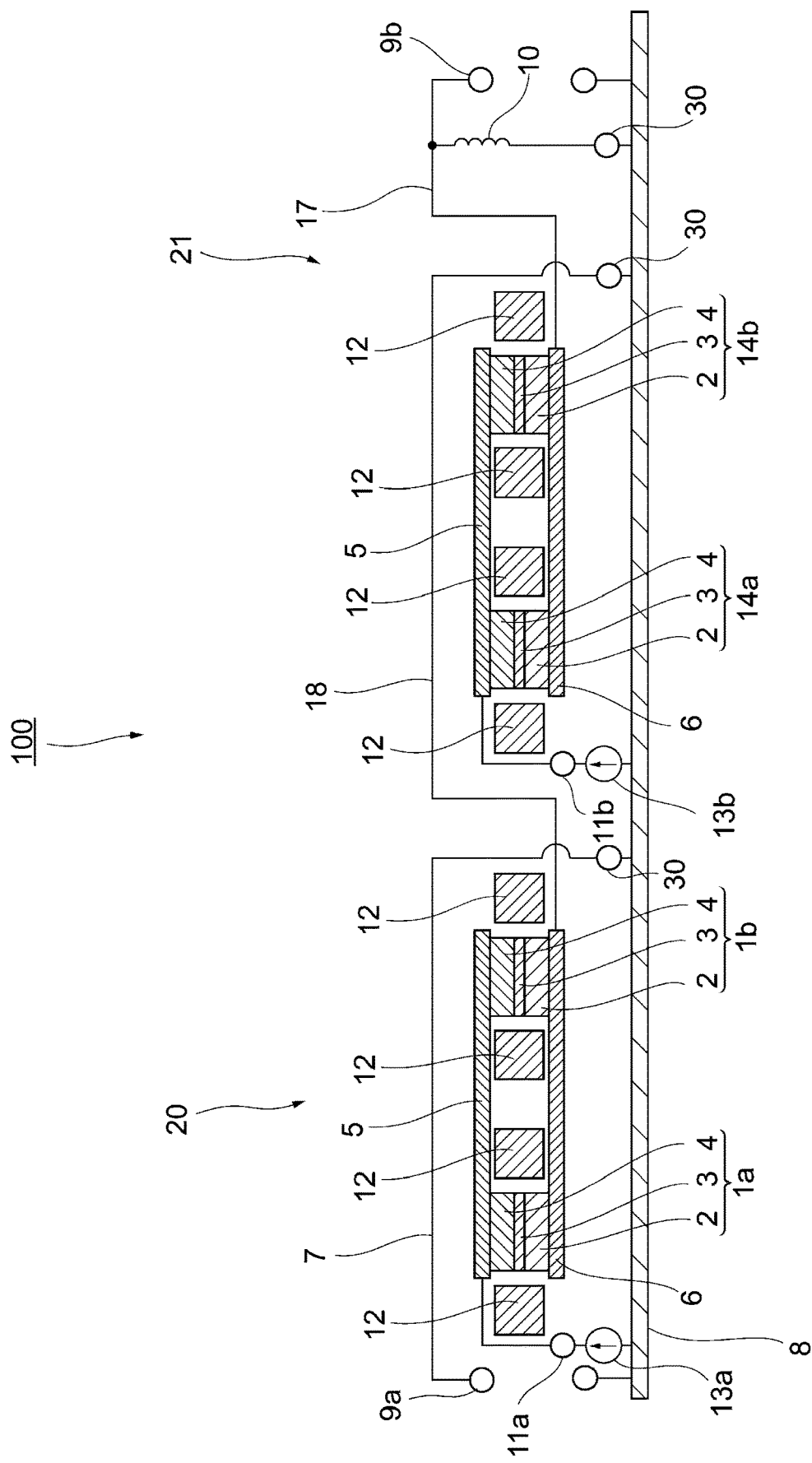
FIG. 1 is a schematic cross-sectional view illustrating the configuration of a magnetoresistive effect device according to a first embodiment.

FIG. 1 is a schematic cross-sectional view of a magnetoresistive effect device 100 according to a first embodiment of the present invention. The magnetoresistive effect device 100 includes an input port 9a into which a high-frequency signal, which is an alternating-current signal, is to be input, an input-side signal line 7 which is connected to the input port 9a and through which high-frequency current corresponding to the high-frequency signal input into the input port 9a flows, a magnetoresistive effect (MR) unit 20, and an output unit 21. The high-frequency signal to be input into the input port 9a is, for example, a signal having a frequency of 100 MHz or higher. The MR unit 20 includes magnetoresistive effect elements 1a and 1b and a magnetic-field generating signal line 18. The magnetoresistive effect element 1a is connected in parallel to the magnetoresistive effect element 1b between an upper electrode 5 and a lower electrode 6. The output unit 21 includes magnetoresistive effect elements 14a and 14b, an output-side signal line 17, and an output port 9b. The magnetoresistive effect element 14a is connected in parallel to the magnetoresistive effect element 14b between the upper electrode 5 and the lower electrode 6. In addition, the magnetoresistive effect device 100 includes an MR-unit-side DC current input terminal 11a and an output-unit-side DC current input terminal 11b, which are DC current input terminals, so that direct-current (DC) current is capable of being applied to the magnetoresistive effect elements 1a and 1b in the MR unit 20 and the magnetoresistive effect elements 14a and 14b in the output unit 21. The MR-unit-side DC current input terminal 11a is an example of a DC application terminal and, in particular, is an example of an MR-unit-side DC application terminal. The output-unit-side DC current input terminal 11b is an example of the DC application terminal and, in particular, is an example of an output-unit-side DC application terminal. The DC current in this description is current the direction of which is not varied with time and includes current the magnitude of which is varied with time. Direct-current (DC)

voltage in this description is voltage the direction of which is not varied with time and includes voltage the magnitude of which is varied with time.

Each of the magnetoresistive effect elements 1a, 1b, 14a, and 14b includes a first ferromagnetic layer 2, a second ferromagnetic layer 4, and a spacer layer 3 arranged between the first ferromagnetic layer 2 and the second ferromagnetic layer 4. Although the first ferromagnetic layer 2 is described as a magnetization fixed layer and the second ferromagnetic layer is described as a magnetization free layer, the first ferromagnetic layer and the second ferromagnetic layer may function as either of the magnetization fixed layer and the magnetization free layer. The magnetoresistive effect elements 1a, 1b, 14a, and 14b have the same configuration. The magnetoresistive effect elements 14a and 14b, which are connected in parallel to each other, in the output unit 21 is connected to the output port 9b via the output-side signal line 17. Upon input of a high-frequency signal into the input port 9a, high-frequency current corresponding to the high-frequency signal input into the input port 9a flows through the input-side signal line 7 and a high-frequency magnetic field corresponding to the input high-frequency current is generated from the input-side signal line 7. The input-side signal line 7 is arranged so that the high-frequency magnetic field generated from the input-side signal line 7 is applied to the magnetization free layers 4 of the magnetoresistive effect elements 1a and 1b in the MR unit 20. In the MR unit 20, the magnetoresistive effect elements 1a and 1b, which are connected in parallel to each other, are connected to the magnetic-field generating signal line 18 so that the high-frequency current output from the magnetoresistive effect elements 1a and 1b, which are connected in parallel to each other, flows through the magnetic-field generating signal line 18. When the high-frequency current output from the magnetoresistive effect elements 1a and 1b flows through the magnetic-field generating signal line 18, the high-frequency magnetic field corresponding to the high-frequency current is generated from the magnetic-field generating signal line 18. The magnetic-field generating signal line 18 is arranged so that the high-frequency magnetic field generated from the magnetic-field generating signal line 18 is applied to the magnetization free layers 4 of the magnetoresistive effect elements 14a and 14b in the output unit 21.

In the MR unit 20, the MR-unit-side DC current input terminal 11a is connected to the magnetoresistive effect elements 1a and 1b, which are connected in parallel to each other. In the output unit 21, the output-unit-side DC current input terminal 11b is connected to the magnetoresistive effect elements 14a and 14b, which are connected in parallel to each other.

In the example illustrated in FIG. 1, the input-side signal line 7 is connected to the input port 9a and is capable of being connected to ground 8 via a reference voltage terminal 30. The magnetic-field generating signal line 18 is connected to the magnetoresistive effect elements 1a and 1b, which are connected in parallel to each other, in the MR unit 20 and is capable of being connected to the ground 8 via the reference voltage terminal 30. The ground 8 may be outside the magnetoresistive effect device 100.

In the MR unit 20, the magnetization free layers 4 of the magnetoresistive effect element 1a and the magnetoresistive effect element 1b are connected to the same upper electrode 5 and the magnetization fixed layers 2 of the magnetoresistive effect element 1a and the magnetoresistive effect element 1b are connected to the same lower electrode 6. One end (at the magnetization fixed layer 2 side) of the magnetoresistive effect elements 1a and 1b is connected to the magnetic-field generating signal line 18 via the lower electrode 6, and the other end (at the magnetization free layer 4 side) of the magnetoresistive effect elements 1a and 1b is connected to the MR-unit-side DC current input terminal 11a via the upper electrode 5.

In the output unit 21, the magnetization free layers 4 of the magnetoresistive effect element 14a and the magnetoresistive effect element 14b are connected to the same upper electrode 5 and the magnetization fixed layers 2 of the magnetoresistive effect element 14a and the magnetoresistive effect element 14b are connected to the same lower electrode 6. One end (at the magnetization fixed layer 2 side) of the magnetoresistive effect elements 14a and 14b is connected to the output-side signal line 17 via the lower electrode 6, and the other end (at the magnetization free layer 4 side) of the magnetoresistive effect elements 14a and 14b is connected to the output-unit-side DC current input terminal 11b via the upper electrode 5. Each of the upper electrode 5 and the lower electrode 6 is preferably composed of a film made of Ta, Cu, Au, AuCu, or Ru or a film made of two or more of the above materials.

Magnetic-field applying mechanisms 12 are individually disposed near the respective magnetoresistive effect elements 1a, 1b, 14a, and 14b so that individual magnetic fields (static magnetic fields) are capable of being independently applied to the respective magnetoresistive effect elements 1a and 1b in the MR unit 20 and the respective magnetoresistive effect elements 14a and 14b in the output unit 21. In the MR unit 20, the high-frequency magnetic fields generated from the input-side signal line 7 are applied to the magnetization free layers 4 of the magnetoresistive effect elements 1a and 1b in a state in which the static magnetic fields are individually applied from the respective magnetic-field applying mechanisms 12 to the corresponding magnetoresistive effect elements 1a and 1b. Also in the output unit 21, the high-frequency magnetic fields generated from the magnetic-field generating signal line 18 are applied to the magnetization free layers 4 of the magnetoresistive effect elements 14a and 14b in a state in which the static magnetic fields are individually applied from the respective magnetic-field applying mechanisms 12 to the corresponding magnetoresistive effect elements 14a and 14b. Each of the magnetic-field applying mechanisms 12 serves as a frequency setting mechanism capable of setting a ferromagnetic resonant frequency of the magnetization free layer 4 of each of the magnetoresistive effect elements 1a, 1b, 14a, and 14b. For example, the magnetic-field applying mechanism 12 is of an electromagnetic type or a strip line type capable of variably controlling the strength of the applied magnetic field using voltage or current. Alternatively, the magnetic-field applying mechanism 12 may be a combination of the electromagnetic type or the strip line type with a permanent magnet that applies only a constant magnetic field. The magnetic-field applying mechanism 12 varies the magnetic fields to be applied to the magnetoresistive effect elements 1a, 1b, 14a, and 14b to enable the ferromagnetic resonant frequencies of the magnetization free layers 4 to be varied.

Figure 2:
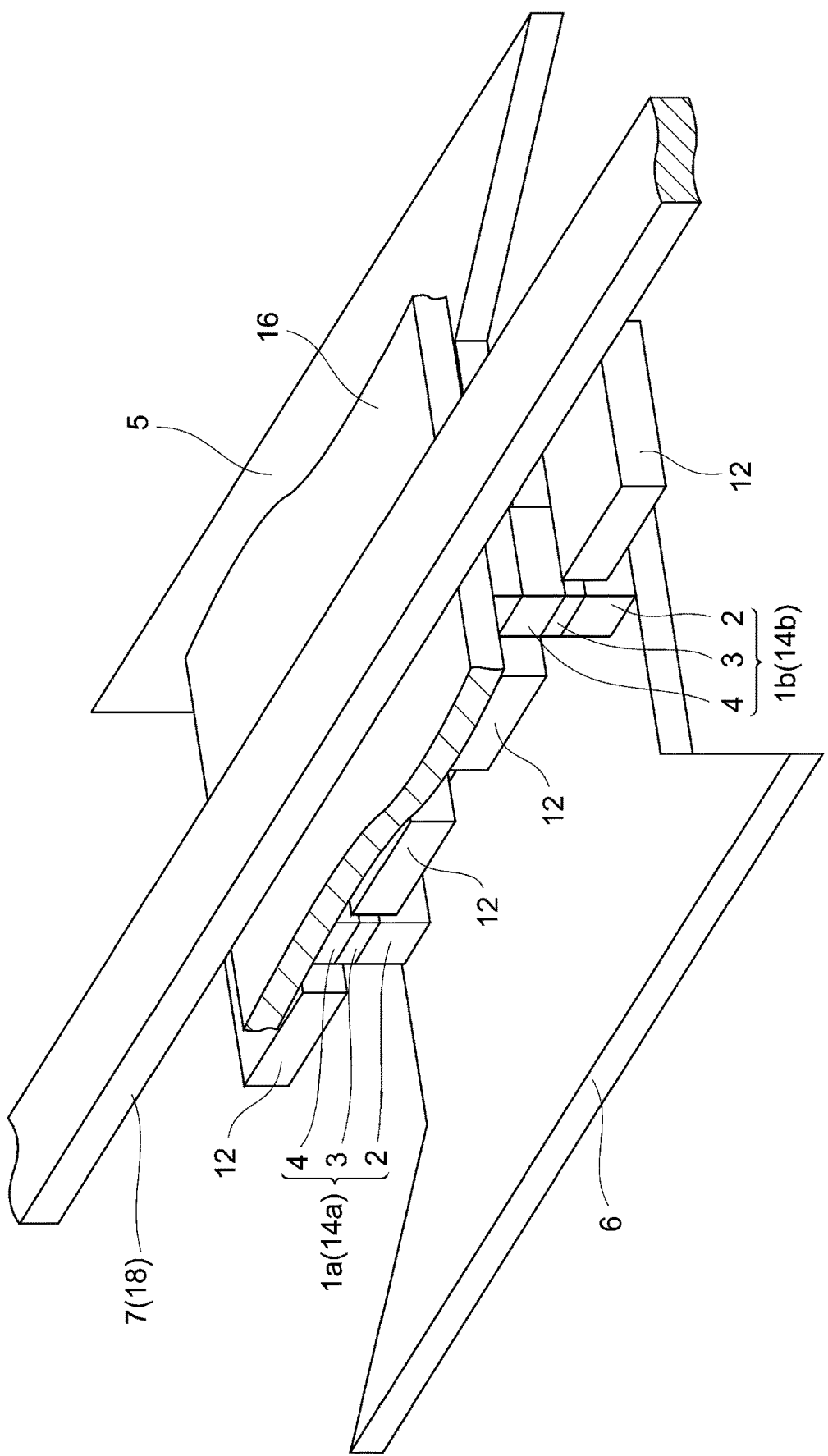
FIG. 2 is a schematic view illustrating the structure of part of an MR unit (an output unit) in the magnetoresistive effect device according to the first embodiment.

FIG. 2 is a schematic view illustrating the structure of part of the MR unit 20 (the output unit 21) in the magnetoresistive effect device 100. The magnetoresistive effect elements 1a and 1b (14a and 14b) are composed by laminating the magnetization fixed layer 2, the spacer layer 3, and the magnetization free layer 4 in this order and have a structure in which the magnetoresistive effect elements 1a and 1b (the magnetoresistive effect elements 14a and 14b) are sandwiched between the upper electrode 5 and the lower electrode 6. An insulator 16 exists between the upper electrode 5 and the input-side signal line 7 (the magnetic-field generating signal line 18) to electrically isolate the input-side signal line 7 (the magnetic-field generating signal line 18) from the upper electrode 5. When the high-frequency current flows through the input-side signal line 7 (the magnetic-field generating signal line 18), the high-frequency magnetic field is applied from the input-side signal line 7 (the magnetic-field generating signal line 18) to the magnetization free layer 4.

The ground 8 (FIG. 1) functions as reference voltage. The shape of each of the input-side signal line 7, the magnetic-field generating signal line 18, and the output-side signal line 17 (FIG. 1) with the ground 8 is preferably of a micro strip line (MSL) type or a coplanar waveguide (CPW) type. In design of the micro strip line shape or the coplanar waveguide shape, designing the widths of the input-side signal line 7, the magnetic-field generating signal line 18, and the output-side signal line 17 and the distance to the ground so that the characteristic impedances of the input-side signal line 7, the magnetic-field generating signal line 18, and the output-side signal line 17 are equal to the impedance of a circuit system enables the transmission losses through input-side signal line 7, the magnetic-field generating signal line 18, and the output-side signal line 17 to be reduced. Each of the input-side signal line 7, the magnetic-field generating signal line 18, and the output-side signal line 17 is desirably made of a material having a high electrical conductivity, such as Au, Cu, AuCu, Ag, or Al.

An inductor 10 is connected to the output-side signal line 17 so as to be parallel to the output port 9b. In the example illustrated in FIG. 1, one end of the inductor 10 is connected to the output-side signal line 17 and the other end of the inductor is capable of being connected to the ground 8 via the reference voltage terminal 30. The inductor 10 has a function to cut off high-frequency components of the current and pass constant components of the current with its inductance component. The inductor 10 may be a chip inductor or an inductor composed of a pattern line. Alternatively, the inductor 10 may be a resistance element having an inductance component. The inductor 10 preferably has an inductance value of 10 nH or more. The inductor 10 is capable of not passing the high-frequency signal but selectively passing a direct-current signal to the ground 8. This causes the DC current input from the output-unit-side DC current input terminal 11b to flow through a closed circuit including the magnetoresistive effect elements 14a and 14b, the output-side signal line 17, the inductor 10, the output-unit-side DC current input terminal 11b, and the ground 8 in the output unit 21. This closed circuit enables the DC current to be efficiently applied to the magnetoresistive effect elements 14a and 14b in the output unit 21.

The MR-unit-side DC current input terminal 11a is connected to the magnetoresistive effect elements 1a and 1b, which are connected in parallel to each other, in the MR unit 20. Connection of an MR-unit-side direct-current source 13a to the MR-unit-side DC current input terminal 11a enables the DC current to be applied to the magnetoresistive effect elements 1a and 1b in the MR unit 20. The output-unit-side DC current input terminal 11b is connected to the magnetoresistive effect elements 14a and 14b in the output unit 21. Connection of an output-unit-side direct-current source 13b to the output-unit-side DC current input terminal 11b enables the DC current to be applied to the magnetoresistive effect elements 14a and 14b in the output unit 21.

The MR-unit-side direct-current source 13a is connected to the MR-unit-side DC current input terminal 11a and the ground 8. The MR-unit-side direct-current source 13a applies the DC current to a closed circuit including the MR-unit-side DC current input terminal 11a, the magnetoresistive effect elements 1a and 1b, the magnetic-field generating signal line 18, and the ground 8 through the MR-unit-side DC current input terminal 11a in the MR unit 20. The output-unit-side direct-current source 13b is connected to the output-unit-side DC current input terminal 11b and the ground 8. The output-unit-side direct-current source 13b applies the DC current to a closed circuit including output-unit-side DC current input terminal 11b, the magnetoresistive effect elements 14a and 14b, the output-side signal line 17, the inductor 10, and the ground 8 through the output-unit-side DC current input terminal 11b in the output unit 21. Each direct-current source is composed of, for example, a circuit in which a variable resistor is combined with a DC voltage source and is capable of varying the current value of the DC current. The direct-current source may be composed of a circuit which is capable of generating constant DC current and in which a fixed resistor is combined with a DC voltage source. The magnetoresistive effect device 100 is used with each reference voltage terminal 30 being connected to the ground 8.

The magnetization fixed layer 2 is made of a ferromagnetic material and the magnetization direction of the magnetization fixed layer 2 is substantially fixed to one direction. The magnetization fixed layer 2 is preferably made of a material having high spin polarizability, such as Fe, Co, Ni, an alloy of Ni and Fe, an alloy of Fe and Co, or an ally of Fe, Co, and B. This achieves a high magnetoresistive change rate. The magnetization fixed layer 2 may be made of a Heusler alloy. The magnetization fixed layer 2 preferably has a film thickness of 1 nm to 10 nm. An antiferromagnetic layer may be added so as to be in contact with the magnetization fixed layer 2 in order to fix the magnetization of the magnetization fixed layer 2. Alternatively, the magnetization of the magnetization fixed layer 2 may be fixed using magnetic anisotropy caused by the crystal structure of the magnetization fixed layer 2 or the shape thereof. The antiferromagnetic layer may be made of FeO, CoO, NiO, $CuFeS_2$, IrMn, FeMn, PtMn, Cr, or Mn.

The spacer layer 3 is arranged between the magnetization fixed layer 2 and the magnetization free layer 4. The magnetization of the magnetization fixed layer 2 and the magnetization of the magnetization free layer 4 interact with each other to achieve the magnetoresistive effect. The spacer layer 3 may be formed of a layer made of a conductive material, an insulating material, or a semiconductor material. Alternatively, the spacer layer 3 may be formed of a layer in which a current flow point composed of a conductor is included in an insulator.

When a non-magnetic conductive material is used for the spacer layer 3, the non-magnetic conductive material may be Cu, Ag, Au, or Ru. In this case, a giant magnetoresistive (GMR) effect is produced in the magnetoresistive effect element. When the GMR effect is used, the spacer layer 3 preferably has a film thickness of about 0.5 nm to 3.0 nm.

When a non-magnetic insulating material is used for the spacer layer 3, the non-magnetic insulating material may be $Al_2O_3$ or MgO. In this case, a tunnel magnetoresistive (TMR) effect is produced in the magnetoresistive effect element. Adjusting the film thickness of the spacer layer 3 so that a coherent tunnel effect is produced between the magnetization fixed layer 2 and the magnetization free layer 4 achieves a high magnetoresistive change rate. When the TMR effect is used, the spacer layer 3 preferably has a film thickness of about 0.5 nm to 3.0 nm.

When a non-magnetic semiconductor material is used for the spacer layer 3, the non-magnetic semiconductor material may be ZnO, $In_2O_3$, $SnO_2$, ITO, $GaO_x$, or $Ga_2O_x$. The spacer layer 3 preferably has a film thickness of about 1.0 nm to 4.0 nm.

When a layer in which the current flow point composed of a conductor is included in a non-magnetic insulator is used as the spacer layer 3, the spacer layer 3 preferably has a structure in which the current flow point composed of a conductor made of, for example, CoFe, CoFeB, CoFeSi, CoMnGe, CoMnSi, CoMnAl, Fe, Co, Au, Cu, Al, or Mg is included in a non-magnetic insulator made of $Al_2O_3$ or MgO. In this case, the spacer layer 3 preferably has a film thickness of about 0.5 nm to 2.0 nm.

The direction of the magnetization of the magnetization free layer 4 is capable of being varied. The magnetization free layer 4 is made of a ferromagnetic material. The direction of the magnetization of the magnetization free layer 4 is capable of being varied with, for example, an externally applied magnetic field or spin polarized electrons. When the magnetization free layer 4 is made of a material having a magnetic easy axis in an in-plane direction, the material may be, for example, CoFe, CoFeB, CoFeSi, CoMnGe, CoMnSi, or CoMnAl. The magnetization free layer 4 preferably has a film thickness of about 1 nm to 10 nm. When the magnetization free layer 4 is made of a material having the magnetic easy axis in a plane normal direction, the material may be, for example, Co, a CoCr-based alloy, a Co multilayer film, a CoCrPt-based alloy, an FePt-based alloy, an SmCo-based alloy including rare earth, or a TbFeCo alloy. The magnetization free layer 4 may be made of a Heusler alloy. A material having high spin polarizability may be provided between the magnetization free layer 4 and the spacer layer 3. This achieves a high magnetoresistive change rate. The material having high spin polarizability may be, for example, a CoFe alloy or a CoFeB alloy. Each of the CoFe alloy and the CoFeB alloy preferably has a film thickness of about 0.2 nm to 1.0 nm.

A cap layer, a seed layer, or a buffer layer may be disposed between the upper electrode 5 and each magnetoresistive effect element and between the lower electrode 6 and each magnetoresistive effect element in the MR unit 20 and the output unit 21. Each of the cap layer, the seed layer, and the buffer layer may be made of Ru, Ta, Cu, or Cr or may be formed of a stacked film including a Ru layer, a Ta layer, a Cu layer, and/or a Cr layer. Each of the cap layer, the seed layer, and the buffer layer preferably has a film thickness of about 2 nm to 10 nm.

In the MR unit 20 and the output unit 21, when each magnetoresistive effect element has a rectangular shape (including a square shape) in plan view, the magnetoresistive effect element desirably has long sides of about 100 nm or 100 nm or less. When each magnetoresistive effect element does not have a rectangular shape (including a square shape) in plan view, the long sides of a rectangle circumscribed around the plan view shape of the magnetoresistive effect element with a minimum area are defined as the long sides of the magnetoresistive effect element. When the long sides of the magnetoresistive effect element are short, for example, about 100 nm, the magnetization of the magnetization free layer 4 is capable of having a single magnetic domain to realize the ferromagnetic resonance phenomenon with high efficiency. The "plan view shape" means the shape of each magnetoresistive effect element when the magnetoresistive effect element is viewed from above a plane perpendicular to the stacking direction of the respective layers composing the magnetoresistive effect element.

The ferromagnetic resonance phenomenon will now be described.

When the high-frequency magnetic fields are applied to the magnetization free layer 4, the magnetization of the magnetization free layer 4 greatly oscillates for the high-frequency magnetic fields having frequencies near the ferromagnetic resonant frequency of the magnetization free layer 4, among the applied high-frequency magnetic fields. This phenomenon is called the ferromagnetic resonance phenomenon. The ferromagnetic resonance frequency varies with the effective magnetic field in the magnetization free layer 4. An effective magnetic field $H_{eff}$ in the magnetization free layer 4 is represented by the following equation:

$$H_{eff} = H_E + H_k + H_D + H_{EX}$$

where $H_E$ denotes an external magnetic field to be applied to the magnetization free layer 4, $H_k$ denotes an anisotropy magnetic field in the magnetization free layer 4, $H_D$ denotes a demagnetizing field in the magnetization free layer 4, and $H_{EX}$ denotes an exchange coupling magnetic field in the magnetization free layer 4. Each magnetic-field applying mechanism 12 is an effective magnetic field setting mechanism that is capable of setting the effective magnetic field $H_{eff}$ in the magnetization free layer 4 in each magnetoresistive effect element by applying the magnetic field to each of the magnetoresistive effect elements 1a, 1b, 14a, and 14b and applying the external magnetic field $H_E$ to the magnetization free layer 4 of each magnetoresistive effect element. The magnetic-field applying mechanism 12, which is the effective magnetic field setting mechanism, varies the effective magnetic field in the magnetization free layer 4 in each magnetoresistive effect element by varying the magnetic field to be applied to each of the magnetoresistive effect elements 1a, 1b, 14a, and 14b to enable the ferromagnetic resonance frequency of the magnetization free layer 4 of each of the magnetoresistive effect elements 1a, 1b, 14a, and 14b to be varied. As described above, varying the magnetic field to be applied to each of the magnetoresistive effect elements 1a, 1b, 14a, and 14b varies the ferromagnetic resonance frequency of the magnetization free layer 4 of each of the magnetoresistive effect elements 1a, 1b, 14a, and 14b. The ferromagnetic resonant frequency is generally increased as the strength of the static magnetic field to be applied to the magnetoresistive effect element (the magnetization free layer 4) is increased.

In addition, varying the current density of the DC current to be applied to the magnetoresistive effect element varies the ferromagnetic resonant frequency of the magnetization free layer 4. The ferromagnetic resonant frequency of the magnetization free layer 4 is generally decreased as the current density of the DC current to be applied to the magnetoresistive effect element is increased. Accordingly, the ferromagnetic resonant frequency of the magnetization free layer 4 of each magnetoresistive effect element is capable of being variably controlled by varying the magnetic field (the static magnetic field) to be applied to each of the magnetoresistive effect elements 1a, 1b, 14a, and 14b (the magnetization free layer 4 of each magnetoresistive effect element) from the corresponding magnetic-field applying mechanism 12 or varying the DC current to be applied from the MR-unit-side DC current input terminal 11a to the magnetoresistive effect elements 1a and 1b or the DC current to be applied from the output-unit-side DC current input terminal 11b to the magnetoresistive effect elements 14a and 14b. The current density of the DC current to be applied to each magnetoresistive effect element is preferably smaller than an oscillation threshold current density of each magnetoresistive effect element. The oscillation threshold current density of the magnetoresistive effect element means the current density at a threshold value at which the magnetoresistive effect element oscillates at start of precession of the magnetization of the magnetization free layer of the magnetoresistive effect element at a constant frequency and at a constant amplitude (the output (the resistance value) of the magnetoresistive effect element is varied at a constant frequency and at a constant amplitude) in response to application of the DC current having a current density higher than or equal to the oscillation threshold current density.

Upon input of the high-frequency signal into the input port 9a, the high-frequency current corresponding to the high-frequency signal input into the input port 9a flows through the input-side signal line 7 and the high-frequency magnetic field corresponding to the input high-frequency current is generated from the input-side signal line 7. The high-frequency magnetic field generated from the input-side signal line 7 is applied to the magnetization free layer 4 of each of the magnetoresistive effect elements 1a and 1b in the MR unit 20, and the magnetization of the magnetization free layer 4 of each magnetoresistive effect element oscillates in response to the high-frequency magnetic field generated from the input-side signal line 7. Due to the magnetoresistive effect, the resistance value of each of the magnetoresistive effect elements 1a and 1b in the MR unit 20 oscillates in response to the oscillation of the magnetization free layer 4 of each magnetoresistive effect element. Upon application of the DC current from the MR-unit-side DC current input terminal 11a, a high-frequency signal corresponding to the input high-frequency signal is supplied from the magnetoresistive effect elements 1a and 1b to the magnetic-field generating signal line 18 as voltage, which is a product of the oscillating resistance value of each of the magnetoresistive effect elements 1a and 1b in the MR unit 20 and the DC current flowing through each of the magnetoresistive effect elements 1a and 1b.

The frequency of the high-frequency magnetic field generated from the input-side signal line 7 corresponds to the frequency of the high-frequency signal input into the input port 9a. Upon application of the high-frequency magnetic field generated from the input-side signal line 7 to the magnetization free layer 4 of each of the magnetoresistive effect elements 1a and 1b, the magnetization of the magnetization free layer 4 of each magnetoresistive effect element greatly oscillates for the high-frequency signals having frequencies near the ferromagnetic resonant frequency of the magnetization free layer 4 of each magnetoresistive effect element, among the input high-frequency signals, due to a ferromagnetic resonance effect of the magnetization free layer 4 of each magnetoresistive effect element, to cause the resistance value of each of the magnetoresistive effect elements 1a and 1b to greatly oscillate. Accordingly, the high-frequency signals having frequencies near the ferromagnetic resonant frequency of the magnetization free layer 4 of each magnetoresistive effect element are supplied from each of the magnetoresistive effect elements 1a and 1b to the magnetic-field generating signal line 18 with strengths greater than those of the high-frequency signals of other frequencies.

When the high-frequency current output from the magnetoresistive effect elements 1a and 1b in the MR unit 20 flows through the magnetic-field generating signal line 18, the high-frequency magnetic field corresponding to the high-frequency current is generated from the magnetic-field generating signal line 18. The high-frequency magnetic field generated from the magnetic-field generating signal line 18 is applied to the magnetization free layer 4 of each of the magnetoresistive effect elements 14a and 14b in the output unit 21 and the magnetization of the magnetization free layer 4 of each magnetoresistive effect element oscillates in response to the high-frequency magnetic field generated from the magnetic-field generating signal line 18. Due to the magnetoresistive effect, the resistance value of each of the magnetoresistive effect elements 14a and 14b in the output unit 21 oscillates in response to the oscillation of the magnetization of the magnetization free layer 4 of each magnetoresistive effect element. Upon application of the DC current from the output-unit-side DC current input terminal 11b, a high-frequency signal corresponding to the high-frequency signal supplied from the magnetoresistive effect elements 1a and 1b in the MR unit 20 is supplied from the magnetoresistive effect elements 14a and 14b in the output unit 21 to the output port 9b through the output-side signal line 17 as voltage, which is a product of the oscillating resistance value of each of the magnetoresistive effect elements 14a and 14b in the output unit 21 and the DC current flowing through each of the magnetoresistive effect elements 14a and 14b.

The frequency of the high-frequency magnetic field generated from the magnetic-field generating signal line 18 corresponds to the frequency of the high-frequency signal output from the magnetoresistive effect elements 1a and 1b in the MR unit 20. Upon application of the high-frequency magnetic field generated from the magnetic-field generating signal line 18 to the magnetization free layer 4 of each of the magnetoresistive effect elements 14a and 14b, the magnetization of the magnetization free layer 4 of each magnetoresistive effect element greatly oscillates for the high-frequency signals having frequencies near the ferromagnetic resonant frequency of the magnetization free layer 4 of each magnetoresistive effect element, among the high-frequency signals output from the magnetoresistive effect elements 1a and 1b in the MR unit 20, due to the ferromagnetic resonance effect of the magnetization free layer 4 of each magnetoresistive effect element, to cause the resistance value of each of the magnetoresistive effect elements 14a and 14b to greatly oscillate. Accordingly, the high-frequency signals having frequencies near the ferromagnetic resonant frequency of the magnetization free layer 4 of each magnetoresistive effect element are supplied from each of the magnetoresistive effect elements 14a and 14b to the output port 9b with strengths greater than those of the high-frequency signals of other frequencies. In other words, since the magnetoresistive effect device 100 is capable of selectively passing the high-frequency signals having frequencies near the ferromagnetic resonant frequency of the magnetization free layer 4 of each magnetoresistive effect element (frequencies in a pass band) at the two stages of the MR unit 20 and the output unit 21, the magnetoresistive effect device 100 serves as a high-frequency filter having high frequency selectivity.

In addition, since varying the DC current to be applied to the magnetoresistive effect elements 1a and 1b (the DC current to be applied from the MR-unit-side DC current input terminal 11a) and the DC current to be applied to the magnetoresistive effect elements 14a and 14b (the DC current to be applied from the output-unit-side DC current input terminal 11b) enables the ferromagnetic resonant frequencies of the magnetization free layers 4 of the magnetoresistive effect elements 1a, 1b, 14a, and 14b to be variably controlled, the magnetoresistive effect device 100 may function as a variable frequency filter capable of varying the pass band.

Furthermore, since the magnetic-field applying mechanism 12 is capable of varying the effective magnetic field in the magnetization free layer 4 of each of the magnetoresistive effect elements 1a, 1b, 14a, and 14b to vary the ferromagnetic resonant frequency of the magnetization free layer 4 of each of the magnetoresistive effect elements 1a, 1b, 14a, and 14b, the magnetoresistive effect device 100 may function as the variable frequency filter capable of varying the pass band.

Furthermore, when attention is given to one arbitrary frequency in the pass band when the pass band is varied, the phase of the passing signal is varied. In other words, the magnetoresistive effect device 100 may function as a phase shifter capable of varying the phase of a signal having a frequency in the pass band (operating band).

Since the high-frequency signal is not output from the input port 9a even when the high-frequency signal is input from the output port 9b into the input port 9a, the magnetoresistive effect device 100 may function as an isolator. In addition, when the strength of the high-frequency signal output from the output port 9b is greater than the strength of the high-frequency signal input into the input port 9a, the magnetoresistive effect device 100 may also function as an amplifier. Increasing the magnitude of at least one of the DC current supplied from the MR-unit-side DC current input terminal 11a and the DC current supplied from the output-unit-side DC current input terminal 11b to a certain value or higher enables the strength of the high-frequency signal output from the output port 9b to be greater than the strength of the high-frequency signal input into the input port 9a.

Figure 3:
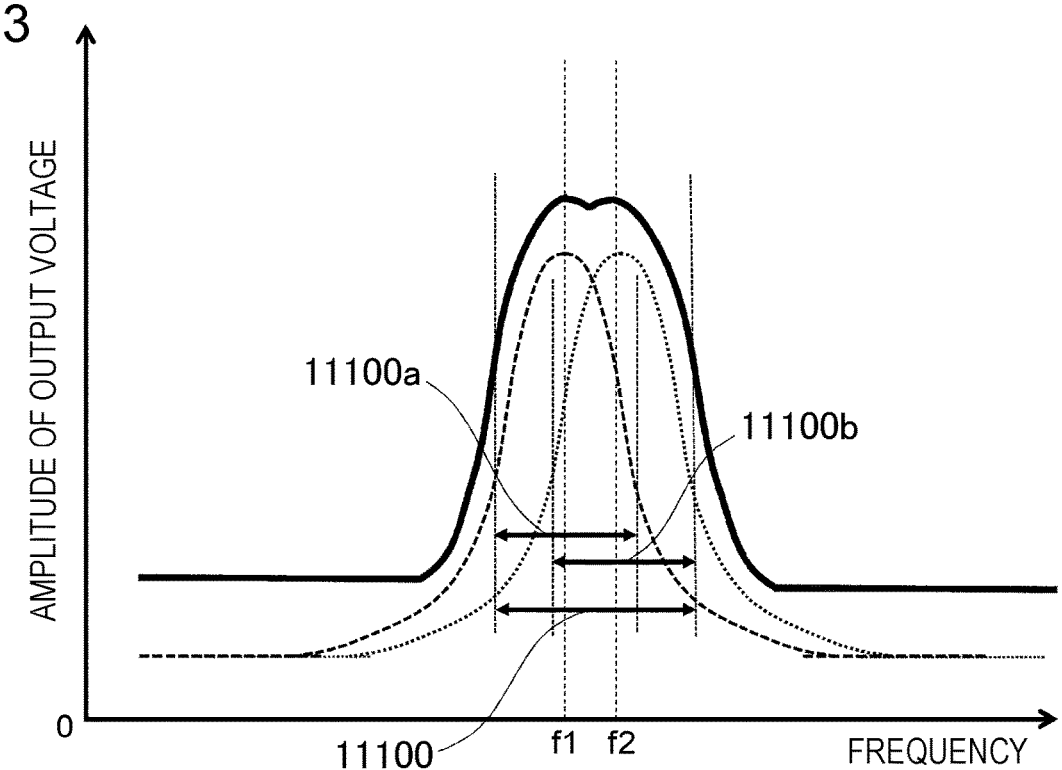
FIG. 3 is a graph illustrating the relationship between the frequency of a high-frequency signal to be input into the magnetoresistive effect device according to the first embodiment and the amplitude of output voltage output from magnetoresistive effect elements in the MR unit.

It is assumed that the static magnetic field is applied from each magnetic-field applying mechanism 12 to the corresponding magnetoresistive effect element so that the ferromagnetic resonant frequency of the magnetization free layer 4 of the magnetoresistive effect element 1a in the MR unit 20 is equal to that of the magnetoresistive effect element 14a in the output unit 21 and the ferromagnetic resonant frequency of the magnetization free layer 4 of the magnetoresistive effect element 1b in the MR unit 20 is equal to that of the magnetoresistive effect element 14b in the output unit 21 and so that the ferromagnetic resonant frequencies of the magnetization free layers 4 of the magnetoresistive effect element 1a in the MR unit 20 and of the magnetoresistive effect element 14a in the output unit 21 are lower than the ferromagnetic resonant frequencies of the magnetization free layers 4 of the magnetoresistive effect element 1b in the MR unit 20 and of the magnetoresistive effect element 14b in the output unit 21. FIG. 3 is a graph illustrating the relationship between the frequency of the high-frequency signal to be input into the magnetoresistive effect device 100 and the amplitude of the voltage output from the magnetoresistive effect elements 1a and 1b, which are connected in parallel to each other, in the MR unit 20 in the above case. Referring to FIG. 3, the vertical axis represents the amplitude of the output voltage and the horizontal axis represents the frequency. For example, as illustrated in FIG. 3, f1<f2 where f1 denotes the ferromagnetic resonant frequency of the magnetization free layer 4 of the magnetoresistive effect element 1a and f2 denotes the ferromagnetic resonant frequency of the magnetization free layer 4 of the magnetoresistive effect element 1b. As illustrated in FIG. 3, adjusting the strength of the magnetic field to be applied to each of the magnetoresistive effect elements 1a and 1b from the corresponding magnetic-field applying mechanism 12 so that part of frequencies near the ferromagnetic resonant frequency f1 of the magnetization free layer 4 of the magnetoresistive effect element 1a (a pass band 11100a in FIG. 3) is overlapped with part of frequencies near the ferromagnetic resonant frequency f2 of the magnetization free layer 4 of the magnetoresistive effect element 1b (a pass band 11100b in FIG. 3) in the MR unit 20 widens the frequency band (a pass band 11100 in FIG. 3) of the high-frequency signals which the magnetoresistive effect elements 1a and 1b are capable of supplying to the magnetic-field generating signal line 18 with high strengths, as illustrated in FIG. 3.

Figure 4:
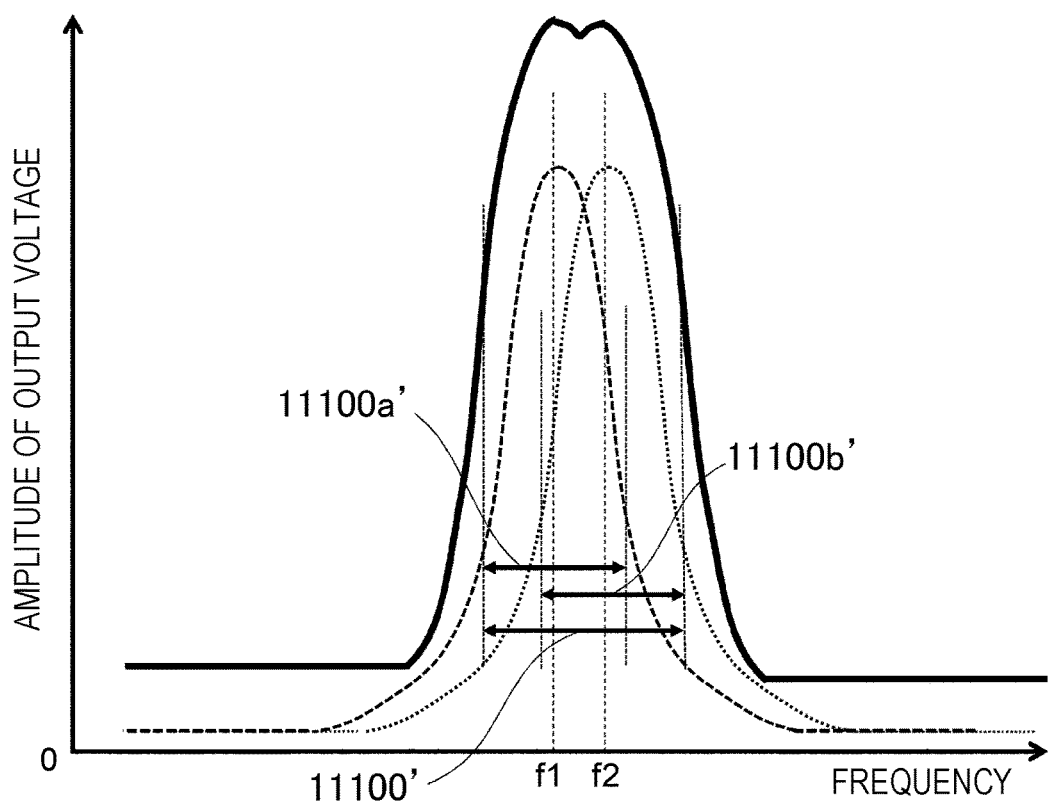
FIG. 4 is a graph illustrating the relationship between the frequency of a high-frequency signal to be input into the magnetoresistive effect device according to the first embodiment and the amplitude of output voltage.

FIG. 4 is a graph illustrating the relationship between the frequencies of the high-frequency signals output from the magnetoresistive effect elements 1a and 1b in the MR unit 20 and the amplitude of the voltage output from the output port 9b in the above case. Referring to FIG. 4, the vertical axis represents the amplitude of the output voltage and the horizontal axis represents the frequency. For example, as illustrated in FIG. 4, f1<f2 where f1 denotes the ferromagnetic resonant frequency of the magnetization free layer 4 of the magnetoresistive effect element 14a and f2 denotes the ferromagnetic resonant frequency of the magnetization free layer 4 of the magnetoresistive effect element 14b in the output unit 21. As illustrated in FIG. 4, adjusting the strength of the magnetic field to be applied to each of the magnetoresistive effect elements 14a and 14b from the corresponding magnetic-field applying mechanism 12 so that part of frequencies near the ferromagnetic resonant frequency f1 of the magnetization free layer 4 of the magnetoresistive effect element 14a (a pass band 11100a' in FIG. 4) is overlapped with part of frequencies near the ferromagnetic resonant frequency f2 of the magnetization free layer 4 of the magnetoresistive effect element 14b (a pass band 11100b') in the output unit 21 widens the frequency band (a pass band 11100' in FIG. 4) of the high-frequency signals which the magnetoresistive effect elements 14a and 14b are capable of supplying to the output port 9b with high strengths, as illustrated in FIG. 3. Since the high-frequency magnetic field is applied from the magnetic-field generating signal line 18 to the magnetoresistive effect elements 14a and 14b in the output unit 21 selectively for the frequency owing to the magnetoresistive effect elements 1a and 1b in the MR unit 20, the high-frequency signal passes through the magnetoresistive effect device 100 selectively for the frequency at the two stages of the MR unit 20 and the output unit 21. Accordingly, as illustrated in FIG. 4, the difference between the output voltage of the pass band output from the output port 9b (the pass band 11100' in FIG. 4) and the output voltage of a cutoff frequency band is greater than the difference between the output voltage of the pass band (the pass band 11100 in FIG. 3) output from the magnetoresistive effect elements 1a and 1b in the MR unit 20 and the output voltage of the cutoff frequency band.

Since the amplitude of the oscillating resistance value of each of the magnetoresistive effect elements 1a, 1b, 14a, and 14b is decreased as the direct-current external magnetic field $H_E$ to be applied to each of the magnetoresistive effect elements 1a, 1b, 14a, and 14b (the effective magnetic field $H_{eff}$ in the magnetization free layer 4) is increased in magnitude, the current density of the DC current to be applied to each of the magnetoresistive effect elements 1a, 1b, 14a, and 14b is preferably increased as the direct-current external magnetic field $H_E$ to be applied to each of the magnetoresistive effect elements 1a, 1b, 14a, and 14b (the effective magnetic field $H_{eff}$ in the magnetization free layer 4) is increased in magnitude.

In order to broaden the range of the cutoff characteristics and the bandpass characteristics as the high-frequency filter, the magnetization free layer 4 preferably has the magnetic easy axis in the plane normal direction and the magnetization fixed layer 2 preferably has the magnetic easy axis in the plane direction.

Although the example is described in the first embodiment in which the magnetoresistive effect device 100 includes the DC current input terminals (the MR-unit-side DC current input terminal 11a and the output-unit-side DC current input terminal 11b), which are the DC application terminals, so that the DC current is capable of being applied to the magnetoresistive effect elements 1a and 1b in the MR unit 20 and the magnetoresistive effect elements 14a and 14b in the output unit 21, the DC voltage may be applied from each DC application terminal to the corresponding magnetoresistive effect elements. In this case, instead of the direct-current source, the DC voltage source is connected to the DC application terminal. In other words, it is sufficient for the DC application terminal to be capable of applying the DC current or the DC voltage to each magnetoresistive effect element. The DC voltage source may be the DC voltage source capable of generating constant DC voltage or may be the DC voltage source capable of varying the value of the DC voltage which the DC voltage source generates. The same applies to second to sixteenth embodiments described below.

As described above, the magnetoresistive effect device 100 includes the input port 9a into which a high-frequency signal is to be input, the input-side signal line 7 which is connected to the input port 9a and through which high-frequency current corresponding to the high-frequency signal input into the input port 9a flows, the MR unit 20 including the magnetoresistive effect elements 1a and 1b and the magnetic-field generating signal line 18, and the output unit 21 including the magnetoresistive effect elements 14a and 14b, the output-side signal line 17, and the output port 9b. The magnetoresistive effect device 100 further includes the DC application terminals (the MR-unit-side DC current input terminal 11a and the output-unit-side DC current input terminal 11b) so as to be capable of applying DC current or DC voltage to the magnetoresistive effect elements 1a and 1b in the MR unit 20 and the magnetoresistive effect elements 14a and 14b in the output unit 21. Each of the magnetoresistive effect elements 1a, 1b, 14a, and 14b includes the magnetization fixed layer 2 (the first ferromagnetic layer), the magnetization free layer 4 (the second ferromagnetic layer), and the spacer layer 3 arranged between the magnetization fixed layer 2 and the magnetization free layer 4. The magnetoresistive effect elements 14a and 14b in the output unit 21 are connected to the output port 9b via the output-side signal line 17. The input-side signal line 7 is arranged so that the high-frequency magnetic field generated from the input-side signal line 7 is applied to the magnetization free layers 4 of the magnetoresistive effect elements 1a and 1b in the MR unit 20. In the MR unit 20, the magnetoresistive effect elements 1a and 1b are connected to the magnetic-field generating signal line 18 so that the high-frequency current output from the magnetoresistive effect elements 1a and 1b flows through the magnetic-field generating signal line 18. The magnetic-field generating signal line 18 is arranged so that the high-frequency magnetic field generated from the magnetic-field generating signal line 18 is applied to the magnetization free layers 4 of the magnetoresistive effect elements 14a and 14b in the output unit 21.

With the above configuration, according to the magnetoresistive effect device 100, upon input of the high-frequency signal into the input port 9a, the high-frequency current flows through the input-side signal line 7. Accordingly, the high-frequency magnetic field, which corresponds to the input high-frequency signal and which is generated from the input-side signal line 7, is applied to the magnetization free layer 4 of each of the magnetoresistive effect elements 1a and 1b in the MR unit 20 and the magnetization of the magnetization free layer 4 of each of the magnetoresistive effect elements 1a and 1b in the MR unit 20 oscillates in response to the high-frequency magnetic field generated from the input-side signal line 7. Due to the magnetoresistive effect, the resistance value of each of the magnetoresistive effect elements 1a and 1b in the MR unit 20 oscillates in response to the oscillation of the magnetization of the magnetization free layer 4 of each magnetoresistive effect element. Upon application of the DC current from the MR-unit-side DC current input terminal 11a to each of the magnetoresistive effect elements 1a and 1b in the MR unit 20, a high-frequency signal corresponding to the input high-frequency signal is supplied from the magnetoresistive effect elements 1a and 1b in the MR unit 20 to the magnetic-field generating signal line 18 as voltage, which is a product of the oscillating resistance value of each of the magnetoresistive effect elements 1a and 1b in the MR unit 20 and the DC current flowing through each of the magnetoresistive effect elements 1a and 1b. (When the DC voltage is applied from the MR-unit-side DC application terminal to each of the magnetoresistive effect elements 1a and 1b, a high-frequency signal corresponding to the input high-frequency signal is supplied from the magnetoresistive effect elements 1a and 1b in the MR unit 20 to the magnetic-field generating signal line 18 as current the magnitude of which oscillates.) Similarly, also in the output unit 21, the magnetization of the magnetization free layer 4 of each of the magnetoresistive effect elements 14a and 14b in the output unit 21 oscillates in response to the high-frequency magnetic field generated from the magnetic-field generating signal line 18. Upon application of the DC current from the output-unit-side DC current input terminal 11b to the magnetoresistive effect elements 14a and 14b in the output unit 21, a high-frequency signal corresponding to the high-frequency signal supplied from the magnetoresistive effect elements 1a and 1b in the MR unit 20 to the magnetic-field generating signal line 18 is supplied from the magnetoresistive effect elements 14a and 14b in the output unit 21 to the output port 9b as voltage, which is a product of the oscillating resistance value of each of the magnetoresistive effect elements 14a and 14b in the output unit 21 and the DC current flowing through each of the magnetoresistive effect elements 14a and 14b. (When the DC voltage is applied from the output-unit-side DC application terminal to each of the magnetoresistive effect elements 14a and 14b in the output unit 21, a high-frequency signal corresponding to the input high-frequency signal is supplied from the magnetoresistive effect elements 14a and 14b in the output unit 21 to the output port 9b as current the magnitude of which oscillates.)

When the high-frequency magnetic field generated from the input-side signal line 7 is applied to the magnetization free layer 4 of each of the magnetoresistive effect elements 1a and 1b in the MR unit 20, the magnetization of the magnetization free layer 4 of each of the magnetoresistive effect elements 1a and 1b in the MR unit 20 greatly oscillates, due to the ferromagnetic resonance phenomenon, for the high-frequency magnetic fields having frequencies near the ferromagnetic resonant frequency of the magnetization free layer 4 of each of the magnetoresistive effect elements 1a and 1b in the MR unit 20, among the high-frequency magnetic fields generated from the input-side signal line 7. Similarly, also when the high-frequency magnetic field generated from the magnetic-field generating signal line 18 is applied to the magnetization free layer 4 of each of the magnetoresistive effect elements 14a and 14b in the output unit 21, the magnetization of the magnetization free layer 4 of each of the magnetoresistive effect elements 14a and 14b in the output unit 21 greatly oscillates, due to the ferromagnetic resonance phenomenon, for the high-frequency magnetic fields having frequencies near the ferromagnetic resonant frequency of the magnetization free layer 4 of each of the magnetoresistive effect elements 14a and 14b in the output unit 21, among the high-frequency magnetic fields generated from the magnetic-field generating signal line 18. Due to the ferromagnetic resonance phenomenon, in the MR unit 20, the high-frequency signals having frequencies near the ferromagnetic resonant frequency of the magnetization free layer 4 of each magnetoresistive effect element are supplied from the magnetoresistive effect elements 1a and 1b to the magnetic-field generating signal line 18 with strengths greater than those of the high-frequency signals of other frequencies. Similarly, also in the output unit 21, the high-frequency signals having frequencies near the ferromagnetic resonant frequency of the magnetization free layer 4 of each magnetoresistive effect element are supplied from the magnetoresistive effect elements 14a and 14b to the output port 9b with strengths greater than those of the high-frequency signals of other frequencies.

With the above configuration, the high-frequency signal passes through the magnetoresistive effect device 100 selectively for the frequency at the two stages of the MR unit 20 and the output unit 21. Accordingly, the frequency selectivity of the high-frequency signal is further improved in a portion where the frequencies are overlapped with each other near the ferromagnetic resonant frequency of the magnetization free layer 4 of each of the magnetoresistive effect elements 1a and 1b in the MR unit 20 and near the ferromagnetic resonant frequency of the magnetization free layer 4 of each of the magnetoresistive effect elements 14a and 14b in the output unit 21, and the magnetoresistive effect device 100 functions as a high-frequency filter having excellent characteristics.

In addition, the magnetoresistive effect device 100 may function as an isolator. Furthermore, since varying the DC current or the DC voltage applied from the MR-unit-side DC application terminal and the output-unit-side DC application terminal enables the ferromagnetic resonant frequency of the magnetization free layer 4 of each magnetoresistive effect element to be variably controlled, the magnetoresistive effect device 100 may also function as a variable frequency filter or an isolator. Furthermore, the magnetoresistive effect device 100 may function as a phase shifter capable of varying the phase of a signal and an amplifier capable of amplifying a signal.

Furthermore, the magnetoresistive effect device 100 includes the MR-unit-side DC current input terminal 11a(the MR-unit-side DC application terminal) and the output-unit-side DC current input terminal 11b(the output-unit-side DC application terminal) as the DC application terminals. The MR-unit-side DC current input terminal 11a(the MR-unit-side DC application terminal) is connected to the magnetoresistive effect elements 1a and 1b in the MR unit 20, and the output-unit-side DC current input terminal 11b(the output-unit-side DC application terminal) is connected to the magnetoresistive effect elements 14a and 14b in the output unit 21. Accordingly, optimal DC current or DC voltage is capable of being individually applied to the magnetoresistive effect elements 1a and 1b in the MR unit 20 and the magnetoresistive effect elements 14a and 14b in the output unit 21.

Various components may be added to the magnetoresistive effect device 100 of the first embodiment described above. For example, in order to prevent the direct-current signal from flowing into a high-frequency circuit connected to the output port 9b, a capacitor for cutting off the direct-current signal may be connected in series to the output-side signal line 17 between a connection portion of the inductor 10 to the output-side signal line 17 and the output port 9b.

Second Embodiment

Figure 5:
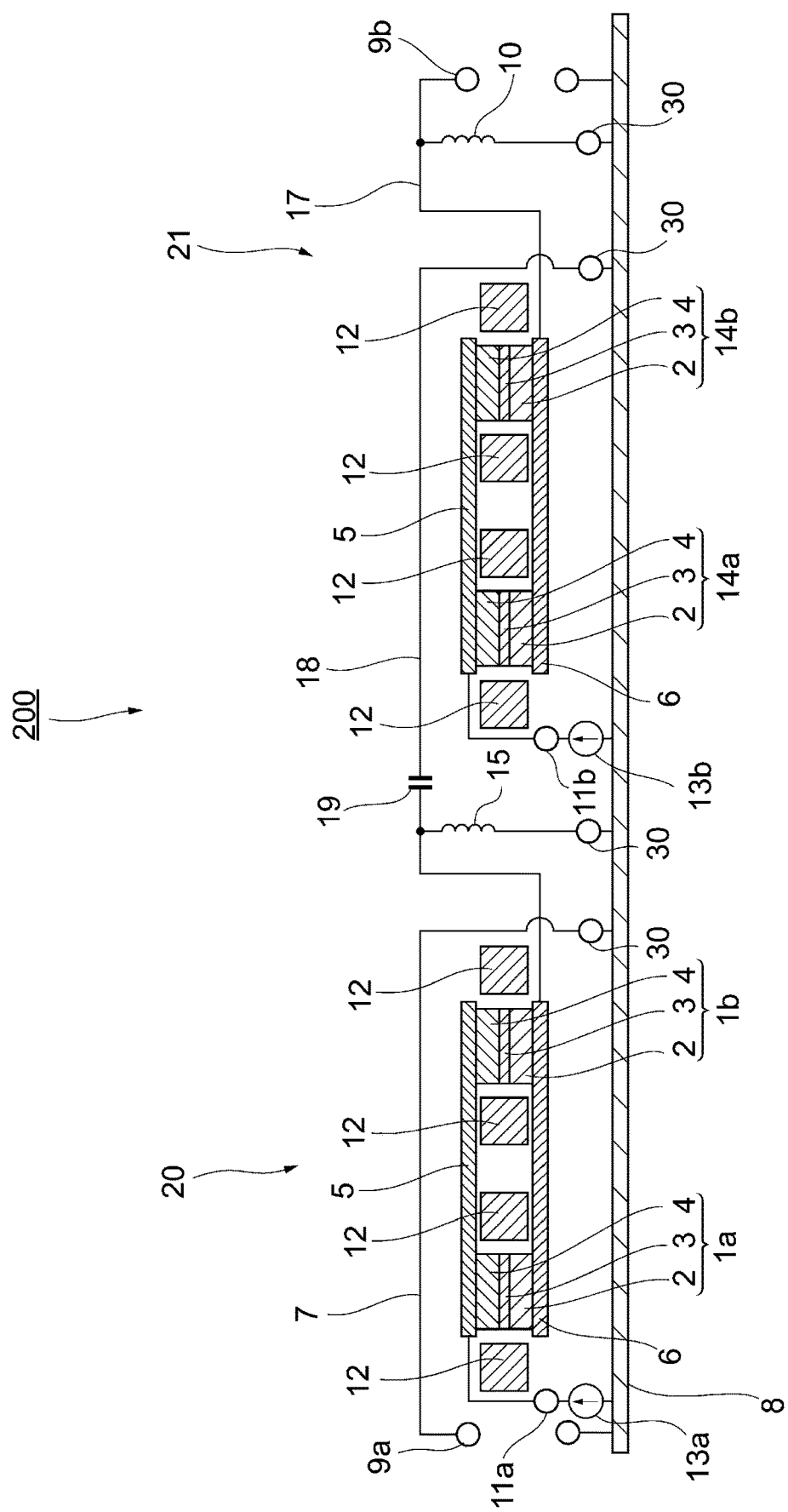
FIG. 5 is a schematic cross-sectional view illustrating the configuration of a magnetoresistive effect device according to a second embodiment.

FIG. 5 is a schematic cross-sectional view of a magnetoresistive effect device 200 according to a second embodiment of the present invention. Points different from the magnetoresistive effect device 100 of the first embodiment in the magnetoresistive effect device 200 will be mainly described and a description of common points will be appropriately omitted herein. The same reference numerals are used in the second embodiment to identify the components common to the magnetoresistive effect device 100 of the first embodiment and a description of the common components will be omitted herein. The magnetoresistive effect device 200 further includes a capacitor 19 and an inductor 15, in addition to the components in the magnetoresistive effect device 100 of the first embodiment. In the MR unit 20, the capacitor 19 is connected in series to the magnetic-field generating signal line 18 and the inductor 15 is connected between the capacitor 19 and the magnetoresistive effect elements 1a and 1b, which are connected in parallel to each other, so as to be parallel to the magnetic-field generating signal line 18.

In the example illustrated in FIG. 5, one end of the inductor 15 is connected to the magnetic-field generating signal line 18 between the capacitor 19 and the magnetoresistive effect elements 1a and 1b, which are connected in parallel to each other, and the other end of the inductor 15 is capable of being connected to the ground 8 via the reference voltage terminal 30. The inductor that is the same as the inductor 10 described in the first embodiment may be used as the inductor 15. In the magnetoresistive effect device 200, the DC current is applied from the MR-unit-side DC current input terminal 11a to a closed circuit including the MR-unit-side DC current input terminal 11a, the magnetoresistive effect elements 1a and 1b in the MR unit 20, the inductor 15, and the ground 8. In addition, the high-frequency current output from the magnetoresistive effect elements 1a and 1b flows through the magnetic-field generating signal line 18 via the capacitor 19. The remaining configurations of the magnetoresistive effect device 200 are the same as those of the magnetoresistive effect device 100 of the first embodiment.

Since the capacitor 19 is connected in series to the magnetic-field generating signal line 18 in the magnetoresistive effect device 200, the capacitor 19 prevents the DC current from flowing into the magnetic-field generating signal line 18. In addition, the inductor 15 serves as a path of the DC current supplied from the MR-unit-side DC current input terminal 11a and suppresses flowing of the high-frequency signal into the inductor 15 side. Accordingly, it is possible to cause the high-frequency signal output from the magnetoresistive effect elements 1a and 1b in the MR unit 20 to efficiently flow through the magnetic-field generating signal line 18 and it is possible to efficiently generate the high-frequency magnetic field from the magnetic-field generating signal line 18.

Third Embodiment

Figure 6:
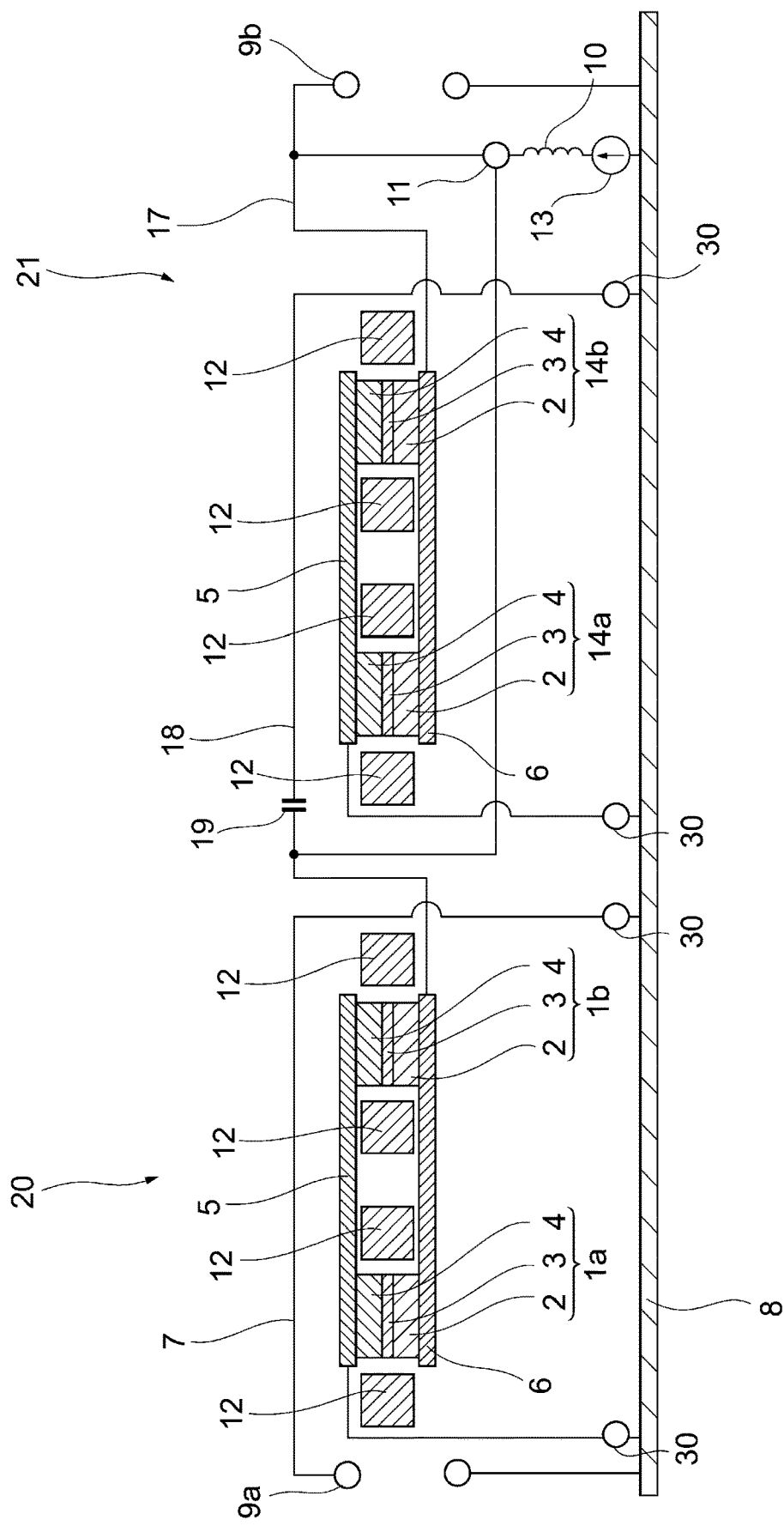
FIG. 6 is a schematic cross-sectional view illustrating the configuration of a magnetoresistive effect device according to a third embodiment.

FIG. 6 is a schematic cross-sectional view of a magnetoresistive effect device 300 according to a third embodiment of the present invention. Points different from the magnetoresistive effect device 100 of the first embodiment in the magnetoresistive effect device 300 will be mainly described and a description of common points will be appropriately omitted herein. The same reference numerals are used in the third embodiment to identify the components common to the magnetoresistive effect device 100 of the first embodiment and a description of the common components will be omitted herein. The magnetoresistive effect device 300 further includes the capacitor 19, in addition to the components in the magnetoresistive effect device 100 of the first embodiment. The capacitor 19 is connected in series to the magnetic-field generating signal line 18. The magnetoresistive effect device 300 includes a DC current input terminal 11, instead of the MR-unit-side DC current input terminal 11a and the output-unit-side DC current input terminal 11b in the magnetoresistive effect device 100 of the first embodiment. The DC current input terminal 11 is an example of the DC application terminal. The DC current input terminal 11 is connected both between the capacitor 19 and the magnetoresistive effect elements 1a and 1b, which are connected in parallel to each other, in the MR unit 20 and between the output port 9b and the magnetoresistive effect elements 14a and 14b, which are connected in parallel to each other, in the output unit 21. The DC current input terminal 11 is capable of applying the DC current to the magnetoresistive effect elements 1a and 1b in the MR unit 20 and the magnetoresistive effect elements 14a and 14b in the output unit 21.

In the example illustrated in FIG. 6, the DC current input terminal 11 is connected to both the magnetic-field generating signal line 18 between the capacitor 19 and the magnetoresistive effect elements 1a and 1b, which are connected in parallel to each other, and the output-side signal line 17. In addition, as illustrated in FIG. 6, in the MR unit 20, one end (the magnetization fixed layer 2 side) of the magnetoresistive effect elements 1a and 1b is connected to the magnetic-field generating signal line 18 via the lower electrode 6 and the other end (the magnetization free layer 4 side) of the magnetoresistive effect elements 1a and 1b is capable of being connected to the ground 8 via the upper electrode 5 and the reference voltage terminal 30. In the output unit 21, one end (the magnetization fixed layer 2 side) of the magnetoresistive effect elements 14a and 14b is connected to the output-side signal line 17 via the lower electrode 6 and the other end (the magnetization free layer 4 side) of the magnetoresistive effect elements 14a and 14b is capable of being connected to the ground 8 via the upper electrode 5 and the reference voltage terminal 30. One end of the inductor 10 is connected to the DC current input terminal 11, the other end of the inductor 10 is connected to one end of a direct-current source 13, and the direct-current source 13 is connected to the DC current input terminal 11 via the inductor 10. The other end of the direct-current source 13 is connected to the ground 8. In the magnetoresistive effect device 300, the DC current is applied from the DC current input terminal 11 to a closed circuit including the inductor 10, the DC current input terminal 11, the magnetic-field generating signal line 18, the magnetoresistive effect elements 1a and 1b, and the ground 8 and the DC current is applied from the DC current input terminal 11 to a closed circuit including the inductor 10, the DC current input terminal 11, the output-side signal line 17, the magnetoresistive effect elements 14a and 14b, and the ground 8. The high-frequency current output from the magnetoresistive effect elements 1a and 1b flows through the magnetic-field generating signal line 18 via the capacitor 19. The remaining configurations of the magnetoresistive effect device 300 are the same as those of the magnetoresistive effect device 100 of the first embodiment.

In the magnetoresistive effect device 300, the capacitor 19 is connected in series to the magnetic-field generating signal line 18 and the DC current input terminal (the DC application terminal) is connected both between the capacitor 19 and the magnetoresistive effect elements 1a and 1b in the MR unit 20 and between the output port 9b and the magnetoresistive effect elements 14a and 14b in the output unit 21. Accordingly, the capacitor 19 prevents the DC current supplied from the DC current input terminal 11 (the DC application terminal) from flowing into the magnetic-field generating signal line 18. Consequently, it is possible to apply the DC current or the DC voltage supplied from the DC current input terminal 11 (the DC application terminal) not only to the magnetoresistive effect elements 14a and 14b in the output unit 21 but also to the magnetoresistive effect elements 1a and 1b in the MR unit 20. In addition, since the MR unit 20 and the output unit 21 are capable of sharing the DC current input terminal (the DC application terminal), it is possible to decrease the number of direct-current power supplies connected to the DC current input terminal 11 (the DC application terminal).

Fourth Embodiment

Figure 7:
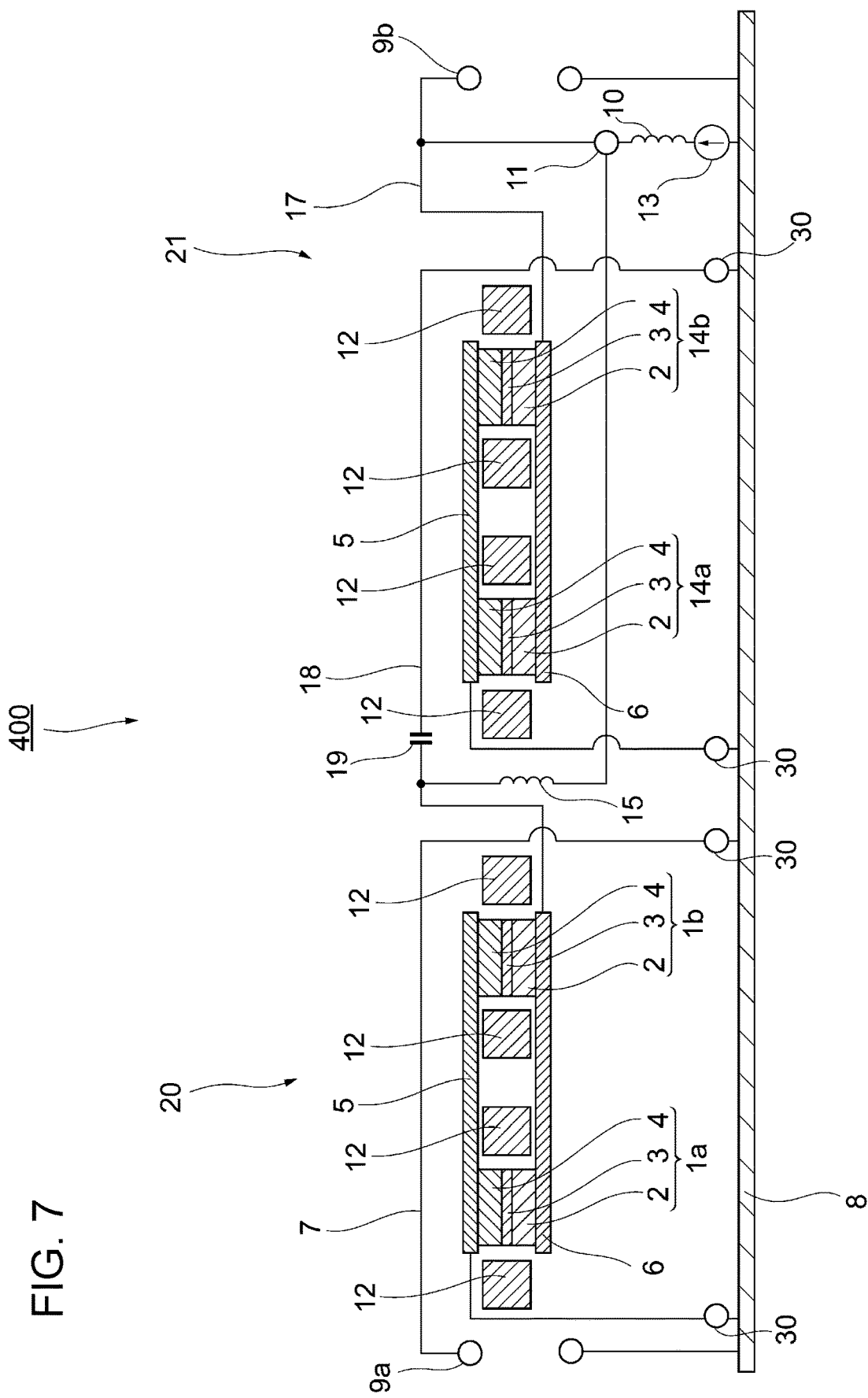
FIG. 7 is a schematic cross-sectional view illustrating the configuration of a magnetoresistive effect device according to a fourth embodiment.

FIG. 7 is a schematic cross-sectional view of a magnetoresistive effect device 400 according to a fourth embodiment of the present invention. Points different from the magnetoresistive effect device 300 of the third embodiment in the magnetoresistive effect device 400 will be mainly described and a description of common points will be appropriately omitted herein. The same reference numerals are used in the fourth embodiment to identify the components common to the magnetoresistive effect device 300 of the third embodiment and a description of the common components will be omitted herein. The magnetoresistive effect device 400 further includes the inductor 15, in addition to the components in the magnetoresistive effect device 300 of the third embodiment. In the MR unit 20, one end of the inductor 15 is connected between the capacitor 19 and the magnetoresistive effect elements 1a and 1b, which are connected in parallel to each other, and the other end of the inductor 15 is connected to the DC current input terminal 11. In the example illustrated in FIG. 7, one end of the inductor 15 is connected to the magnetic-field generating signal line 18 between the capacitor 19 and the magnetoresistive effect elements 1a and 1b, which are connected in parallel to each other. The inductor that is the same as the inductor 10 described in the first embodiment may be used as the inductor 15. In the magnetoresistive effect device 400, the DC current is applied from the DC current input terminal 11 to a closed circuit including the inductor 10, the DC current input terminal 11, the inductor 15, the magnetic-field generating signal line 18, the magnetoresistive effect elements 1a and 1b, and the ground 8 and the DC current is applied from the DC current input terminal 11 to a closed circuit including the inductor 10, the DC current input terminal 11, the output-side signal line 17, the magnetoresistive effect elements 14a and 14b, and the ground 8. The remaining configurations of the magnetoresistive effect device 400 are the same as those of the magnetoresistive effect device 300 of the third embodiment.

In the MR unit 20 in the magnetoresistive effect device 400, one end of the inductor 15 is connected between the capacitor 19 and the magnetoresistive effect elements 1a and 1b and the other end of the inductor 15 is connected to the DC current input terminal 11 (the DC application terminal). Accordingly, the inductor 15 suppresses flowing out of the high-frequency signal output from the magnetoresistive effect elements 1a and 1b in the MR unit 20 to the DC current input terminal 11 (the DC application terminal) side to enable the high-frequency signal to efficiently flow through the magnetic-field generating signal line 18, thus efficiently generating the high-frequency magnetic field from the magnetic-field generating signal line 18.

Fifth Embodiment

Figure 8:
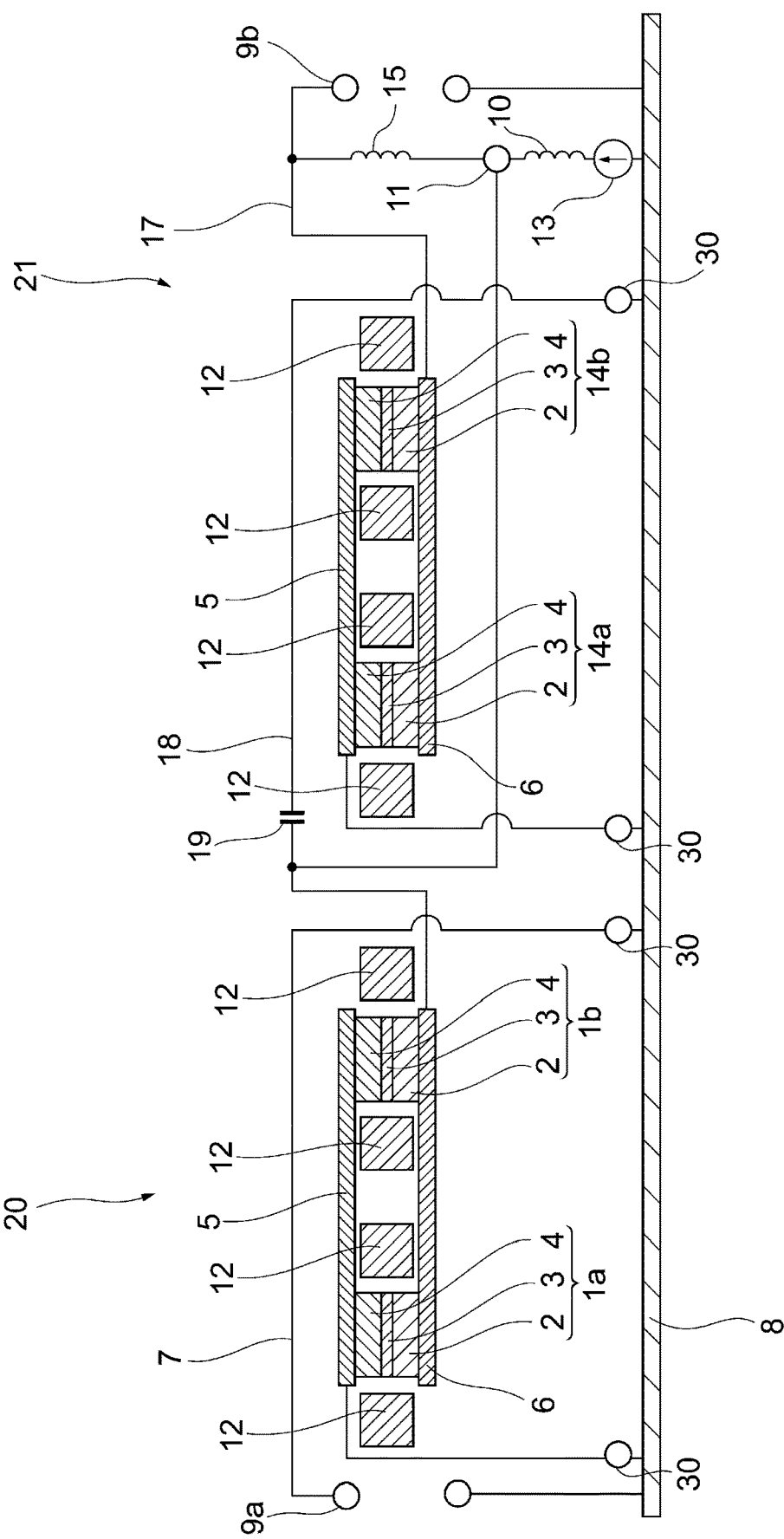
FIG. 8 is a schematic cross-sectional view illustrating the configuration of a magnetoresistive effect device according to a fifth embodiment.

FIG. 8 is a schematic cross-sectional view of a magnetoresistive effect device 500 according to a fifth embodiment of the present invention. Points different from the magnetoresistive effect device 300 of the third embodiment in the magnetoresistive effect device 500 will be mainly described and a description of common points will be appropriately omitted herein. The same reference numerals are used in the fifth embodiment to identify the components common to the magnetoresistive effect device 300 of the third embodiment and a description of the common components will be omitted herein. The magnetoresistive effect device 500 further includes the inductor 15, in addition to the components in the magnetoresistive effect device 300 of the third embodiment. In the output unit 21, one end of the inductor 15 is connected between the magnetoresistive effect elements 14a and 14b, which are connected in parallel to each other, and the output port 9b and the other end of the inductor 15 is connected to the DC current input terminal 11. In the example illustrated in FIG. 8, one end of the inductor 15 is connected to the output-side signal line 17 so as to be parallel to the output port 9b. The inductor that is the same as the inductor 10 described in the first embodiment may be used as the inductor 15. In the magnetoresistive effect device 500, the DC current is applied from the DC current input terminal 11 to a closed circuit including the inductor 10, the DC current input terminal 11, the magnetic-field generating signal line 18, magnetoresistive effect elements 1a and 1b, and the ground 8 and the DC current is applied from the DC current input terminal 11 to a closed circuit including the inductor 10, the DC current input terminal 11, the inductor 15, the output-side signal line 17, the magnetoresistive effect elements 14a and 14b, and the ground 8. The remaining configurations of the magnetoresistive effect device 500 are the same as those of the magnetoresistive effect device 300 of the third embodiment.

In the output unit 21 in the magnetoresistive effect device 500, one end of the inductor 15 is connected between the magnetoresistive effect elements 14a and 14b and the output port 9b and the other end of the inductor 15 is connected to the DC current input terminal 11 (the DC application terminal). Accordingly, the inductor 15 suppresses flowing out of the high-frequency signal output from the magnetoresistive effect elements 1a and 1b in the MR unit 20 to the magnetoresistive effect elements 14a and 14b side and the output port 9b side (the output-side signal line 17) in the output unit 21 to enable the high-frequency signal to efficiently flow through the magnetic-field generating signal line 18, thus efficiently generating the high-frequency magnetic field from the magnetic-field generating signal line 18.

Sixth Embodiment

Figure 9:
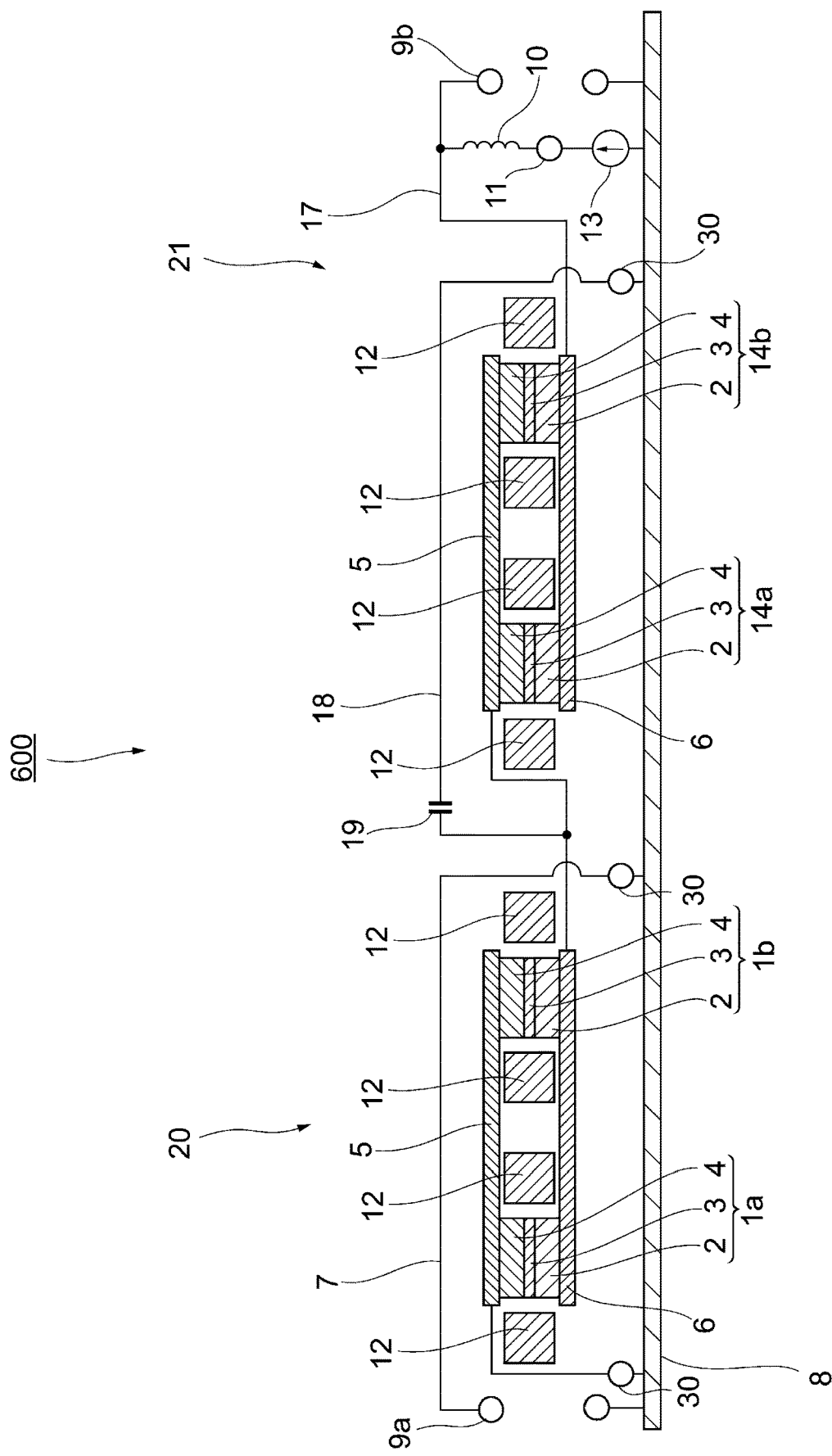
FIG. 9 is a schematic cross-sectional view illustrating the configuration of a magnetoresistive effect device according to a sixth embodiment.

FIG. 9 is a schematic cross-sectional view of a magnetoresistive effect device 600 according to a sixth embodiment of the present invention. Points different from the magnetoresistive effect device 100 of the first embodiment in the magnetoresistive effect device 600 will be mainly described and a description of common points will be appropriately omitted herein. The same reference numerals are used in the sixth embodiment to identify the components common to the magnetoresistive effect device 100 of the first embodiment and a description of the common components will be omitted herein. The magnetoresistive effect device 600 further includes the capacitor 19, in addition to the components in the magnetoresistive effect device 100 of the first embodiment. The capacitor 19 is connected in series to the magnetic-field generating signal line 18. The magnetoresistive effect device 600 includes the DC current input terminal 11, instead of the MR-unit-side DC current input terminal 11a and the output-unit-side DC current input terminal 11b in the magnetoresistive effect device 100 of the first embodiment. The magnetoresistive effect device 600 is capable of applying the DC current to the magnetoresistive effect elements 1a and 1b in the MR unit 20 and the magnetoresistive effect elements 14a and 14b in the output unit 21. One end of the magnetoresistive effect elements 14a and 14b, which are connected in parallel to each other, in the output unit 21 is connected between the capacitor 19 and the magnetoresistive effect elements 1a and 1b, which are connected in parallel to each other, in the MR unit 20. The other end of the magnetoresistive effect elements 14a and 14b, which are connected in parallel to each other, in the output unit 21 is connected to the output port 9b. The magnetoresistive effect elements 1a and 1b, which are connected in parallel to each other, in the MR unit 20, the magnetoresistive effect elements 14a and 14b, which are connected in parallel to each other, in the output unit 21, and the DC current input terminal 11 are connected in series to each other.

In the example illustrated in FIG. 9, one end (the magnetization free layer 4 side) of the magnetoresistive effect elements 14a and 14b, which are connected in parallel to each other, is connected to the magnetic-field generating signal line 18 between the capacitor 19 and the magnetoresistive effect elements 1a and 1b, which are connected in parallel to each other, via the upper electrode 5. The other end (the magnetization fixed layer 2 side) of the magnetoresistive effect elements 14a and 14b, which are connected in parallel to each other, is connected to the output port 9b via the lower electrode 6 and the output-side signal line 17. As illustrated in FIG. 9, in the MR unit 20, one end (the magnetization fixed layer 2 side) of the magnetoresistive effect elements 1a and 1b is connected to the magnetic-field generating signal line 18 via the lower electrode 6 and the other end (the magnetization free layer 4 side) of the magnetoresistive effect elements 1a and 1b is capable of being connected to the ground 8 via the upper electrode 5 and the reference voltage terminal 30. One end of the inductor 10 is connected to the output-side signal line 17 and the other end of the inductor 10 is connected to the DC current input terminal 11. The direct-current source 13 is connected to the DC current input terminal 11 and the ground 8. In the magnetoresistive effect device 600, the DC current is applied from the DC current input terminal 11 to a closed circuit including the DC current input terminal 11, the inductor 10, the output-side signal line 17, the magnetoresistive effect elements 14a and 14b, the magnetic-field generating signal line 18, the magnetoresistive effect elements 1a and 1b, and the ground 8. The high-frequency current output from the magnetoresistive effect elements 1a and 1b flows through the magnetic-field generating signal line 18 via the capacitor 19. The remaining configurations of the magnetoresistive effect device 600 are the same as those of the magnetoresistive effect device 100 of the first embodiment.

In the magnetoresistive effect device 600, the capacitor 19 is connected in series to the magnetic-field generating signal line 18, one end of the magnetoresistive effect elements 14a and 14b in the output unit 21 is connected between the capacitor 19 and the magnetoresistive effect elements 1a and 1b in the MR unit 20, the other end of the magnetoresistive effect elements 14a and 14b in the output unit 21 is connected to the output port 9b, and the magnetoresistive effect elements 1a and 1b in the MR unit 20, the magnetoresistive effect elements 14a and 14b in the output unit 21, and the DC current input terminal 11 (the DC application terminal) are connected in series to each other. Accordingly, the capacitor 19 prevents the DC current supplied from the DC current input terminal 11 (the DC application terminal) from flowing into the magnetic-field generating signal line 18. Consequently, it is possible to apply the DC current or the DC voltage supplied from the DC current input terminal 11 (the DC application terminal) not only to the magnetoresistive effect elements 14a and 14b in the output unit 21 but also to the magnetoresistive effect elements 1a and 1b in the MR unit 20. In addition, since the MR unit 20 and the output unit 21 are capable of sharing the DC current input terminal 11 (the DC application terminal), it is possible to decrease the number of the direct-current power supplies connected to the DC current input terminal 11 (the DC application terminal).

Seventh Embodiment

Figure 10:
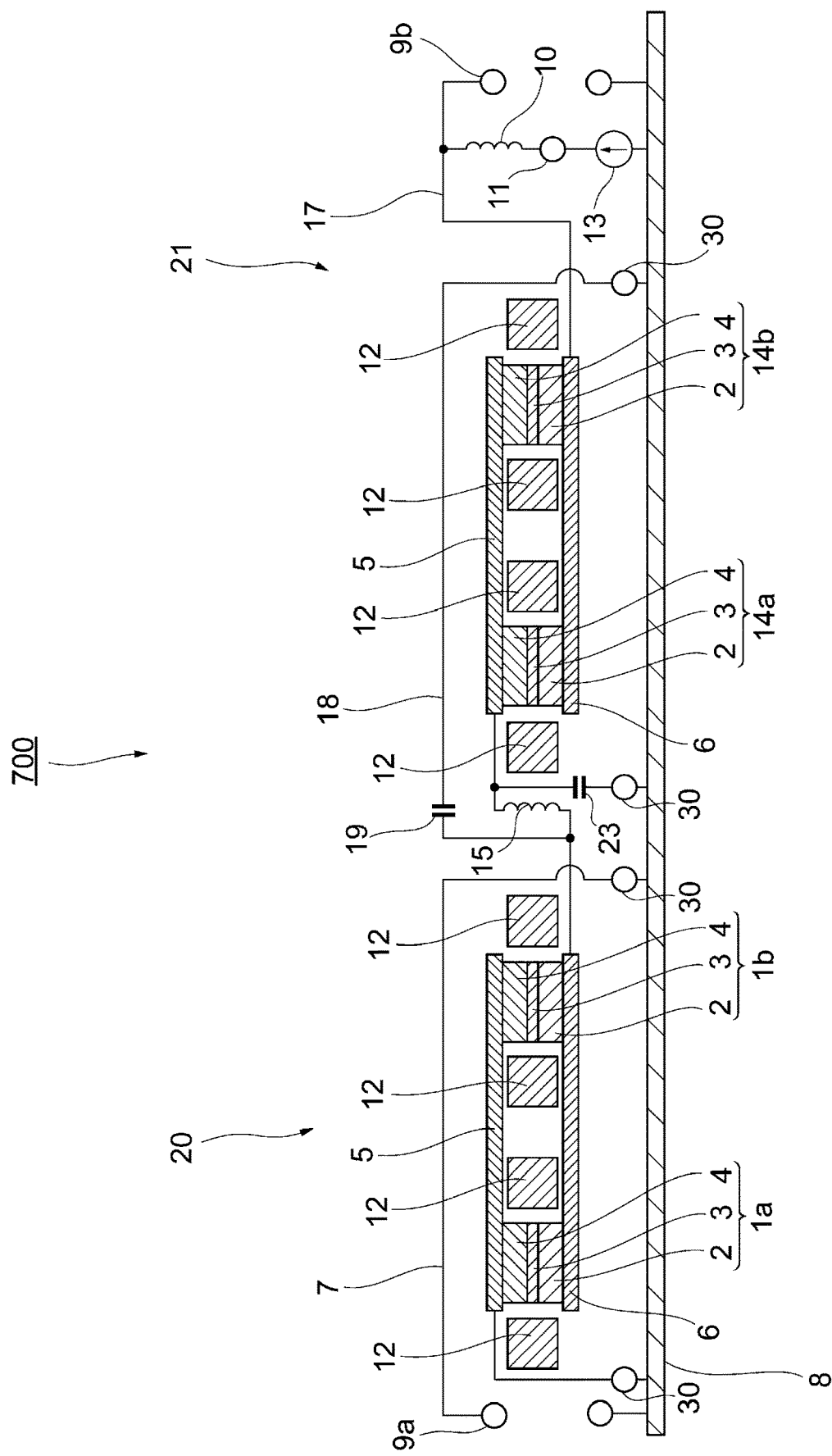
FIG. 10 is a schematic cross-sectional view illustrating the configuration of a magnetoresistive effect device according to a seventh embodiment.

FIG. 10 is a schematic cross-sectional view of a magnetoresistive effect device 700 according to a seventh embodiment of the present invention. Points different from the magnetoresistive effect device 600 of the sixth embodiment in the magnetoresistive effect device 700 will be mainly described and a description of common points will be appropriately omitted herein. The same reference numerals are used in the seventh embodiment to identify the components common to the magnetoresistive effect device 600 of the sixth embodiment and a description of the common components will be omitted herein. The magnetoresistive effect device 700 further includes a shunt capacitor 23 and the inductor 15, in addition to the components in the magnetoresistive effect device 600 of the sixth embodiment. One end of the magnetoresistive effect elements 14a and 14b, which are connected in parallel to each other, in the output unit 21 is connected to the shunt capacitor 23, the other end of the magnetoresistive effect elements 14a and 14b, which are connected in parallel to each other, in the output unit 21 is connected to the output port 9b, one end of the inductor 15 is connected between the magnetoresistive effect elements 1a and 1b, which are connected in parallel to each other, in the MR unit 20 and the capacitor 19, and the other end of the inductor 15 is connected between the magnetoresistive effect elements 14a and 14b, which are connected in parallel to each other, in the output unit 21 and the shunt capacitor 23.

In the example illustrated in FIG. 10, one end (the magnetization free layer 4 side) of the magnetoresistive effect elements 14a and 14b, which are connected in parallel to each other, is connected to one end of the shunt capacitor 23 via the upper electrode 5, the other end of the shunt capacitor 23 is capable of being connected to the ground 8 via the reference voltage terminal 30, the other end (the magnetization fixed layer 2 side) of the magnetoresistive effect elements 14a and 14b, which are connected in parallel to each other, is connected to the output port 9b via the lower electrode 6 and the output-side signal line 17, and one end of the inductor 15 is connected to the magnetic-field generating signal line 18 between the magnetoresistive effect elements 1a and 1b, which are connected in parallel to each other, and the capacitor 19. The inductor that is the same as the inductor 10 described in the first embodiment may be used as the inductor 15. In the magnetoresistive effect device 700, the DC current is applied from the DC current input terminal 11 to a closed circuit including the DC current input terminal 11, the inductor 10, the output-side signal line 17, the magnetoresistive effect elements 14a and 14b, the inductor 15, the magnetic-field generating signal line 18, the magnetoresistive effect elements 1a and 1b, and the ground 8. The remaining configurations of the magnetoresistive effect device 700 are the same as those of the magnetoresistive effect device 600 of the sixth embodiment.

In the magnetoresistive effect device 700, one end of the magnetoresistive effect elements 14a and 14b in the output unit 21 is connected to the shunt capacitor 23, the other end of the magnetoresistive effect elements 14a and 14b in the output unit 21 is connected to the output port 9b, one end of the inductor 15 is connected between the magnetoresistive effect elements 1a and 1b in the MR unit 20 and the capacitor 19, and the other end of the inductor 15 is connected between the magnetoresistive effect elements 14a and 14b in the output unit 21 and the shunt capacitor 23. Accordingly, the inductor 15 suppresses flowing out of the high-frequency signal output from the magnetoresistive effect elements 1a and 1b in the MR unit 20 to the DC current input terminal 11 (the DC application terminal) to enable the high-frequency signal to efficiently flow through the magnetic-field generating signal line 18. In addition, the shunt capacitor 23 enables a closed circuit of the high-frequency signal to be formed in the output unit 21 while the DC current or the DC voltage supplied from the DC current input terminal 11 (the DC application terminal) is being applied to the magnetoresistive effect elements 1a and 1b in the MR unit 20.

Eighth Embodiment

Figure 11:
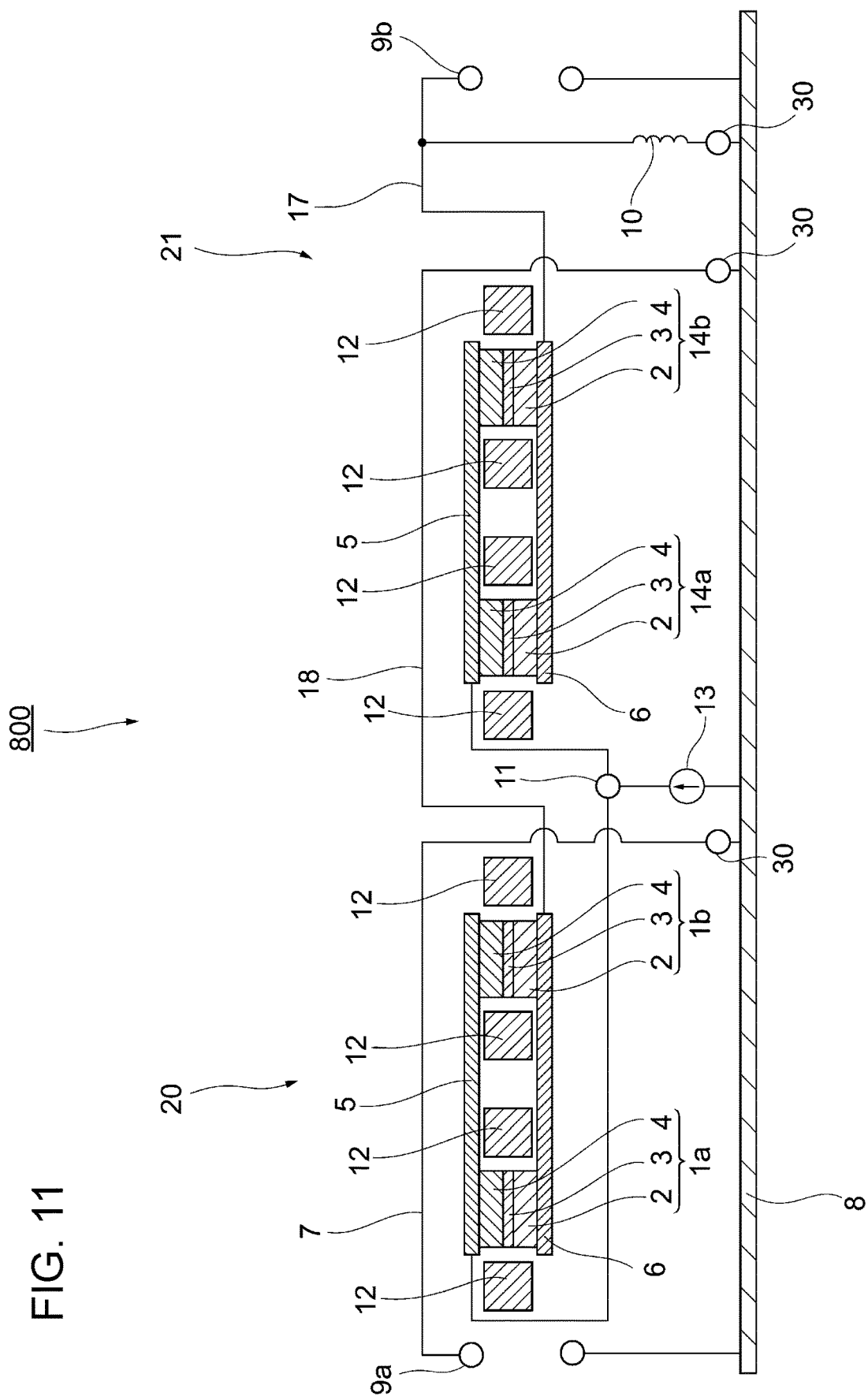
FIG. 11 is a schematic cross-sectional view illustrating the configuration of a magnetoresistive effect device according to an eighth embodiment.

FIG. 11 is a schematic cross-sectional view of a magnetoresistive effect device 800 according to an eighth embodiment of the present invention. Points different from the magnetoresistive effect device 100 of the first embodiment in the magnetoresistive effect device 800 will be mainly described and a description of common points will be appropriately omitted herein. The same reference numerals are used in the eighth embodiment to identify the components common to the magnetoresistive effect device 100 of the first embodiment and a description of the common components will be omitted herein. The magnetoresistive effect device 800 includes the DC current input terminal 11, instead of the MR-unit-side DC current input terminal 11a and the output-unit-side DC current input terminal 11b in the magnetoresistive effect device 100 of the first embodiment. The magnetoresistive effect device 800 is capable of applying the DC current to the magnetoresistive effect elements 1a and 1b in the MR unit 20 and the magnetoresistive effect elements 14a and 14b in the output unit 21. In the magnetoresistive effect device 800, one end of the magnetoresistive effect elements 1a and 1b, which are connected in parallel to each other, in the MR unit 20 is connected to the magnetic-field generating signal line 18, one end of the magnetoresistive effect elements 14a and 14b, which are connected in parallel to each other, in the output unit 21 is connected to the output port 9b, and the DC current input terminal 11 is connected to both the other end of the magnetoresistive effect elements 1a and 1b, which are connected in parallel to each other, in the MR unit 20 and the other end of the magnetoresistive effect elements 14a and 14b in the output unit 21.

In the example illustrated in FIG. 11, one end (the magnetization fixed layer 2 side) of the magnetoresistive effect elements 1a and 1b, which are connected in parallel to each other, is connected to the magnetic-field generating signal line 18 via the lower electrode 6 and the other end (the magnetization free layer 4 side) of the magnetoresistive effect elements 1a and 1b, which are connected in parallel to each other, is connected to the DC current input terminal 11 via the upper electrode 5. In addition, one end (the magnetization fixed layer 2 side) of the magnetoresistive effect elements 14a and 14b, which are connected in parallel to each other, is connected to the output port 9b via the lower electrode 6 and the output-side signal line 17 and the other end (the magnetization free layer 4 side) of the magnetoresistive effect elements 14a and 14b, which are connected in parallel to each other, is connected to the DC current input terminal 11 via the upper electrode 5. In the magnetoresistive effect device 800, the DC current is applied from the DC current input terminal 11 to a closed circuit including the DC current input terminal 11, the magnetoresistive effect elements 1a and 1b, the magnetic-field generating signal line 18, and the ground 8 and the DC current is applied from the DC current input terminal 11 to a closed circuit including the DC current input terminal 11, the magnetoresistive effect elements 14a and 14b, the inductor 10, and the ground 8. The remaining configurations of the magnetoresistive effect device 800 are the same as those of the magnetoresistive effect device 100 of the first embodiment.

In the magnetoresistive effect device 800, one end of the magnetoresistive effect elements 1a and 1b in the MR unit 20 is connected to the magnetic-field generating signal line 18, one end of the magnetoresistive effect elements 14a and 14b in the output unit 21 is connected to the output port 9b, and the DC current input terminal 11 (the DC application terminal) is connected to both the other end of the magnetoresistive effect elements 1a and 1b in the MR unit 20 and the other end of the magnetoresistive effect elements 14a and 14b in the output unit 21. Accordingly, since the MR unit 20 and the output unit 21 are capable of sharing the DC current input terminal 11 (the DC application terminal), it is possible to decrease the number of the direct-current power supplies connected to the DC current input terminal 11 (the DC application terminal).

Ninth Embodiment

Figure 12:
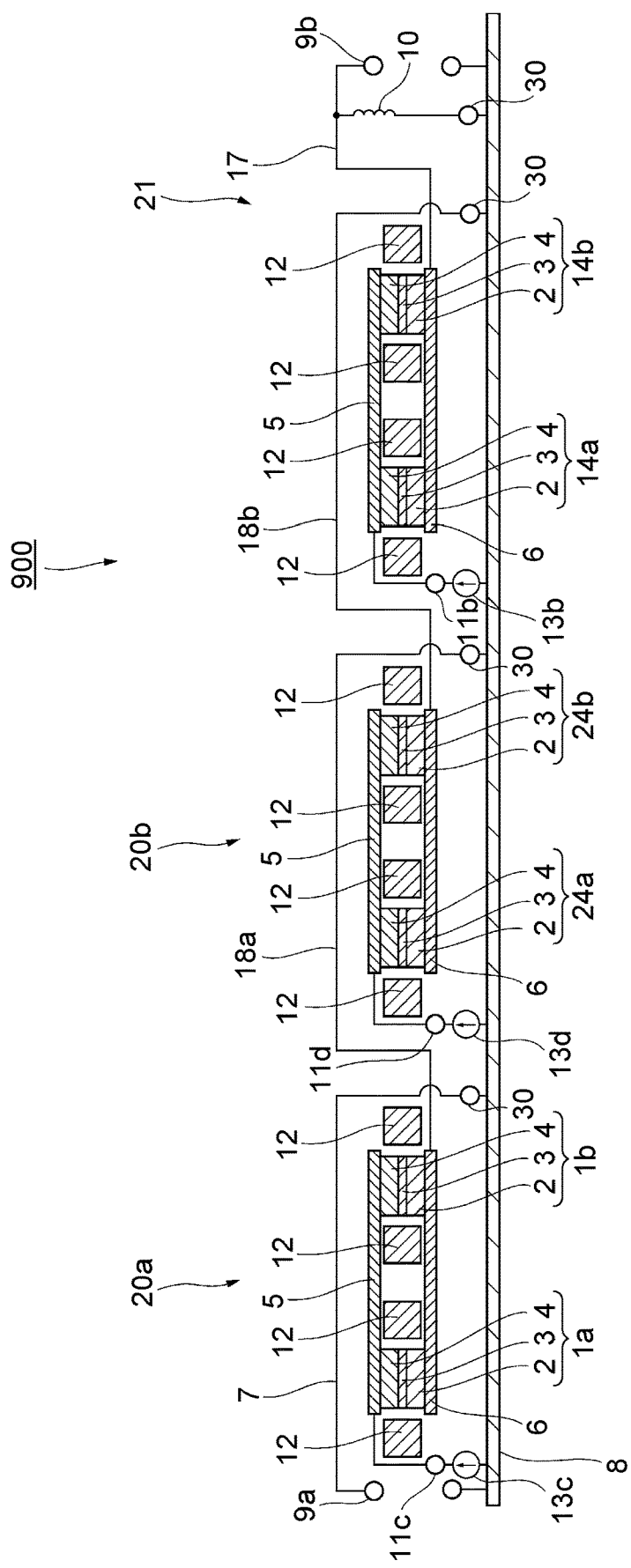
FIG. 12 is a schematic cross-sectional view illustrating the configuration of a magnetoresistive effect device according to a ninth embodiment.

FIG. 12 is a schematic cross-sectional view of a magnetoresistive effect device 900 according to a ninth embodiment of the present invention. Points different from the magnetoresistive effect device 100 of the first embodiment in the magnetoresistive effect device 900 will be mainly described and a description of common points will be appropriately omitted herein. The same reference numerals are used in the ninth embodiment to identify the components common to the magnetoresistive effect device 100 of the first embodiment and a description of the common components will be omitted herein. The magnetoresistive effect device 900 includes a first MR unit 20a and a second MR unit 20b as two MR units corresponding to MR units of an N-number (N is a natural number not smaller than two) in the present invention (an example of "N=2"), instead of the MR unit 20 in the magnetoresistive effect device 100 of the first embodiment. The first MR unit 20a includes the magnetoresistive effect elements 1a and 1b and a magnetic-field generating signal line 18a. The magnetoresistive effect element 1a and the magnetoresistive effect element 1b are connected in parallel to each other between the upper electrode 5 and the lower electrode 6. The second MR unit 20b includes magnetoresistive effect elements 24a and 24b and a magnetic-field generating signal line 18b. The magnetoresistive effect element 24a and the magnetoresistive effect element 24b are connected in parallel to each other between the upper electrode 5 and the lower electrode 6. In addition, the magnetoresistive effect device 900 includes an MR-unit-side DC current input terminal 11c and an MR-unit-side DC current input terminal 11d, which are the DC current input terminals, so as to apply the DC current to the magnetoresistive effect elements 1a and 1b in the first MR unit 20a and the magnetoresistive effect elements 24a and 24b in the second MR unit 20b, instead of the MR-unit-side DC current input terminal 11a in the magnetoresistive effect device 100 of the first embodiment. The MR-unit-side DC current input terminal 11c and the MR-unit-side DC current input terminal 11d are examples of the DC application terminals and, in particular, are examples of the MR-unit-side DC application terminals.

The configurations of the magnetoresistive effect elements 1a, 1b, 14a, 14b, 24a, and 24b are the same as those of the magnetoresistive effect elements 1a and 1b described in the first embodiment. Upon input of the high-frequency signal into the input port 9a, the high-frequency current corresponding to the high-frequency signal input into the input port 9a flows through the input-side signal line 7 and the high-frequency magnetic field corresponding to the input high-frequency current is generated from the input-side signal line 7. The input-side signal line 7 is arranged so that the high-frequency magnetic field generated from the input-side signal line 7 is applied to the magnetization free layers 4 of the magnetoresistive effect elements 1a and 1b in the first MR unit 20a. In the first MR unit 20a, the magnetoresistive effect elements 1a and 1b, which are connected in parallel to each other, are connected to the magnetic-field generating signal line 18a so that the high-frequency current output from the magnetoresistive effect elements 1a and 1b, which are connected in parallel to each other, flows through the magnetic-field generating signal line 18a. When the high-frequency current output from the magnetoresistive effect elements 1a and 1b flows through the magnetic-field generating signal line 18a, the high-frequency magnetic field corresponding to the high-frequency current is generated from the magnetic-field generating signal line 18a. The magnetic-field generating signal line 18a in the first (M-th) MR unit 20a is arranged so that the high-frequency magnetic field generated from the magnetic-field generating signal line 18a in the first (M-th) MR unit 20a is capable of being applied to the magnetization free layers 4 of the magnetoresistive effect elements 24a and 24b in the second (M+1-th) MR unit 20b. Here, M is a natural number that meets 1≤M≤N−1. In addition, in the second MR unit 20b, the magnetoresistive effect elements 24a and 24b, which are connected in parallel to each other, are connected to the magnetic-field generating signal line 18b so that the high-frequency current output from the magnetoresistive effect elements 24a and 24b, which are connected in parallel to each other, flows through the magnetic-field generating signal line 18b. When the high-frequency current output from the magnetoresistive effect elements 24a and 24b flows through the magnetic-field generating signal line 18b, the high-frequency magnetic field corresponding to the high-frequency current is generated from the magnetic-field generating signal line 18b. The magnetic-field generating signal line 18b in the second (N-th) MR unit 20b is arranged so that the high-frequency magnetic field generated from the magnetic-field generating signal line 18b in the second (N-th) MR unit 20b is applied to the magnetization free layers 4 of the magnetoresistive effect elements 14a and 14b in the output unit 21.

The first MR unit 20a includes the MR-unit-side DC current input terminal 11c and the MR-unit-side DC current input terminal 11c is connected to the magnetoresistive effect elements 1a and 1b, which are connected in parallel to each other, in the first MR unit 20a. The second MR unit 20b includes the MR-unit-side DC current input terminal 11d and the MR-unit-side DC current input terminal 11d is connected to the magnetoresistive effect elements 24a and 24b, which are connected in parallel to each other, in the second MR unit 20b. In other words, in the magnetoresistive effect device 900, each of the MR units 20a and 20b includes the MR-unit-side DC current input terminal and the MR-unit-side DC current input terminal is connected to the magnetoresistive effect elements in each of the MR units 20a and 20b.

The configuration of the output unit 21 is the same as that of the output unit described in the first embodiment. The output unit 21 includes the output-unit-side DC current input terminal 11b and the output-unit-side DC current input terminal 11b is connected to the magnetoresistive effect elements 14a and 14b, which are connected in parallel to each other, in the output unit 21.

In the example illustrated in FIG. 12, the input-side signal line 7 is connected to the input port 9a and is capable of being connected to the ground 8 via the reference voltage terminal 30. The magnetic-field generating signal line 18a is connected to the magnetoresistive effect elements 1a and 1b, which are connected in parallel to each other, in the first MR unit 20a and is capable of being connected to the ground 8 via the reference voltage terminal 30. The magnetic-field generating signal line 18b is connected to the magnetoresistive effect elements 24a and 24b, which are connected in parallel to each other, in the second MR unit 20b and is capable of being connected to the ground 8 via the reference voltage terminal 30.

In the first MR unit 20a, the magnetization free layer 4 of the magnetoresistive effect element 1a and the magnetization free layer 4 of the magnetoresistive effect element 1b are connected to the same upper electrode 5, and the magnetization fixed layer 2 of the magnetoresistive effect element 1a and the magnetization fixed layer 2 of the magnetoresistive effect element 1b are connected to the same lower electrode 6. One end (the magnetization fixed layer 2 side) of the magnetoresistive effect elements 1a and 1b is connected to the magnetic-field generating signal line 18a via the lower electrode 6, and the other end (the magnetization free layer 4 side) of the magnetoresistive effect elements 1a and 1b is connected to the MR-unit-side DC current input terminal 11c via the upper electrode 5.

Similarly, in the second MR unit 20b, the magnetization free layer 4 of the magnetoresistive effect element 24a and the magnetization free layer 4 of the magnetoresistive effect element 24b are connected to the same upper electrode 5, and the magnetization fixed layer 2 of the magnetoresistive effect element 24a and the magnetization fixed layer 2 of the magnetoresistive effect element 24b are connected to the same lower electrode 6. One end (the magnetization fixed layer 2 side) of the magnetoresistive effect elements 24a and 24b is connected to the magnetic-field generating signal line 18b via the lower electrode 6, and the other end (the magnetization free layer 4 side) of the magnetoresistive effect elements 24a and 24b is connected to the MR-unit-side DC current input terminal 11d via the upper electrode 5.

The magnetic-field applying mechanisms 12 are individually disposed near each of the magnetoresistive effect elements 1a, 1b, 14a, 14b, 24a, and 24b so that the individual static magnetic fields are capable of being independently applied to the respective magnetoresistive effect elements 1a and 1b in the first MR unit 20a, the respective magnetoresistive effect elements 24a and 24b in the second MR unit 20b, and the respective magnetoresistive effect elements 14a and 14b in the output unit 21. In the first MR unit 20a, the high-frequency magnetic field generated from the input-side signal line 7 is applied to the magnetization free layers 4 of the magnetoresistive effect elements 1a and 1b in a state in which the static magnetic fields are individually applied from the respective magnetic-field applying mechanisms 12 to the corresponding magnetoresistive effect elements 1a and 1b. Also in the second MR unit 20b, the high-frequency magnetic field generated from the magnetic-field generating signal line 18a is applied to the magnetization free layers 4 of the magnetoresistive effect elements 24a and 24b in a state in which the static magnetic fields are individually applied from the respective magnetic-field applying mechanisms 12 to the corresponding magnetoresistive effect elements 24a and 24b. Also in the output unit 21, the high-frequency magnetic field generated from the magnetic-field generating signal line 18b is applied to the magnetization free layers 4 of the magnetoresistive effect elements 14a and 14b in a state in which the static magnetic fields are individually applied from the respective magnetic-field applying mechanisms 12 to the corresponding magnetoresistive effect elements 14a and 14b. Each of the magnetic-field applying mechanisms 12 is capable of setting the ferromagnetic resonant frequency of the magnetization free layer 4 of each of the magnetoresistive effect elements 1a, 1b, 14a, 14b, 24a, and 24b.

The MR-unit-side DC current input terminal 11c is connected to the magnetoresistive effect elements 1a and 1b, which are connected in parallel to each other, in the first MR unit 20a. Connection of a MR-unit-side direct-current source 13c to the MR-unit-side DC current input terminal 11c enables the DC current to be applied to the magnetoresistive effect elements 1a and 1b in the first MR unit 20a.

Similarly, the MR-unit-side DC current input terminal 11d is connected to the magnetoresistive effect elements 24a and 24b, which are connected in parallel to each other, in the second MR unit 20b. Connection of a MR-unit-side direct-current source 13d to the MR-unit-side DC current input terminal 11d enables the DC current to be applied to the magnetoresistive effect elements 24a and 24b in the second MR unit 20b.

The MR-unit-side direct-current source 13c is connected to the MR-unit-side DC current input terminal 11c and the ground 8. The MR-unit-side direct-current source 13c applies the DC current to a closed circuit including the MR-unit-side DC current input terminal 11c, the magnetoresistive effect elements 1a and 1b, the magnetic-field generating signal line 18a, and the ground 8 via the MR-unit-side DC current input terminal 11c.

The MR-unit-side direct-current source 13d is connected to the MR-unit-side DC current input terminal 11d and the ground 8. The MR-unit-side direct-current source 13d applies the DC current to a closed circuit including the MR-unit-side DC current input terminal 11d, the magnetoresistive effect elements 24a and 24b, the magnetic-field generating signal line 18b, and the ground 8 via the MR-unit-side DC current input terminal 11d.

The remaining configurations of the magnetoresistive effect device 900 are the same as those of the magnetoresistive effect device 100 of the first embodiment.

Upon input of the high-frequency signal into the input port 9a, the high-frequency current corresponding to the high-frequency signal input into the input port 9a flows through the input-side signal line 7 and the high-frequency magnetic field corresponding to the input high-frequency current is generated from the input-side signal line 7. The high-frequency magnetic field generated from the input-side signal line 7 is applied to the magnetization free layer 4 of each of the magnetoresistive effect elements 1a and 1b in the first MR unit 20a, and the magnetization of the magnetization free layer 4 of each magnetoresistive effect element oscillates in response to the high-frequency magnetic field generated from the input-side signal line 7. Upon application of the DC current from the MR-unit-side DC current input terminal 11c, the high-frequency signals having frequencies near the ferromagnetic resonant frequency of the magnetization free layer 4 of each of the magnetoresistive effect elements 1a and 1b in the first MR unit 20a are supplied from each of the magnetoresistive effect elements 1a and 1b to the magnetic-field generating signal line 18a with strengths greater than those of the high-frequency signals of other frequencies, as in the MR unit 20 described in the first embodiment.

When the high-frequency current output from the magnetoresistive effect elements 1a and 1b in the first MR unit 20a flows through the magnetic-field generating signal line 18a, the high-frequency magnetic field corresponding to the high-frequency current is generated from the magnetic-field generating signal line 18a. The high-frequency magnetic field generated from the magnetic-field generating signal line 18a is applied to the magnetization free layer 4 of each of the magnetoresistive effect elements 24a and 24b in the second MR unit 20b, and the magnetization of the magnetization free layer 4 of each magnetoresistive effect element oscillates in response to the high-frequency magnetic field generated from the magnetic-field generating signal line 18a. The frequency of the high-frequency magnetic field generated from the magnetic-field generating signal line 18a corresponds to the frequency of the high-frequency signal output from the magnetoresistive effect elements 1a and 1b in the first MR unit 20a. Upon application of the high-frequency magnetic field generated from the magnetic-field generating signal line 18a to the magnetization free layer 4 of each of the magnetoresistive effect elements 24a and 24b, the magnetization of the magnetization free layer 4 of each magnetoresistive effect element greatly oscillates for the high-frequency signals having frequencies near the ferromagnetic resonant frequency of the magnetization free layer 4 of each of the magnetoresistive effect elements 24a and 24b, among the high-frequency signals output from the magnetoresistive effect elements 1a and 1b in the first MR unit 20a, due to the ferromagnetic resonance effect of the magnetization free layer 4 of each magnetoresistive effect element, to cause the resistance value of each of the magnetoresistive effect elements 24a and 24b to greatly oscillate. Accordingly, upon application of the DC current from the MR-unit-side DC current input terminal 11d, the high-frequency signals having frequencies near the ferromagnetic resonant frequency of the magnetization free layer 4 of each of the magnetoresistive effect elements 24a and 24b in the second MR unit 20b are supplied from each of the magnetoresistive effect elements 24a and 24b to the magnetic-field generating signal line 18b with strengths greater than those of the high-frequency signals of other frequencies, as in the MR unit 20 described in the first embodiment.

When the high-frequency current output from the magnetoresistive effect elements 24a and 24b in the second MR unit 20b flows through the magnetic-field generating signal line 18b, the high-frequency magnetic field corresponding to the high-frequency current is generated from the magnetic-field generating signal line 18b. The high-frequency magnetic field generated from the magnetic-field generating signal line 18b is applied to the magnetization free layer 4 of each of the magnetoresistive effect elements 14a and 14b in the output unit 21, and the magnetization of the magnetization free layer 4 of each magnetoresistive effect element oscillates in response to the high-frequency magnetic field generated from the magnetic-field generating signal line 18b. The frequency of the high-frequency magnetic field generated from the magnetic-field generating signal line 18b corresponds to the frequency of the high-frequency signal output from the magnetoresistive effect elements 24a and 24b in the second MR unit 20b. Upon application of the high-frequency magnetic field generated from the magnetic-field generating signal line 18b to the magnetization free layer 4 of each of the magnetoresistive effect elements 14a and 14b, the magnetization of the magnetization free layer 4 of each magnetoresistive effect element greatly oscillates for the high-frequency signals having frequencies near the ferromagnetic resonant frequency of the magnetization free layer 4 of each of the magnetoresistive effect elements 14a and 14b, among the high-frequency signals output from the magnetoresistive effect elements 24a and 24b in the second MR unit 20b, due to the ferromagnetic resonance effect of the magnetization free layer 4 of each magnetoresistive effect element, to cause the resistance value of each of the magnetoresistive effect elements 14a and 14b to greatly oscillate. Accordingly, upon application of the DC current from the output-unit-side DC current input terminal 11b, the high-frequency signals having frequencies near the ferromagnetic resonant frequency of the magnetization free layer 4 of each of the magnetoresistive effect elements 14a and 14b in the output unit 21 are supplied from each of the magnetoresistive effect elements 14a and 14b to the output port 9b with strengths greater than those of the high-frequency signals of other frequencies, as in the output unit 21 described in the first embodiment.

In other words, since the magnetoresistive effect device 900 is capable of selectively passing the high-frequency signals having frequencies near the ferromagnetic resonant frequency of the magnetization free layer 4 of each magnetoresistive effect element (frequencies in the pass band) at the three stages of the first MR unit 20a, the second MR unit 20b, and the output unit 21, the magnetoresistive effect device 900 serves as a high-frequency filter having high frequency selectivity.

In addition, since varying the DC current to be applied to the magnetoresistive effect elements 1a and 1b (the DC current to be applied from the MR-unit-side DC current input terminal 11c), the DC current to be applied to the magnetoresistive effect elements 24a and 24b (the DC current to be applied from the MR-unit-side DC current input terminal 11d), and the DC current to be applied to the magnetoresistive effect elements 14a and 14b (the DC current to be applied from the output-unit-side DC current input terminal lib) enables the ferromagnetic resonant frequencies of the magnetization free layers 4 of the magnetoresistive effect elements 1a, 1b, 14a, 14b, 24a, and 24b to be variably controlled, the magnetoresistive effect device 900 may function as a variable frequency filter capable of varying the pass band.

Furthermore, since the magnetic-field applying mechanism 12 is capable of varying the effective magnetic field in the magnetization free layer 4 of each of the magnetoresistive effect elements 1a, 1b, 14a, 14b, 24a, and 24b to vary the ferromagnetic resonant frequencies of the magnetization free layers 4 of the magnetoresistive effect elements 1a, 1b, 14a, 14b, 24a, and 24b, the magnetoresistive effect device 900 may function as the variable frequency filter capable of varying the pass band.

Furthermore, when attention is given to one arbitrary frequency in the pass band when the pass band is varied, the phase of the passing signal is varied. In other words, the magnetoresistive effect device 900 may function as a phase shifter capable of varying the phase of a signal having a frequency in the pass band (operating band).

Since the high-frequency signal is not output from the input port 9a even when the high-frequency signal is input from the output port 9b into the input port 9a, the magnetoresistive effect device 900 may function as an isolator. In addition, when the strength of the high-frequency signal output from the output port 9b is greater than the strength of the high-frequency signal input into the input port 9a, the magnetoresistive effect device 900 may also function as an amplifier. Increasing the magnitude of at least one of the DC current supplied from the MR-unit-side DC current input terminal 11c, the DC current supplied from the MR-unit-side DC current input terminal 11d, and the DC current supplied from the output-unit-side DC current input terminal 11b to a certain value or higher enables the strength of the high-frequency signal output from the output port 9b to be greater than the strength of the high-frequency signal input into the input port 9a.

As described above, the magnetoresistive effect device 900 includes the input port 9a into which a high-frequency signal is to be input, the input-side signal line 7 which is connected to the input port 9a and through which high-frequency current corresponding to the high-frequency signal input into the input port 9a flows, the n-number (N=2) MR units each including the magnetoresistive effect elements and the magnetic-field generating signal line (the first MR unit 20a including the magnetoresistive effect elements 1a and 1b and the magnetic-field generating signal line 18a and the second MR unit 20b including the magnetoresistive effect elements 24a and 24b and the magnetic-field generating signal line 18b), and the output unit 21 including the magnetoresistive effect elements 14a and 14b, the output-side signal line 17, and the output port 9b. The magnetoresistive effect device 900 further includes the DC application terminals (the MR-unit-side DC current input terminal 11c, the MR-unit-side DC current input terminal 11d, and the output-unit-side DC current input terminal 11b) so as to be capable of applying DC current or DC voltage to the magnetoresistive effect elements in the two (N-number) MR units (the magnetoresistive effect elements 1a and 1b in the first MR unit 20a and the magnetoresistive effect elements 24a and 24b in the second MR unit 20b) and the magnetoresistive effect elements 14a and 14b in the output unit 21. Each of the magnetoresistive effect elements 1a, 1b, 14a, 14b, 24a, and 24b includes the magnetization fixed layer 2 (the first ferromagnetic layer), the magnetization free layer 4 (the second ferromagnetic layer), and the spacer layer 3 arranged between the magnetization fixed layer 2 and the magnetization free layer 4. The magnetoresistive effect elements 14a and 14b in the output unit 21 are connected to the output port 9b via the output-side signal line 17. The input-side signal line 7 is arranged so that the high-frequency magnetic field generated from the input-side signal line 7 is applied to the magnetization free layers 4 of the magnetoresistive effect elements 1a and 1b in the first MR unit 20a. In the first MR unit 20a, the magnetoresistive effect elements 1a and 1b are connected to the magnetic-field generating signal line 18a so that the high-frequency current output from the magnetoresistive effect elements 1a and 1b flows through the magnetic-field generating signal line 18a. In the second MR unit 20b, the magnetoresistive effect elements 24a and 24b are connected to the magnetic-field generating signal line 18b so that the high-frequency current output from the magnetoresistive effect elements 24a and 24b flows through the magnetic-field generating signal line 18b. The magnetic-field generating signal line 18a in the first (M-th) MR unit 20a is arranged so that the high-frequency magnetic field generated from the magnetic-field generating signal line 18a in the first (M-th) MR unit 20a is applied to the magnetization free layers 4 of the magnetoresistive effect elements 24a and 24b in the second (M+1-th) MR unit 20b. The magnetic-field generating signal line 18b in the second (N-th) MR unit 20b is arranged so that the high-frequency magnetic field generated from the magnetic-field generating signal line 18b in the second (N-th) MR unit 20b is applied to the magnetization free layers 4 of the magnetoresistive effect elements 14a and 14b in the output unit 21.

With the above configuration, according to the magnetoresistive effect device 900, upon input of the high-frequency signal into the input port 9a, the high-frequency current flows through the input-side signal line 7. Accordingly, the high-frequency magnetic field, which corresponds to the input high-frequency signal and which is generated from the input-side signal line 7, is applied to the magnetization free layer 4 of each of the magnetoresistive effect elements 1a and 1b in the first MR unit 20a and the magnetization of the magnetization free layer 4 of each of the magnetoresistive effect elements 1a and 1b in the first MR unit 20a oscillates in response to the high-frequency magnetic field generated from the input-side signal line 7. Due to the magnetoresistive effect, the resistance value of each of the magnetoresistive effect elements 1a and 1b in the first MR unit 20a oscillates in response to the oscillation of the magnetization of the magnetization free layer 4 of each magnetoresistive effect element. Upon application of the DC current from the MR-unit-side DC current input terminal 11c to each of the magnetoresistive effect elements 1a and 1b in the first MR unit 20a, a high-frequency signal corresponding to the input high-frequency signal is supplied from the magnetoresistive effect elements 1a and 1b in the first MR unit 20a to the magnetic-field generating signal line 18a as voltage, which is a product of the oscillating resistance value of each of the magnetoresistive effect elements 1a and 1b in the first MR unit 20a and the DC current flowing through each of the magnetoresistive effect elements 1a and 1b. (When the DC voltage is applied from the MR-unit-side DC application terminal to each of the magnetoresistive effect elements 1a and 1b in the first MR unit 20a, a high-frequency signal corresponding to the input high-frequency signal is supplied from the magnetoresistive effect elements 1a and 1b in the first MR unit 20a to the magnetic-field generating signal line 18a as current the magnitude of which oscillates.) In addition, the high-frequency magnetic field generated from the magnetic-field generating signal line 18a in the first (M-th) MR unit 20a is applied to the magnetization free layers 4 of the magnetoresistive effect elements 24a and 24b in the second (M+1-th) MR unit, and the magnetization of the magnetization free layers 4 of the magnetoresistive effect elements 24a and 24b in the second (M+1-th) MR unit oscillates in response to the high-frequency magnetic field generated from the magnetic-field generating signal line 18a in the first (M-th) MR unit 20a. Due to the magnetoresistive effect, the resistance values of the magnetoresistive effect elements 24a and 24b in the second (M+1-th) MR unit 20b oscillate in response to the oscillation of the magnetization of the magnetization free layer 4. Upon application of the DC current from the MR-unit-side DC current input terminal 11d to the magnetoresistive effect elements 24a and 24b in the second (M+1-th) MR unit 20b, a high-frequency signal corresponding to the high-frequency signal supplied from the magnetoresistive effect elements 1a and 1b in the first (M-th) MR unit 20a to the magnetic-field generating signal line 18a is supplied from the magnetoresistive effect elements 24a and 24b in the second (M+1-th) MR unit 20b to the magnetic-field generating signal line 18b in the second (M+1-th) MR unit 20b as voltage, which is a product of the oscillating resistance value of each of the magnetoresistive effect elements 24a and 24b in the second (M+1-th) MR unit 20b and the DC current flowing through each of the magnetoresistive effect elements 24a and 24b. (When the DC voltage is applied from the MR-unit-side DC application terminal to each of the magnetoresistive effect elements 24a and 24b in the second (M+1-th) MR unit 20b, a high-frequency signal corresponding to the input high-frequency signal is supplied from the magnetoresistive effect elements 24a and 24b in the second (M+1-th) MR unit 20b to the magnetic-field generating signal line 18b as current the magnitude of which oscillates.) Similarly, also in the output unit 21, the magnetization of the magnetization free layer 4 of each of the magnetoresistive effect elements 14a and 14b in the output unit 21 oscillates in response to the high-frequency magnetic field generated from the magnetic-field generating signal line 18b in the second (N-th) MR unit 20b. Upon application of the DC current from the output-unit-side DC current input terminal 11b to the magnetoresistive effect elements 14a and 14b in the output unit 21, a high-frequency signal corresponding to the high-frequency signal supplied from the magnetoresistive effect elements 24a and 24b in the second (N-th) MR unit 20b to the magnetic-field generating signal line 18b is supplied from the magnetoresistive effect elements 14a and 14b in the output unit 21 to the output port 9b as voltage, which is a product of the oscillating resistance value of each of the magnetoresistive effect elements 14a and 14b in the output unit 21 and the DC current flowing through each of the magnetoresistive effect elements 14a and 14b. (When the DC voltage is applied from the output-unit-side DC application terminal to each of the magnetoresistive effect elements 14a and 14b in the output unit 21, a high-frequency signal corresponding to the input high-frequency signal is supplied from the magnetoresistive effect elements 14a and 14b in the output unit 21 to the output port 9b as current the magnitude of which oscillates.)

When the high-frequency magnetic field generated from the input-side signal line 7 is applied to the magnetization free layer 4 of each of the magnetoresistive effect elements 1a and 1b in the first MR unit 20a, the magnetization of the magnetization free layer 4 of each of the magnetoresistive effect elements 1a and 1b in the first MR unit 20a greatly oscillates, due to the ferromagnetic resonance phenomenon, for the high-frequency magnetic fields having frequencies near the ferromagnetic resonant frequency of the magnetization free layer 4 of each of the magnetoresistive effect elements 1a and 1b in the first MR unit 20a, among the high-frequency magnetic fields generated from the input-side signal line 7. Similarly, also when the high-frequency magnetic field generated from the magnetic-field generating signal line 18a in the first (M-th) MR unit 20a is applied to the magnetization free layer 4 of each of the magnetoresistive effect elements 24a and 24b in the second (M+1-th) MR unit 20b, the magnetization of the magnetization free layer 4 of each of the magnetoresistive effect elements 24a and 24b in the second (M+1-th) MR unit 20b greatly oscillates, due to the ferromagnetic resonance phenomenon, for the high-frequency magnetic fields having frequencies near the ferromagnetic resonant frequency of the magnetization free layer 4 of each of the magnetoresistive effect elements 24a and 24b in the second (M+1-th) MR unit 20b, among the high-frequency magnetic fields generated from the magnetic-field generating signal line 18a in the first (M-th) MR unit 20a. Similarly, also when the high-frequency magnetic field generated from the magnetic-field generating signal line 18b in the second (N-th) MR unit 20b is applied to the magnetization free layer 4 of each of the magnetoresistive effect elements 14a and 14b in the output unit 21, the magnetization of the magnetization free layer 4 of each of the magnetoresistive effect elements 14a and 14b in the output unit 21 greatly oscillates, due to the ferromagnetic resonance phenomenon, for the high-frequency magnetic fields having frequencies near the ferromagnetic resonant frequency of the magnetization free layer 4 of each of the magnetoresistive effect elements 14a and 14b in the output unit 21, among the high-frequency magnetic fields generated from the magnetic-field generating signal line 18b in the second (N-th) MR unit 20b. Due to the ferromagnetic resonance phenomenon, in each of the N-number MR units (the first MR unit 20a and the second MR unit 20b), the high-frequency signals having frequencies near the ferromagnetic resonant frequency of the magnetization free layer 4 of each magnetoresistive effect element are supplied from the magnetoresistive effect elements (the magnetoresistive effect elements 1a and 1b or the magnetoresistive effect elements 24a and 24b) to the magnetic-field generating signal line (the magnetic-field generating signal line 18a or the magnetic-field generating signal line 18b) with strengths greater than those of the high-frequency signals of other frequencies. Similarly, also in the output unit 21, the high-frequency signals having frequencies near the ferromagnetic resonant frequency of the magnetization free layer 4 of each magnetoresistive effect element are supplied from the magnetoresistive effect elements 14a and 14b to the output port 9b with strengths greater than those of the high-frequency signals of other frequencies.

With the above configuration, the high-frequency signal passes through the magnetoresistive effect device 900 selectively for the frequency at the three stages (N+1 stages) of the two (N-number) MR units (the first MR unit 20a and the second MR unit 20b) and the output unit 21. Accordingly, the frequency selectivity of the high-frequency signal is further improved in a portion where the frequencies are overlapped with each other near the ferromagnetic resonant frequency of the magnetization free layer 4 of each of the magnetoresistive effect elements 1a and 1b in the first MR unit 20a, near the ferromagnetic resonant frequency of the magnetization free layer 4 of each of the magnetoresistive effect elements 24a and 24b in the second MR unit 20b, and near the ferromagnetic resonant frequency of the magnetization free layer 4 of each of the magnetoresistive effect elements 14a and 14b in the output unit 21, and the magnetoresistive effect device 900 functions as a high-frequency filter having excellent characteristics.

In addition, the magnetoresistive effect device 900 may function as an isolator. Furthermore, since varying the DC current or the DC voltage applied from the MR-unit-side DC application terminal, the MR-unit-side DC application terminal, and the output-unit-side DC application terminal enables the ferromagnetic resonant frequency of the magnetization free layer 4 of each magnetoresistive effect element to be variably controlled, the magnetoresistive effect device 900 may also function as a variable frequency filter or an isolator. Furthermore, the magnetoresistive effect device 900 may function as a phase shifter capable of varying the phase of a signal and an amplifier capable of amplifying a signal.

Furthermore, in the magnetoresistive effect device 900, the first MR unit includes the MR-unit-side DC current input terminal 11c, the second MR unit includes the MR-unit-side DC current input terminal 11d(that is, each of the MR units includes the MR-unit-side DC application terminal), and the output unit 21 includes the output-unit-side DC current input terminal 11b(the output-unit-side DC application terminal) as the DC application terminals. The MR-unit-side DC current input terminal 11c is connected to the magnetoresistive effect elements 1a and 1b in the first MR unit 20a, the MR-unit-side DC current input terminal 11d is connected to the magnetoresistive effect elements 24a and 24b in the second MR unit 20b (that is, the MR-unit-side DC application terminal is connected to the magnetoresistive effect elements in each of the MR units), and the output-unit-side DC current input terminal 11b(the output-unit-side DC application terminal) is connected to the magnetoresistive effect elements 14a and 14b in the output unit 21. Accordingly, optimal DC current or DC voltage is capable of being individually applied to the magnetoresistive effect elements 1a and 1b in the first MR unit 20a, the magnetoresistive effect elements 24a and 24b in the second MR unit 20b, and the magnetoresistive effect elements 14a and 14b in the output unit 21.

Various components may be added to the magnetoresistive effect device 900 of the ninth embodiment described above. For example, in order to prevent the direct-current signal from flowing into a high-frequency circuit connected to the output port 9b, a capacitor for cutting off the direct-current signal may be connected in series to the output-side signal line 17 between a connection portion of the inductor 10 to the output-side signal line 17 and the output port 9b.

Tenth Embodiment

Figure 13:
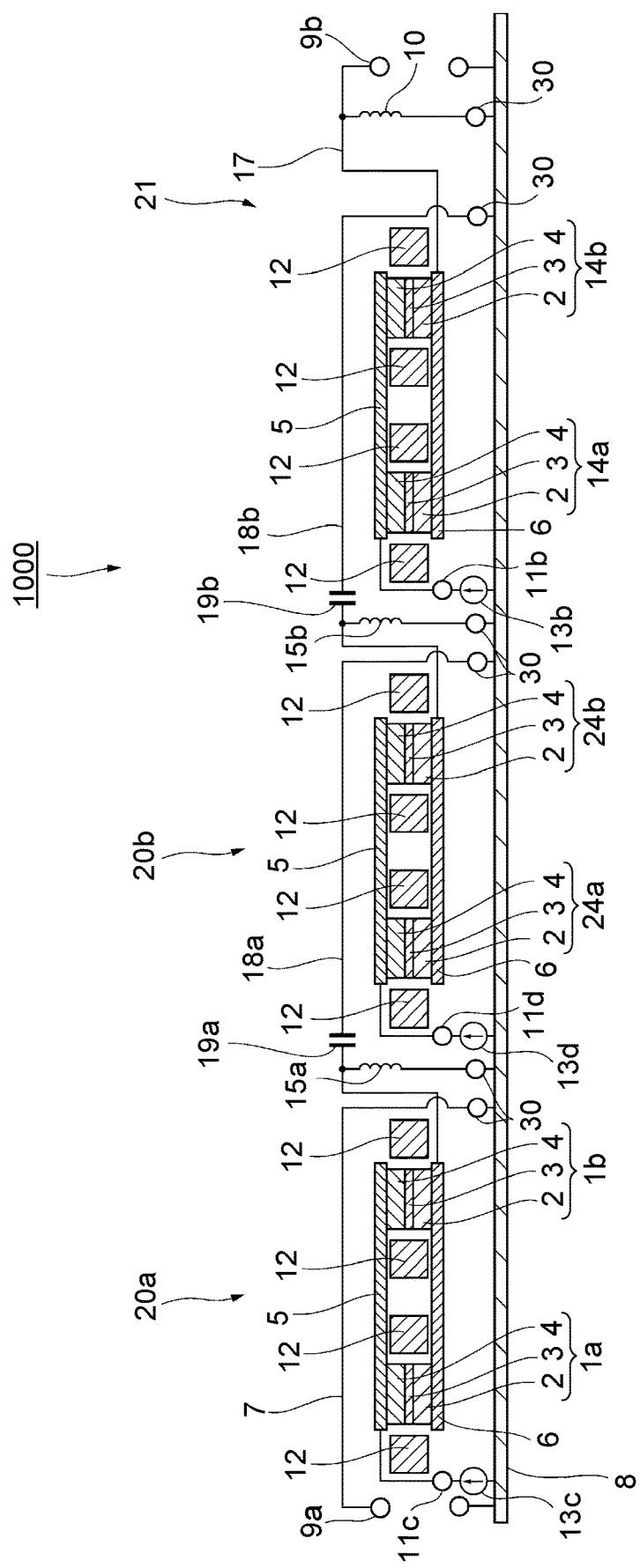
FIG. 13 is a schematic cross-sectional view illustrating the configuration of a magnetoresistive effect device according to a tenth embodiment.

FIG. 13 is a schematic cross-sectional view of a magnetoresistive effect device 1000 according to a tenth embodiment of the present invention. Points different from the magnetoresistive effect device 900 of the ninth embodiment in the magnetoresistive effect device 1000 will be mainly described and a description of common points will be appropriately omitted herein. The same reference numerals are used in the tenth embodiment to identify the components common to the magnetoresistive effect device 900 of the ninth embodiment and a description of the common components will be omitted herein. The magnetoresistive effect device 1000 further includes capacitors 19a and 19b and inductors 15a and 15b, in addition to the components in the magnetoresistive effect device 900 of the ninth embodiment. In the first MR unit 20a, the capacitor 19a is connected in series to the magnetic-field generating signal line 18a and the inductor 15a is connected between the capacitor 19a and the magnetoresistive effect elements 1a and 1b, which are connected in parallel to each other, so as to be parallel to the magnetic-field generating signal line 18a. In the second MR unit 20b, the capacitor 19b is connected in series to the magnetic-field generating signal line 18b and the inductor 15b is connected between the capacitor 19b and the magnetoresistive effect elements 24a and 24b, which are connected in parallel to each other, so as to be parallel to the magnetic-field generating signal line 18b.

In the example illustrated in FIG. 13, one end of the inductor 15a is connected to the magnetic-field generating signal line 18a between the capacitor 19a and the magnetoresistive effect elements 1a and 1b, which are connected in parallel to each other, and the other end of the inductor 15a is capable of being connected to the ground 8 via the reference voltage terminal 30. One end of the inductor 15b is connected to the magnetic-field generating signal line 18b between the capacitor 19b and the magnetoresistive effect elements 24a and 24b, which are connected in parallel to each other, and the other end of the inductor 15b is capable of being connected to the ground 8 via the reference voltage terminal 30. The inductor that is the same as the inductor 10 described in the first embodiment may be used as the inductors 15a and 15b.

In the magnetoresistive effect device 1000, the DC current is applied from the MR-unit-side DC current input terminal 11c to a closed circuit including the MR-unit-side DC current input terminal 11c, the magnetoresistive effect elements 1a and 1b, the inductor 15a, and the ground 8. In addition, the high-frequency current output from the magnetoresistive effect elements 1a and 1b flows through the magnetic-field generating signal line 18a via the capacitor 19a. In the magnetoresistive effect device 1000, the DC current is applied from the MR-unit-side DC current input terminal 11d to a closed circuit including the MR-unit-side DC current input terminal 11d, the magnetoresistive effect elements 24a and 24b, the inductor 15b, and the ground 8. In addition, the high-frequency current output from the magnetoresistive effect elements 24a and 24b flows through the magnetic-field generating signal line 18b via the capacitor 19b. The remaining configurations of the magnetoresistive effect device 1000 are the same as those of the magnetoresistive effect device 900 of the ninth embodiment.

Since the capacitor 19a is connected in series to the magnetic-field generating signal line 18a in at least one MR unit (the first MR unit 20a), among the N-number (N=2) MR units, in the magnetoresistive effect device 1000, the capacitor 19a prevents the DC current from flowing into the magnetic-field generating signal line 18a. In addition, in the first MR unit 20a, since the inductor 15a is connected in parallel to the magnetic-field generating signal line 18a between the capacitor 19a and the magnetoresistive effect elements 1a and 1b, the inductor 15a serves as a path of the DC current supplied from the MR-unit-side DC current input terminal 11c and suppresses flowing of the high-frequency signal into the inductor 15a side. Accordingly, it is possible to cause the high-frequency signal output from the magnetoresistive effect elements 1a and 1b to efficiently flow through the magnetic-field generating signal line 18a and it is possible to efficiently generate the high-frequency magnetic field from the magnetic-field generating signal line 18a. Similarly, since the capacitor 19b is connected in series to the magnetic-field generating signal line 18b in at least one MR unit (the second MR unit 20b), among the N-number (N=2) MR units, in the magnetoresistive effect device 1000, the capacitor 19b prevents the DC current from flowing into the magnetic-field generating signal line 18b. In addition, in the second MR unit 20b, since the inductor 15b is connected in parallel to the magnetic-field generating signal line 18b between the capacitor 19b and the magnetoresistive effect elements 24a and 24b, the inductor 15b serves as a path of the DC current supplied from the MR-unit-side DC current input terminal 11d and suppresses flowing of the high-frequency signal into the inductor 15b side. Accordingly, it is possible to cause the high-frequency signal output from the magnetoresistive effect elements 24a and 24b to efficiently flow through the magnetic-field generating signal line 18b and it is possible to efficiently generate the high-frequency magnetic field from the magnetic-field generating signal line 18b.

The example is described in the above tenth embodiment in which the capacitor is connected in series to the magnetic-field generating signal line and the inductor is connected in parallel to the magnetic-field generating signal line between the capacitor and the magnetoresistive effect elements in both the first MR unit 20a and the second MR unit 20b. However, if the capacitor is connected in series to the magnetic-field generating signal line and the inductor is connected in parallel to the magnetic-field generating signal line between the capacitor and the magnetoresistive effect elements in at least one MR unit of the N-number MR units, it is possible to prevent the DC current from flowing into the magnetic-field generating signal line in the at least on MR unit and it is possible to efficiently generate the high-frequency magnetic field from the magnetic-field generating signal line.

Eleventh Embodiment

Figure 14:
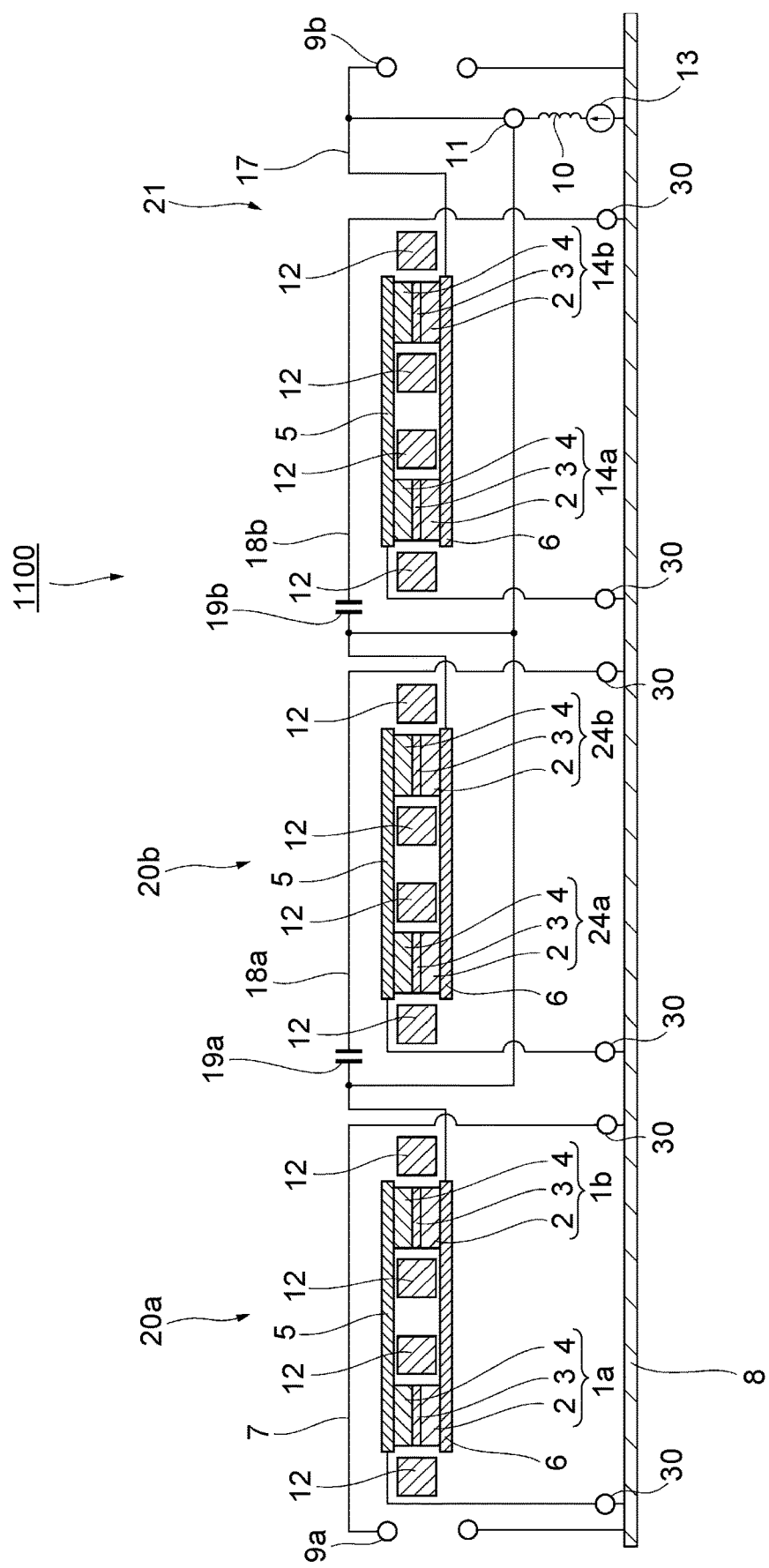
FIG. 14 is a schematic cross-sectional view illustrating the configuration of a magnetoresistive effect device according to an eleventh embodiment.

FIG. 14 is a schematic cross-sectional view of a magnetoresistive effect device 1100 according to an eleventh embodiment of the present invention. Points different from the magnetoresistive effect device 900 of the ninth embodiment in the magnetoresistive effect device 1100 will be mainly described and a description of common points will be appropriately omitted herein. The same reference numerals are used in the eleventh embodiment to identify the components common to the magnetoresistive effect device 900 of the ninth embodiment and a description of the common components will be omitted herein. The magnetoresistive effect device 1100 further includes the capacitors 19a and 19b, in addition to the components in the magnetoresistive effect device 900 of the ninth embodiment. The capacitor 19a is connected in series to the magnetic-field generating signal line 18a in the first MR unit 20a and the capacitor 19b is connected in series to the magnetic-field generating signal line 18b in the second MR unit 20b. The magnetoresistive effect device 1100 includes the DC current input terminal 11, instead of the MR-unit-side DC current input terminals 11c and 11d and the output-unit-side DC current input terminal 11b in the magnetoresistive effect device 900 of the ninth embodiment. The DC current input terminal 11 is an example of the DC application terminal. The DC current input terminal 11 is connected between the capacitor 19a and the magnetoresistive effect elements 1a and 1b, which are connected in parallel to each other, in the first MR unit 20a, between the capacitor 19b and the magnetoresistive effect elements 24a and 24b, which are connected in parallel to each other, in the second MR unit 20b, and between the output port 9b and the magnetoresistive effect elements 14a and 14b, which are connected in parallel to each other, in the output unit 21. The DC current input terminal 11 is capable of applying the DC current to the magnetoresistive effect elements 1a and 1b in the first MR unit 20a, the magnetoresistive effect elements 24a and 24b in the second MR unit 20b, and the magnetoresistive effect elements 14a and 14b in the output unit 21.

In the example illustrated in FIG. 14, the DC current input terminal 11 is connected to the magnetic-field generating signal line 18a between the capacitor 19a and the magnetoresistive effect elements 1a and 1b, which are connected in parallel to each other, the magnetic-field generating signal line 18b between the capacitor 19b and the magnetoresistive effect elements 24a and 24b, which are connected in parallel to each other, and the output-side signal line 17. In addition, as illustrated in FIG. 14, in the first MR unit 20a, one end (the magnetization fixed layer 2 side) of the magnetoresistive effect elements 1a and 1b is connected to the magnetic-field generating signal line 18a via the lower electrode 6 and the other end (the magnetization free layer 4 side) of the magnetoresistive effect elements 24a and 24b is capable of being connected to the ground 8 via the upper electrode 5 and the reference voltage terminal 30. In the second MR unit 20b, one end (the magnetization fixed layer 2 side) of the magnetoresistive effect elements 1a and 1b is connected to the magnetic-field generating signal line 18b via the lower electrode 6 and the other end (the magnetization free layer 4 side) of the magnetoresistive effect elements 24a and 24b is capable of being connected to the ground 8 via the upper electrode 5 and the reference voltage terminal 30. In the output unit 21, one end (the magnetization fixed layer 2 side) of the magnetoresistive effect elements 14a and 14b is connected to the output-side signal line 17 via the lower electrode 6 and the other end (the magnetization free layer 4 side) of the magnetoresistive effect elements 14a and 14b is capable of being connected to the ground 8 via the upper electrode 5 and the reference voltage terminal 30. One end of the inductor 10 is connected to the DC current input terminal 11, the other end of the inductor 10 is connected to one end of the direct-current source 13, and the direct-current source 13 is connected to the DC current input terminal 11 via the inductor 10. The other end of the direct-current source 13 is connected to the ground 8. In the magnetoresistive effect device 1100, the DC current is applied from the DC current input terminal 11 to a closed circuit including the inductor 10, the DC current input terminal 11, the magnetic-field generating signal line 18a, the magnetoresistive effect elements 1a and 1b, and the ground 8, the DC current is applied from the DC current input terminal 11 to a closed circuit including the inductor 10, the DC current input terminal 11, the magnetic-field generating signal line 18b, the magnetoresistive effect elements 24a and 24b, and the ground 8, and the DC current is applied from the DC current input terminal 11 to a closed circuit including the inductor 10, the DC current input terminal 11, the output-side signal line 17, the magnetoresistive effect elements 14a and 14b, and the ground 8. The high-frequency current output from the magnetoresistive effect elements 1a and 1b flows through the magnetic-field generating signal line 18a via the capacitor 19a, and the high-frequency current output from the magnetoresistive effect elements 24a and 24b flows through the magnetic-field generating signal line 18b via the capacitor 19b. The remaining configurations of the magnetoresistive effect device 1100 are the same as those of the magnetoresistive effect device 900 of the ninth embodiment.

In the magnetoresistive effect device 1100, in at least one MR unit (the first MR unit 20a), among the N-number (N=2) MR units, the capacitor 19a is connected in series to the magnetic-field generating signal line 18a and the DC current input terminal 11 (the DC application terminal) is connected both between the capacitor 19a and the magnetoresistive effect elements 1a and 1b in the first MR unit 20a and between the output port 9b and the magnetoresistive effect elements 14a and 14b in the output unit 21. Accordingly, the capacitor 19a prevents the DC current supplied from the DC current input terminal 11 (the DC application terminal) from flowing into the magnetic-field generating signal line 18a. Consequently, it is possible to apply the DC current or the DC voltage supplied from the DC current input terminal 11 (the DC application terminal) not only to the magnetoresistive effect elements 14a and 14b in the output unit 21 but also to the magnetoresistive effect elements 1a and 1b in the first MR unit 20a. In addition, since the first MR unit 20a and the output unit 21 are capable of sharing the DC current input terminal 11 (the DC application terminal), it is possible to decrease the number of the direct-current power supplies connected to the DC current input terminal 11 (the DC application terminal). Similarly, in the magnetoresistive effect device 1100, in at least one MR unit (the second MR unit 20b), among the N-number (N=2) MR units, the capacitor 19b is connected in series to the magnetic-field generating signal line 18b and the DC current input terminal 11 (the DC application terminal) is connected both between the capacitor 19b and the magnetoresistive effect elements 24a and 24b in the second MR unit 20b and between the output port 9b and the magnetoresistive effect elements 14a and 14b in the output unit 21. Accordingly, the capacitor 19b prevents the DC current supplied from the DC current input terminal 11 (the DC application terminal) from flowing into the magnetic-field generating signal line 18b. Consequently, it is possible to apply the DC current or the DC voltage supplied from the DC current input terminal 11 (the DC application terminal) not only to the magnetoresistive effect elements 14a and 14b in the output unit 21 but also to the magnetoresistive effect elements 24a and 24b in the second MR unit 20a. In addition, since the second MR unit 20b and the output unit 21 are capable of sharing the DC current input terminal 11 (the DC application terminal), it is possible to decrease the number of the direct-current power supplies connected to the DC current input terminal 11 (the DC application terminal).

In addition, in the magnetoresistive effect device 1100, the capacitor 19a is connected in series to the magnetic-field generating signal line 18a, the capacitor 19b is connected in series to the magnetic-field generating signal line 18b, and the DC current input terminal 11 (the DC application terminal) is connected between the capacitor 19a and the magnetoresistive effect elements 1a and 1b in the first MR unit 20a and between the capacitor 19b and the magnetoresistive effect elements 24a and 24b in the second MR unit 20b in at least two MR units (the first MR unit 20a and the second MR unit 20b), among the N-number (N=2) MR units. Accordingly, at least two MR units (the first MR unit 20a and the second MR unit 20b) are capable of sharing the DC current input terminal 11 (the DC application terminal). Consequently, it is possible to decrease the number of the direct-current power supplies connected to the DC current input terminal 11 (the DC application terminal).

Twelfth Embodiment

Figure 15:
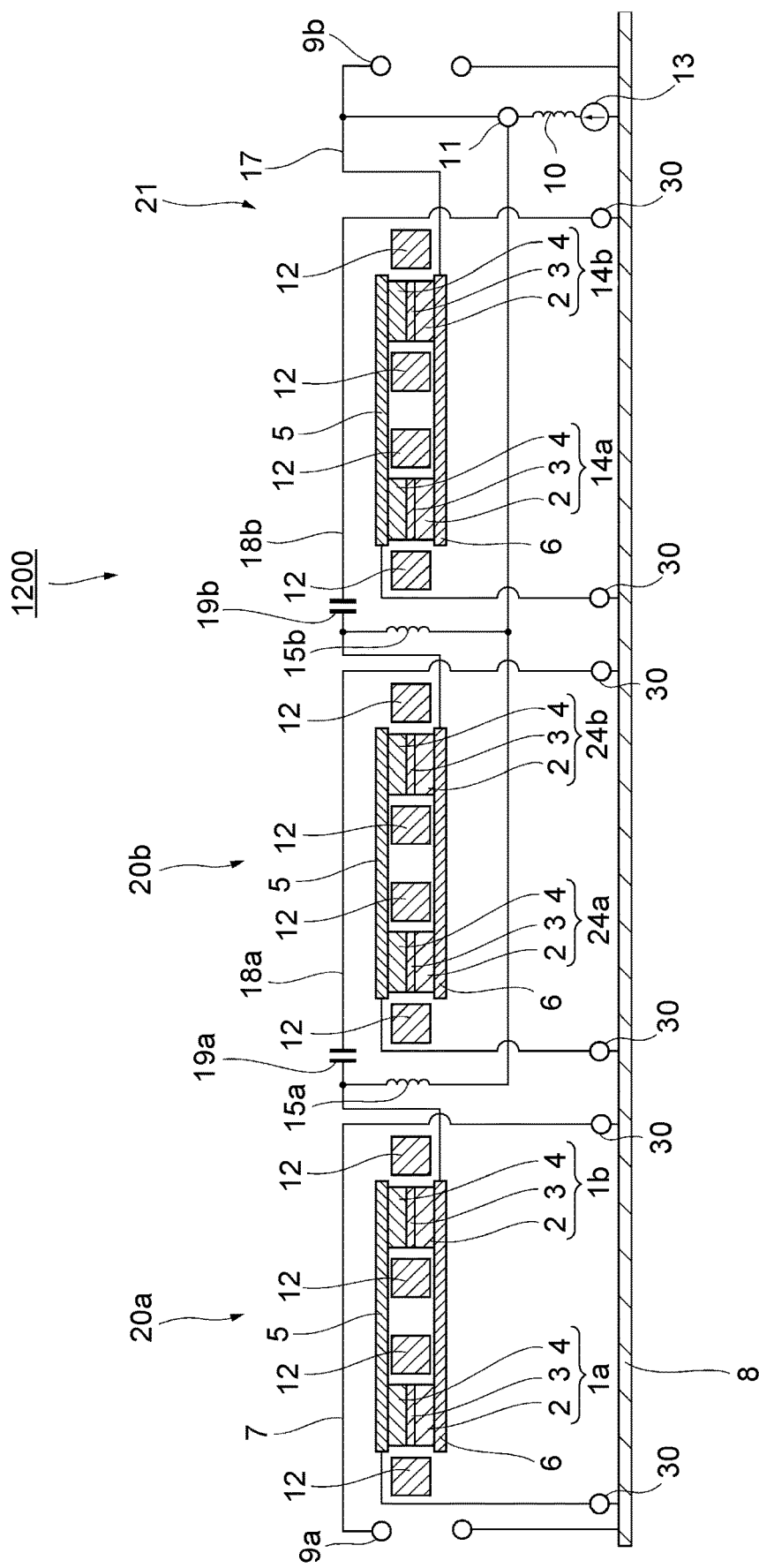
FIG. 15 is a schematic cross-sectional view illustrating the configuration of a magnetoresistive effect device according to a twelfth embodiment.

FIG. 15 is a schematic cross-sectional view of a magnetoresistive effect device 1200 according to a twelfth embodiment of the present invention. Points different from the magnetoresistive effect device 1100 of the eleventh embodiment in the magnetoresistive effect device 1200 will be mainly described and a description of common points will be appropriately omitted herein. The same reference numerals are used in the twelfth embodiment to identify the components common to the magnetoresistive effect device 1100 of the eleventh embodiment and a description of the common components will be omitted herein. The magnetoresistive effect device 1200 further includes the inductors 15a and 15b, in addition to the components in the magnetoresistive effect device 1100 of the eleventh embodiment. In the first MR unit 20a, one end of the inductor 15a is connected between the capacitor 19a and the magnetoresistive effect elements 1a and 1b, which are connected in parallel to each other, and the other end of the inductor 15a is connected to the DC current input terminal 11. In the second MR unit 20b, one end of the inductor 15b is connected between the capacitor 19b and the magnetoresistive effect elements 24a and 24b, which are connected in parallel to each other, and the other end of the inductor 15b is connected to the DC current input terminal 11. In the example illustrated in FIG. 15, one end of the inductor 15a is connected to the magnetic-field generating signal line 18a between the capacitor 19a and the magnetoresistive effect elements 1a and 1b, which are connected in parallel to each other, and one end of the inductor 15b is connected to the magnetic-field generating signal line 18b between the capacitor 19b and the magnetoresistive effect elements 24a and 24b, which are connected in parallel to each other. The inductor that is the same as the inductor 10 described in the first embodiment may be used as the inductors 15a and 15b. In the magnetoresistive effect device 1200, the DC current is applied from the DC current input terminal 11 to a closed circuit including the inductor 10, the DC current input terminal 11, the inductor 15a, the magnetic-field generating signal line 18a, the magnetoresistive effect elements 1a and 1b, and the ground 8, the DC current is applied from the DC current input terminal 11 to a closed circuit including the inductor 10, the DC current input terminal 11, the inductor 15b, the magnetic-field generating signal line 18b, the magnetoresistive effect elements 24a and 24b, and the ground 8, and the DC current is applied from the DC current input terminal 11 to a closed circuit including the inductor 10, the DC current input terminal 11, the output-side signal line 17, the magnetoresistive effect elements 14a and 14b, and the ground 8. The remaining configurations of the magnetoresistive effect device 1200 are the same as those of the magnetoresistive effect device 1100 of the eleventh embodiment.

In the magnetoresistive effect device 1200, in at least one MR unit (the first MR unit 20a), among the N-number (N=2) MR units, one end of the inductor 15a is connected between the capacitor 19a and the magnetoresistive effect elements 1a and 1b and the other end of the inductor 15a is connected to the DC current input terminal 11 (the DC application terminal). Accordingly, the inductor 15a suppresses flowing out of the high-frequency signal output from the magnetoresistive effect elements 1a and 1b to the DC current input terminal 11 (the DC application terminal) side to enable the high-frequency signal to efficiently flow through the magnetic-field generating signal line 18a, thus efficiently generating the high-frequency magnetic field from the magnetic-field generating signal line 18a. Similarly, in the magnetoresistive effect device 1200, in at least one MR unit (the second MR unit 20b), among the N-number (N=2) MR units, one end of the inductor 15b is connected between the capacitor 19b and the magnetoresistive effect elements 24a and 24b and the other end of the inductor 15b is connected to the DC current input terminal (the DC application terminal). Accordingly, the inductor 15b suppresses flowing out of the high-frequency signal output from the magnetoresistive effect elements 24a and 24b to the DC current input terminal 11 (the DC application terminal) side to enable the high-frequency signal to efficiently flow through the magnetic-field generating signal line 18b, thus efficiently generating the high-frequency magnetic field from the magnetic-field generating signal line 18b.

In addition, in the magnetoresistive effect device 1200, in at least two MR units (the first MR unit 20a and the second MR unit 20b), among the N-number (N=2) MR units, one end of the inductor 15a (the inductor 15b) is connected between the capacitor 19a (the capacitor 19b) and the magnetoresistive effect elements 1a and 1b (the magnetoresistive effect elements 24a and 24b) and the other end of the inductor 15a (the inductor 15b) is connected to the DC current input terminal 11 (the DC application terminal). Accordingly, the inductor 15a (the inductor 15b) suppresses flowing out of the high-frequency signal output from the magnetoresistive effect elements 1a and 1b (the magnetoresistive effect elements 24a and 24b) to the DC current input terminal 11 (the DC application terminal) side to enable the high-frequency signal to efficiently flow through the magnetic-field generating signal line 18a (the magnetic-field generating signal line 18b), thus efficiently generating the high-frequency magnetic field from the magnetic-field generating signal line 18a (the magnetic-field generating signal line 18b).

Thirteenth Embodiment

Figure 16:
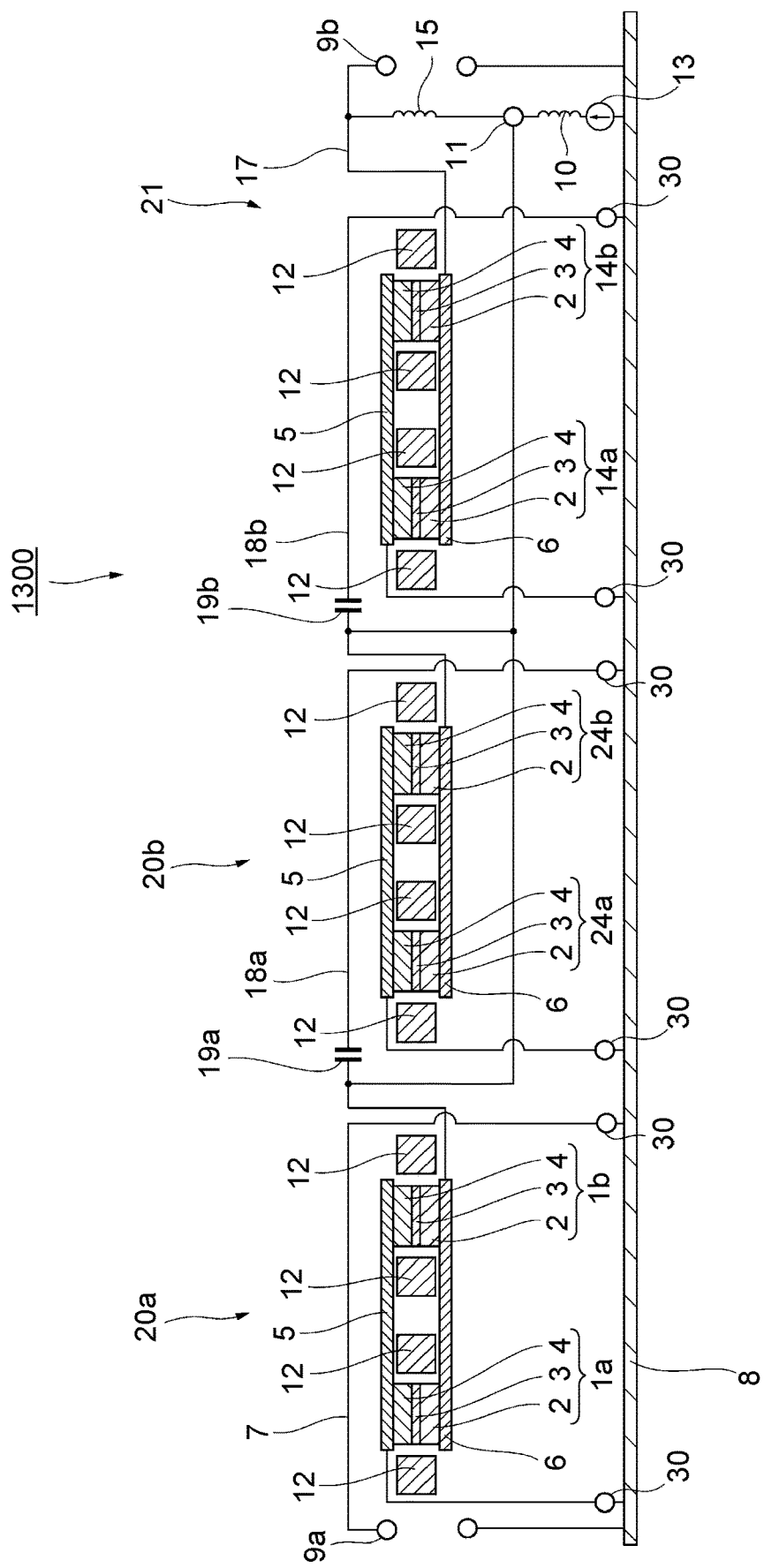
FIG. 16 is a schematic cross-sectional view illustrating the configuration of a magnetoresistive effect device according to a thirteenth embodiment.

FIG. 16 is a schematic cross-sectional view of a magnetoresistive effect device 1300 according to a thirteenth embodiment of the present invention. Points different from the magnetoresistive effect device 1100 of the eleventh embodiment in the magnetoresistive effect device 1300 will be mainly described and a description of common points will be appropriately omitted herein. The same reference numerals are used in the thirteenth embodiment to identify the components common to the magnetoresistive effect device 1100 of the eleventh embodiment and a description of the common components will be omitted herein. The magnetoresistive effect device 1300 further includes the inductor 15, in addition to the components in the magnetoresistive effect device 1100 of the eleventh embodiment. In the output unit 21, one end of the inductor 15 is connected between the magnetoresistive effect elements 14a and 14b, which are connected in parallel to each other, and the output port 9b and the other end of the inductor 15 is connected to the DC current input terminal 11. In the example illustrated in FIG. 16, one end of the inductor 15 is connected to the output-side signal line 17 so as to be parallel to the output port 9b. The inductor that is the same as the inductor 10 described in the first embodiment may be used as the inductor 15. In the magnetoresistive effect device 1300, the DC current is applied from the DC current input terminal 11 to a closed circuit including the inductor 10, the DC current input terminal 11, the magnetic-field generating signal line 18a, the magnetoresistive effect elements 1a and 1b, and the ground 8, the DC current is applied from the DC current input terminal 11 to a closed circuit including the inductor 10, the DC current input terminal 11, the magnetic-field generating signal line 18b, the magnetoresistive effect elements 24a and 24b, and the ground 8, and the DC current is applied from the DC current input terminal 11 to a closed circuit including the inductor 10, the DC current input terminal 11, the inductor 15, the output-side signal line 17, the magnetoresistive effect elements 14a and 14b, and the ground 8. The remaining configurations of the magnetoresistive effect device 1300 are the same as those of the magnetoresistive effect device 1100 of the eleventh embodiment.

In the output unit 21 in the magnetoresistive effect device 1300, one end of the inductor 15 is connected between the magnetoresistive effect elements 14a and 14b and the output port 9b and the other end of the inductor 15 is connected to the DC current input terminal 11 (the DC application terminal). Accordingly, the inductor 15 suppresses flowing out of the high-frequency signal output from the magnetoresistive effect elements 1a and 1b to the magnetoresistive effect elements 14a and 14b side and the output port 9b side (the output-side signal line 17) in the output unit 21 in at least one MR unit (the first MR unit 20a), among the N-number (N=2) MR units, to enable the high-frequency signal to efficiently flow through the magnetic-field generating signal line 18a, thus efficiently generating the high-frequency magnetic field from the magnetic-field generating signal line 18a. Similarly, the inductor 15 suppresses flowing out of the high-frequency signal output from the magnetoresistive effect elements 24a and 24b to the magnetoresistive effect elements 14a and 14b side and the output port 9b side (the output-side signal line 17) in the output unit 21 in at least one MR unit (the second MR unit 20b), among the N-number (N=2) MR units, to enable the high-frequency signal to efficiently flow through the magnetic-field generating signal line 18b, thus efficiently generating the high-frequency magnetic field from the magnetic-field generating signal line 18b.

Fourteenth Embodiment

Figure 17:
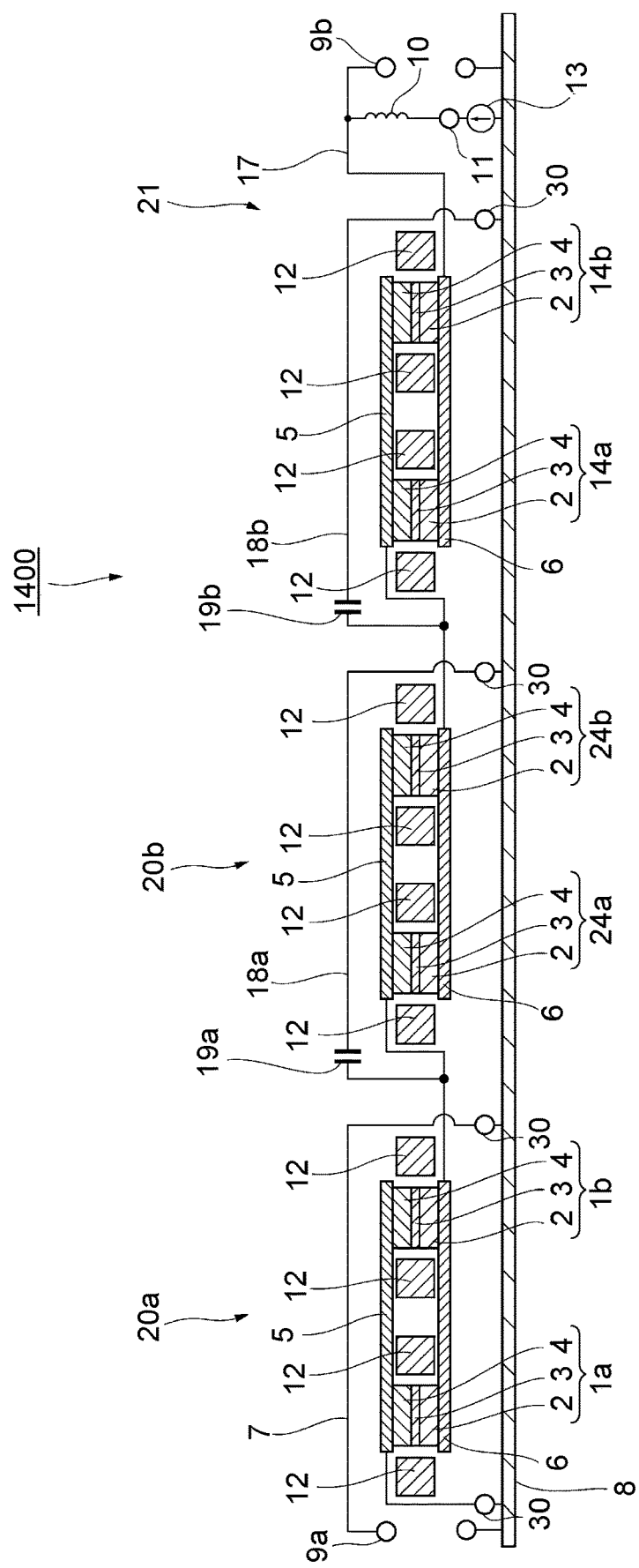
FIG. 17 is a schematic cross-sectional view illustrating the configuration of a magnetoresistive effect device according to a fourteenth embodiment.

FIG. 17 is a schematic cross-sectional view of a magnetoresistive effect device 1400 according to a fourteenth embodiment of the present invention. Points different from the magnetoresistive effect device 900 of the ninth embodiment in the magnetoresistive effect device 1400 will be mainly described and a description of common points will be appropriately omitted herein. The same reference numerals are used in the fourteenth embodiment to identify the components common to the magnetoresistive effect device 900 of the ninth embodiment and a description of the common components will be omitted herein. The magnetoresistive effect device 1400 further includes the capacitors 19a and 19b, in addition to the components in the magnetoresistive effect device 900 of the ninth embodiment. The capacitor 19a is connected in series to the magnetic-field generating signal line 18a and the capacitor 19b is connected in series to the magnetic-field generating signal line 18b. The magnetoresistive effect device 1400 includes the DC current input terminal 11, instead of the MR-unit-side DC current input terminals 11c and 11d and the output-unit-side DC current input terminal 11b in the magnetoresistive effect device 900 of the ninth embodiment. The magnetoresistive effect device 1400 is capable of applying the DC current to the magnetoresistive effect elements 1a and 1b in the first MR unit 20a, the magnetoresistive effect elements 24a and 24b in the second MR unit 20b, and the magnetoresistive effect elements 14a and 14b in the output unit 21. One end of the magnetoresistive effect elements 24a and 24b, which are connected in parallel to each other, in the second MR unit is connected between the capacitor 19a and the magnetoresistive effect elements 1a and 1b, which are connected in parallel to each other, in the first MR unit 20a. The other end of the magnetoresistive effect elements 24a and 24b, which are connected in parallel to each other, is connected to the magnetic-field generating signal line 18b. One end of the magnetoresistive effect elements 14a and 14b, which are connected in parallel to each other, in the output unit 21 is connected between the capacitor 19b and the magnetoresistive effect elements 24a and 24b, which are connected in parallel to each other, in the second MR unit 20b. The other end of the magnetoresistive effect elements 14a and 14b, which are connected in parallel to each other, is connected to the output port 9b. The magnetoresistive effect elements 1a and 1b, which are connected in parallel to each other, in the first MR unit 20a, the magnetoresistive effect elements 24a and 24b, which are connected in parallel to each other, in the second MR unit 20b, the magnetoresistive effect elements 14a and 14b, which are connected in parallel to each other, in the output unit 21, and the DC current input terminal 11 are connected in series to each other in the above manner.

In the example illustrated in FIG. 17, one end (the magnetization free layer 4 side) of the magnetoresistive effect elements 24a and 24b, which are connected in parallel to each other, is connected to the magnetic-field generating signal line 18a between the capacitor 19a and the magnetoresistive effect elements 1a and 1b, which are connected in parallel to each other, via the upper electrode 5. The other end (the magnetization fixed layer 2 side) of the magnetoresistive effect elements 24a and 24b, which are connected in parallel to each other, is connected to the magnetic-field generating signal line 18b via the lower electrode 6. One end (the magnetization free layer 4 side) of the magnetoresistive effect elements 14a and 14b, which are connected in parallel to each other, is connected to the magnetic-field generating signal line 18b between the capacitor 19b and the magnetoresistive effect elements 24a and 24b, which are connected in parallel to each other, via the upper electrode 5. The other end (the magnetization fixed layer 2 side) of the magnetoresistive effect elements 14a and 14b, which are connected in parallel to each other, is connected to the output port 9b via the lower electrode 6 and the output-side signal line 17. As illustrated in FIG. 17, in the first MR unit 20a, one end (the magnetization fixed layer 2 side) of the magnetoresistive effect elements 1a and 1b is connected to the magnetic-field generating signal line 18a via the lower electrode 6 and the other end (the magnetization free layer 4 side) of the magnetoresistive effect elements 1a and 1b is capable of being connected to the ground 8 via the upper electrode 5 and the reference voltage terminal 30. One end of the inductor 10 is connected to the output-side signal line 17 and the other end of the inductor 10 is connected to the DC current input terminal 11. The direct-current source 13 is connected to the DC current input terminal 11 and the ground 8. In the magnetoresistive effect device 1400, the DC current is applied from the DC current input terminal 11 to a closed circuit including the DC current input terminal 11, the inductor 10, the output-side signal line 17, the magnetoresistive effect elements 14a and 14b, the magnetic-field generating signal line 18b, the magnetoresistive effect elements 24a and 24b, the magnetic-field generating signal line 18a, the magnetoresistive effect elements 1a and 1b, and the ground 8. The high-frequency current output from the magnetoresistive effect elements 1a and 1b flows through the magnetic-field generating signal line 18a via the capacitor 19a. The high-frequency current output from the magnetoresistive effect elements 24a and 24b flows through the magnetic-field generating signal line 18b via the capacitor 19b. The remaining configurations of the magnetoresistive effect device 1400 are the same as those of the magnetoresistive effect device 900 of the ninth embodiment.

In the magnetoresistive effect device 1400, in one MR unit (the second MR unit 20b), among the N-number (N=2) MR units, the capacitor 19a is connected in series to the magnetic-field generating signal line 18a, one end of the magnetoresistive effect elements 14a and 14b in the output unit 21 is connected between the capacitor 19b and the magnetoresistive effect elements 24a and 24b, the other end of the magnetoresistive effect elements 14a and 14b in the output unit 21 is connected to the output port 9b, and the magnetoresistive effect elements 24a and 24b in the second MR unit 20b, the magnetoresistive effect elements 14a and 14b in the output unit 21, and the DC current input terminal (the DC application terminal) are connected in series to each other. Accordingly, in the second MR unit 20b, the capacitor 19b prevents the DC current supplied from the DC current input terminal 11 (the DC application terminal) from flowing into the magnetic-field generating signal line 18b. Consequently, it is possible to apply the DC current or the DC voltage supplied from the DC current input terminal 11 (the DC application terminal) not only to the magnetoresistive effect elements 14a and 14b in the output unit 21 but also to the magnetoresistive effect elements 24a and 24b in the second MR unit 20b. In addition, since the second MR unit 20b and the output unit 21 are capable of sharing the DC current input terminal 11 (the DC application terminal), it is possible to decrease the number of the direct-current power supplies connected to the DC current input terminal 11 (the DC application terminal).

In addition, in the magnetoresistive effect device 1400, in the two MR units (the first MR unit 20a and the second MR unit 20b), among the N-number (N=2) MR units, the capacitor 19a is connected in series to the magnetic-field generating signal line 18a, the capacitor 19b is connected in series to the magnetic-field generating signal line 18b, one end of the magnetoresistive effect elements 24a and 24b in the other MR unit (the second MR unit 20b) in the two MR units is connected between the capacitor 19a and the magnetoresistive effect elements 1a and 1b in one MR unit (the first MR unit 20a), the other end of the magnetoresistive effect elements 24a and 24b is connected to the magnetic-field generating signal line 18b in the other MR unit (the second MR unit 20b), and the magnetoresistive effect elements 1a and 1b, the magnetoresistive effect elements 24a and 24b, and the DC current input terminal 11 (the DC application terminal) are connected in series to each other. Accordingly, the capacitor 19a prevents the DC current supplied from the DC current input terminal 11 (the DC application terminal) from flowing into the magnetic-field generating signal line 18a in the first MR unit 20a and the capacitor 19b prevents the DC current supplied from the DC current input terminal 11 (the DC application terminal) from flowing into the magnetic-field generating signal line 18b in the second MR unit 20b. Consequently, it is possible to apply the DC current or the DC voltage supplied from the DC current input terminal 11 (the DC application terminal) to the magnetoresistive effect elements 1a and 1b and the magnetoresistive effect elements 24a and 24b, which are connected in series to each other. In addition, since the two MR units (the first MR unit 20a and the second MR unit 20b) are capable of sharing the DC current input terminal (the DC application terminal), it is possible to decrease the number of the direct-current power supplies connected to the DC current input terminal (the DC application terminal).

Fifteenth Embodiment

Figure 18:
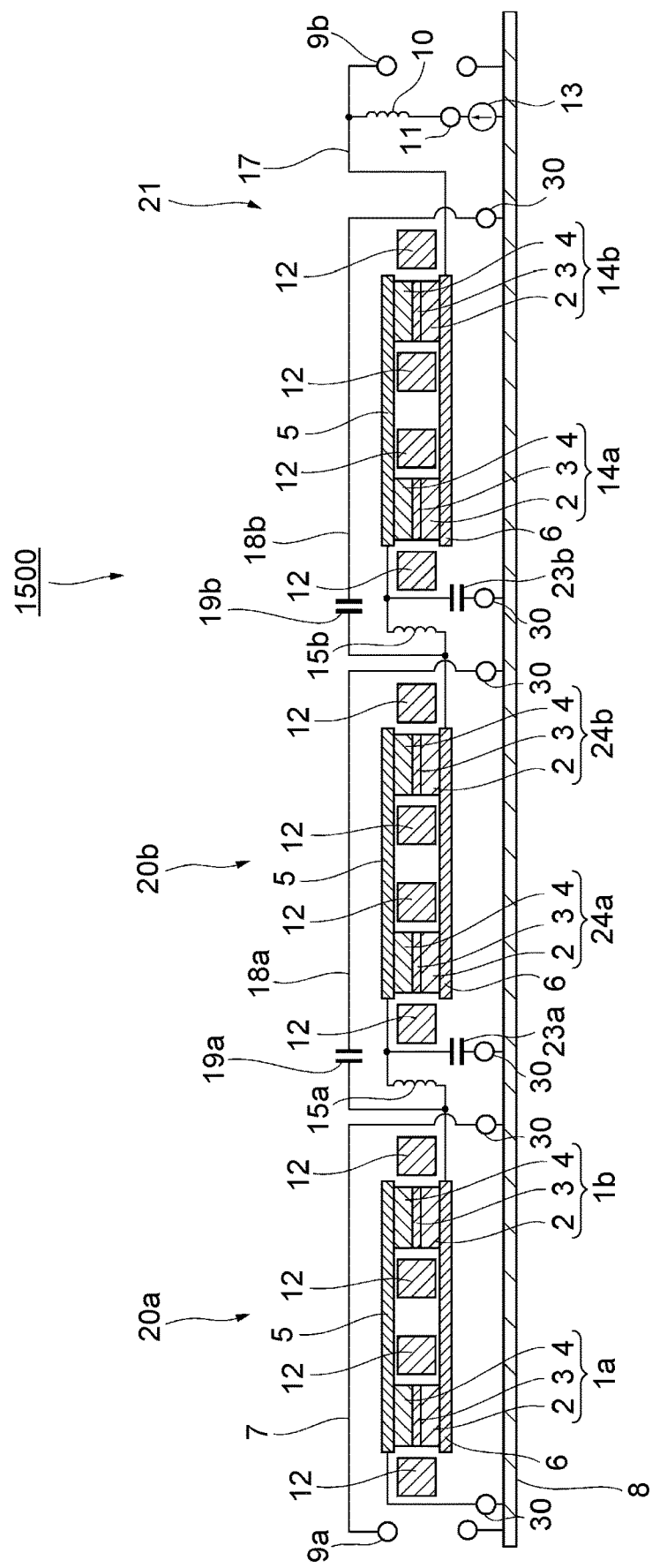
FIG. 18 is a schematic cross-sectional view illustrating the configuration of a magnetoresistive effect device according to a fifteenth embodiment.

FIG. 18 is a schematic cross-sectional view of a magnetoresistive effect device 1500 according to a fifteenth embodiment of the present invention. Points different from the magnetoresistive effect device 1400 of the fourteenth embodiment in the magnetoresistive effect device 1500 will be mainly described and a description of common points will be appropriately omitted herein. The same reference numerals are used in the fifteenth embodiment to identify the components common to the magnetoresistive effect device 1400 of the fourteenth embodiment and a description of the common components will be omitted herein. The magnetoresistive effect device 1500 further includes shunt capacitors 23a and 23b and the inductors 15a and 15b, in addition to the components in the magnetoresistive effect device 1400 of the fourteenth embodiment. One end of the magnetoresistive effect elements 24a and 24b, which are connected in parallel to each other, in the second MR unit 20b is connected to the shunt capacitor 23a, the other end of the magnetoresistive effect elements 24a and 24b, which are connected in parallel to each other, is connected to the magnetic-field generating signal line 18b, one end of the inductor 15a is connected between the magnetoresistive effect elements 1a and 1b, which are connected in parallel to each other, in the first MR unit 20a, and the capacitor 19a, and the other end of the inductor 15a is connected between the magnetoresistive effect elements 24a and 24b, which are connected in parallel to each other, in the second MR unit 20b and the shunt capacitor 23a. One end of the magnetoresistive effect elements 14a and 14b, which are connected in parallel to each other, in the output unit 21 is connected to the shunt capacitor 23b, the other end of the magnetoresistive effect elements 14a and 14b, which are connected in parallel to each other, is connected to the output port 9b, one end of the inductor 15b is connected between the magnetoresistive effect elements 24a and 24b, which are connected in parallel to each other, in the second MR unit 20b and the capacitor 19b, and the other end of the inductor 15b is connected between the magnetoresistive effect elements 14a and 14b, which are connected in parallel to each other, in the output unit 21 and the shunt capacitor 23b.

In the example illustrated in FIG. 18, one end (the magnetization free layer 4 side) of the magnetoresistive effect elements 24a and 24b, which are connected in parallel to each other, is connected to one end of the shunt capacitor 23a via the upper electrode 5, the other end of the shunt capacitor 23a is capable of being connected to the ground 8 via the reference voltage terminal 30, and the other end (the magnetization fixed layer 2 side) of the magnetoresistive effect elements 24a and 24b, which are connected in parallel to each other, is connected to the magnetic-field generating signal line 18b via the lower electrode 6. One end (the magnetization free layer 4 side) of the magnetoresistive effect elements 14a and 14b, which are connected in parallel to each other, is connected to one end of the shunt capacitor 23b via the upper electrode 5, the other end of the shunt capacitor 23b is capable of being connected to the ground 8 via the reference voltage terminal 30, and the other end (the magnetization fixed layer 2 side) of the magnetoresistive effect elements 14a and 14b, which are connected in parallel to each other, is connected to the output port 9b via the lower electrode 6 and the output-side signal line 17. One end of the inductor 15a is connected to the magnetic-field generating signal line 18a between the magnetoresistive effect elements 1a and 1b, which are connected in parallel to each other, and the capacitor 19a and one end of the inductor 15b is connected to the magnetic-field generating signal line 18b between the magnetoresistive effect elements 24a and 24b, which are connected in parallel to each other, and the capacitor 19b. The inductor that is the same as the inductor 10 described in the first embodiment may be used as the inductors 15a and 15b. In the magnetoresistive effect device 1500, the DC current is applied from the DC current input terminal 11 to a closed circuit including the DC current input terminal 11, the inductor 10, the output-side signal line 17, the magnetoresistive effect elements 14a and 14b, the inductor 15b, the magnetic-field generating signal line 18b, the magnetoresistive effect elements 24a and 24b, the inductor 15a, the magnetic-field generating signal line 18a, the magnetoresistive effect elements 1a and 1b, and the ground 8. The remaining configurations of the magnetoresistive effect device 1500 are the same as those of the magnetoresistive effect device 1400 of the fourteenth embodiment.

In the magnetoresistive effect device 1500, one end of the magnetoresistive effect elements 14a and 14b in the output unit 21 is connected to the shunt capacitor 23b, the other end of the magnetoresistive effect elements 14a and 14b in the output unit 21 is connected to the output port 9b, one end of the inductor 15b is connected between the magnetoresistive effect elements 24a and 24b in one MR unit (the second MR unit 20b) and the capacitor 19b, and the other end of the inductor 15b is connected between the magnetoresistive effect elements 14a and 14b in the output unit 21 and the shunt capacitor 23b. Accordingly, the inductor 15b suppresses flowing out of the high-frequency signal output from the magnetoresistive effect elements 24a and 24b in the second MR unit 20b to the DC current input terminal 11 (the DC application terminal) side to enable the high-frequency signal to efficiently flow through the magnetic-field generating signal line 18b. In addition, the shunt capacitor 23b enables a closed circuit of the high-frequency signal to be formed in the output unit 21 while the DC current or the DC voltage supplied from the DC current input terminal 11 (the DC application terminal) is being applied to the magnetoresistive effect elements 24a and 24b in the second MR unit 20b.

In addition, in the magnetoresistive effect device 1500, one end of the magnetoresistive effect elements 24a and 24b in the second MR unit 20b (the other MR unit) is connected to the shunt capacitor 23a, the other end of the magnetoresistive effect elements 24a and 24b is connected to the magnetic-field generating signal line 18b in the second MR unit 20b, one end of the inductor 15a is connected between the magnetoresistive effect elements 1a and 1b in the first MR unit 20a (one MR unit) and the capacitor 19a, and the other end of the inductor 15a is connected between the magnetoresistive effect elements 24a and 24b in the second MR unit 20b and the shunt capacitor 23a. Accordingly, the inductor 15a suppresses flowing out of the high-frequency signal output from the magnetoresistive effect elements 1a and 1b in the first MR unit 20a to the DC current input terminal 11 (the DC application terminal) side to enable the high-frequency signal to efficiently flow through the magnetic-field generating signal line 18a. In addition, the shunt capacitor 23a enables a closed circuit of the high-frequency signal to be formed in the second MR unit 20b while the DC current or the DC voltage supplied from the DC current input terminal 11 (the DC application terminal) is being applied to the magnetoresistive effect elements 1a and 1b in the first MR unit 20a.

Sixteenth Embodiment

Figure 19:
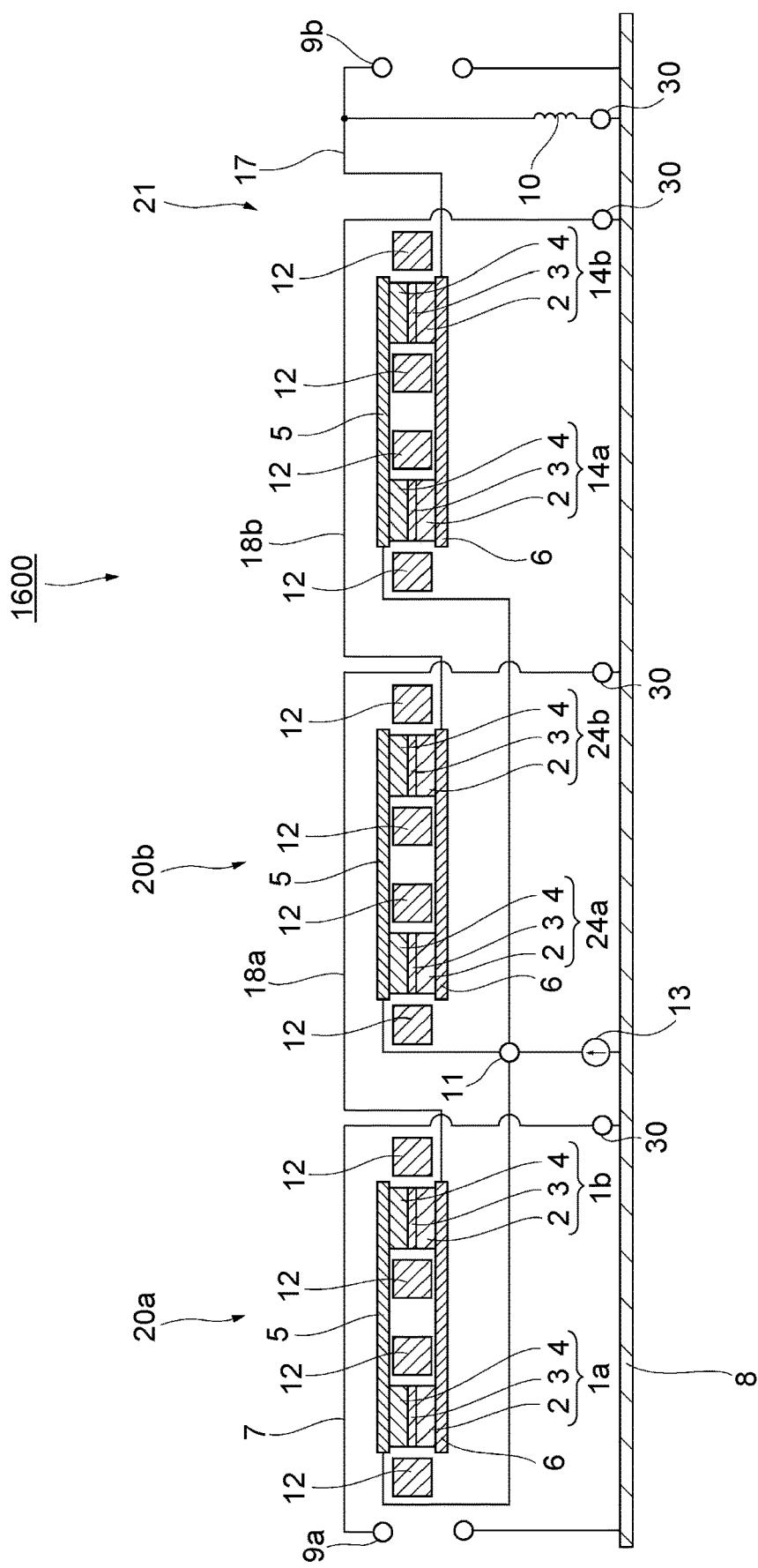
FIG. 19 is a schematic cross-sectional view illustrating the configuration of a magnetoresistive effect device according to a sixteenth embodiment.

FIG. 19 is a schematic cross-sectional view of a magnetoresistive effect device 1600 according to a sixteenth embodiment of the present invention. Points different from the magnetoresistive effect device 900 of the ninth embodiment in the magnetoresistive effect device 1600 will be mainly described and a description of common points will be appropriately omitted herein. The same reference numerals are used in the sixteenth embodiment to identify the components common to the magnetoresistive effect device 900 of the ninth embodiment and a description of the common components will be omitted herein. The magnetoresistive effect device 1600 includes the DC current input terminal 11, instead of the MR-unit-side DC current input terminals 11c and 11d and the output-unit-side DC current input terminal 11b in the magnetoresistive effect device 900 of the ninth embodiment. The magnetoresistive effect device 1600 is capable of applying the DC current to the magnetoresistive effect elements 1a and 1b in the first MR unit 20a, the magnetoresistive effect elements 24a and 24b in the second MR unit 20b, and the magnetoresistive effect elements 14a and 14b in the output unit 21. In the magnetoresistive effect device 1600, one end of the magnetoresistive effect elements 1a and 1b, which are connected in parallel to each other, in the first MR unit 20a is connected to the magnetic-field generating signal line 18a, one end of the magnetoresistive effect elements 24a and 24b, which are connected in parallel to each other, in the second MR unit 20b is connected to the magnetic-field generating signal line 18b, one end of the magnetoresistive effect elements 14a and 14b, which are connected in parallel to each other, in the output unit 21 is connected to the output port 9b, and the DC current input terminal 11 is connected to the other end of the magnetoresistive effect elements 1a and 1b, which are connected in parallel to each other, in the first MR unit 20a, the other end of the magnetoresistive effect elements 24a and 24b, which are connected in parallel to each other, in the second MR unit 20b, and the other end of the magnetoresistive effect elements 14a and 14b in the output unit 21.

In the example illustrated in FIG. 19, one end (the magnetization fixed layer 2 side) of the magnetoresistive effect elements 1a and 1b, which are connected in parallel to each other, is connected to the magnetic-field generating signal line 18a via the lower electrode 6 and the other end (the magnetization free layer 4 side) of the magnetoresistive effect elements 1a and 1b, which are connected in parallel to each other, is connected to the DC current input terminal 11 via the upper electrode 5. In addition, one end (the magnetization fixed layer 2 side) of the magnetoresistive effect elements 24a and 24b, which are connected in parallel to each other, is connected to the magnetic-field generating signal line 18b via the lower electrode 6 and the other end (the magnetization free layer 4 side) of the magnetoresistive effect elements 24a and 24b, which are connected in parallel to each other, is connected to the DC current input terminal 11 via the upper electrode 5. Furthermore, one end (the magnetization fixed layer 2 side) of the magnetoresistive effect elements 14a and 14b, which are connected in parallel to each other, is connected to the output port 9b via the lower electrode 6 and the output-side signal line 17 and the other end (the magnetization free layer 4 side) of the magnetoresistive effect elements 14a and 14b, which are connected in parallel to each other, is connected to the DC current input terminal 11 via the upper electrode 5. In the magnetoresistive effect device 1600, the DC current is applied from the DC current input terminal 11 to a closed circuit including the DC current input terminal 11, the magnetoresistive effect elements 1a and 1b, the magnetic-field generating signal line 18a, and the ground 8, the DC current is applied from the DC current input terminal 11 to a closed circuit including the DC current input terminal 11, the magnetoresistive effect elements 24a and 24b, the magnetic-field generating signal line 18b, and the ground 8, and the DC current is applied from the DC current input terminal 11 to a closed circuit including the DC current input terminal 11, the magnetoresistive effect elements 14a and 14b, the inductor 10, and the ground 8. The remaining configurations of the magnetoresistive effect device 1600 are the same as those of the magnetoresistive effect device 900 of the ninth embodiment.

In the magnetoresistive effect device 1600, one end of the magnetoresistive effect elements 1a and 1b in at least one MR unit (the first MR unit 20a), among the N-number (N=2) MR units, is connected to the magnetic-field generating signal line 18a, one end of the magnetoresistive effect elements 14a and 14b in the output unit 21 is connected to the output port 9b, and the DC current input terminal 11 (the DC application terminal) is connected to both the other end of the magnetoresistive effect elements 1a and 1b in the first MR unit 20a and the other end of the magnetoresistive effect elements 14a and 14b in the output unit 21. Accordingly, since the first MR unit 20a and the output unit 21 are capable of sharing the DC current input terminal 11 (the DC application terminal), it is possible to decrease the number of the direct-current power supplies connected to the DC current input terminal 11 (the DC application terminal). Similarly, in the magnetoresistive effect device 1600, one end of the magnetoresistive effect elements 24a and 24b in at least one MR unit (the second MR unit 20b), among the N-number (N=2) MR units, is connected to the magnetic-field generating signal line 18b, one end of the magnetoresistive effect elements 14a and 14b in the output unit 21 is connected to the output port 9b, and the DC current input terminal 11 (the DC application terminal) is connected to both the other end of the magnetoresistive effect elements 24a and 24b in the second MR unit 20b and the other end of the magnetoresistive effect elements 14a and 14b in the output unit 21. Accordingly, since the second MR unit 20b and the output unit 21 are capable of sharing the DC current input terminal 11 (the DC application terminal), it is possible to decrease the number of the direct-current power supplies connected to the DC current input terminal 11 (the DC application terminal).

In addition, in the magnetoresistive effect device 1600, in the at least two MR units (the first MR unit 20a and the second MR unit 20b, among the N-number (N=2) MR units, one end of the magnetoresistive effect elements 1a and 1b in the first MR unit 20a is connected to the magnetic-field generating signal line 18a, one end of the magnetoresistive effect elements 24a and 24b in the second MR unit 20b is connected to the magnetic-field generating signal line 18b, and the DC current input terminal 11 (the DC application terminal) is connected to the other end of the magnetoresistive effect elements 1a and 1b in the first MR unit 20a and the other end of the magnetoresistive effect elements 24a and 24b in the second MR unit 20b. Accordingly, since the first MR unit 20a and the second MR unit 20b are capable of sharing the DC current input terminal 11 (the DC application terminal), it is possible to decrease the number of the direct-current power supplies connected to the DC current input terminal 11 (the DC application terminal).

Although the preferred embodiments of the present invention are described above, modifications may be made to the embodiments described above. For example, although the example is described in the magnetoresistive effect device 100 of the first embodiment in which the MR-unit-side DC current input terminal 11a is connected between the upper electrode 5 connected to the magnetoresistive effect elements 1a and 1b and the ground 8, the MR-unit-side DC current input terminal 11a may be connected between the lower electrode 6 connected to the magnetoresistive effect elements 1a and 1b and the ground 8. For example, the magnetoresistive effect device 100 may be configured so that the MR-unit-side DC current input terminal 11a is connected in series to the magnetic-field generating signal line 18, the MR-unit-side direct-current source 13a is connected to the MR-unit-side DC current input terminal 11a and the ground 8, and the upper electrode 5 connected to the magnetoresistive effect elements 1a and 1b is capable of being connected to the ground 8. Similarly, the magnetoresistive effect device 100 may be configured so that the output-unit-side DC current input terminal 11b is connected between the lower electrode 6 connected to the magnetoresistive effect elements 14a and 14b and the ground 8 and the upper electrode 5 connected to the magnetoresistive effect elements 14a and 14b is capable of being connected to the ground 8.

Although the example is described in the magnetoresistive effect device 200 of the second embodiment in which the MR-unit-side DC current input terminal 11a is connected between the upper electrode 5 connected to the magnetoresistive effect elements 1a and 1b and the ground 8, the MR-unit-side DC current input terminal 11a may be connected between the lower electrode 6 connected to the magnetoresistive effect elements 1a and 1b and the ground 8. For example, the magnetoresistive effect device 200 may be configured so that the MR-unit-side DC current input terminal 11a is connected between the inductor 15 and the ground 8, the MR-unit-side direct-current source 13a is connected to the MR-unit-side DC current input terminal 11a and the ground 8, and the upper electrode 5 connected to the magnetoresistive effect elements 1a and 1b is capable of being connected to the ground 8. Similarly, the magnetoresistive effect device 200 may be configured so that the output-unit-side DC current input terminal 11b is connected between the lower electrode 6 connected to the magnetoresistive effect elements 14a and 14b and the ground 8 and the upper electrode 5 connected to the magnetoresistive effect elements 14a and 14b is capable of being connected to the ground 8.

Although the example is described in the magnetoresistive effect devices 600 and 700 of the sixth and the seventh embodiments in which the DC current input terminal 11 is connected between the inductor 10 and the ground 8, the DC current input terminal 11 may be connected between the magnetoresistive effect elements 1a and 1b, which are connected in parallel to each other, and the ground 8, between the magnetoresistive effect elements 1a and 1b, which are connected in parallel to each other, and the magnetoresistive effect elements 14a and 14b, which are connected in parallel to each other, or between the magnetoresistive effect elements 14a and 14b, which are connected in parallel to each other, and the inductor 10 as long as the magnetoresistive effect elements 1a and 1b, which are connected in parallel to each other, the magnetoresistive effect elements 14a and 14b, which are connected in parallel to each other, and the DC current input terminal 11 are connected in series to each other. In the above cases, the other end of the inductor 10 is configured so as to be capable of being connected to the ground 8.

Figure 20:
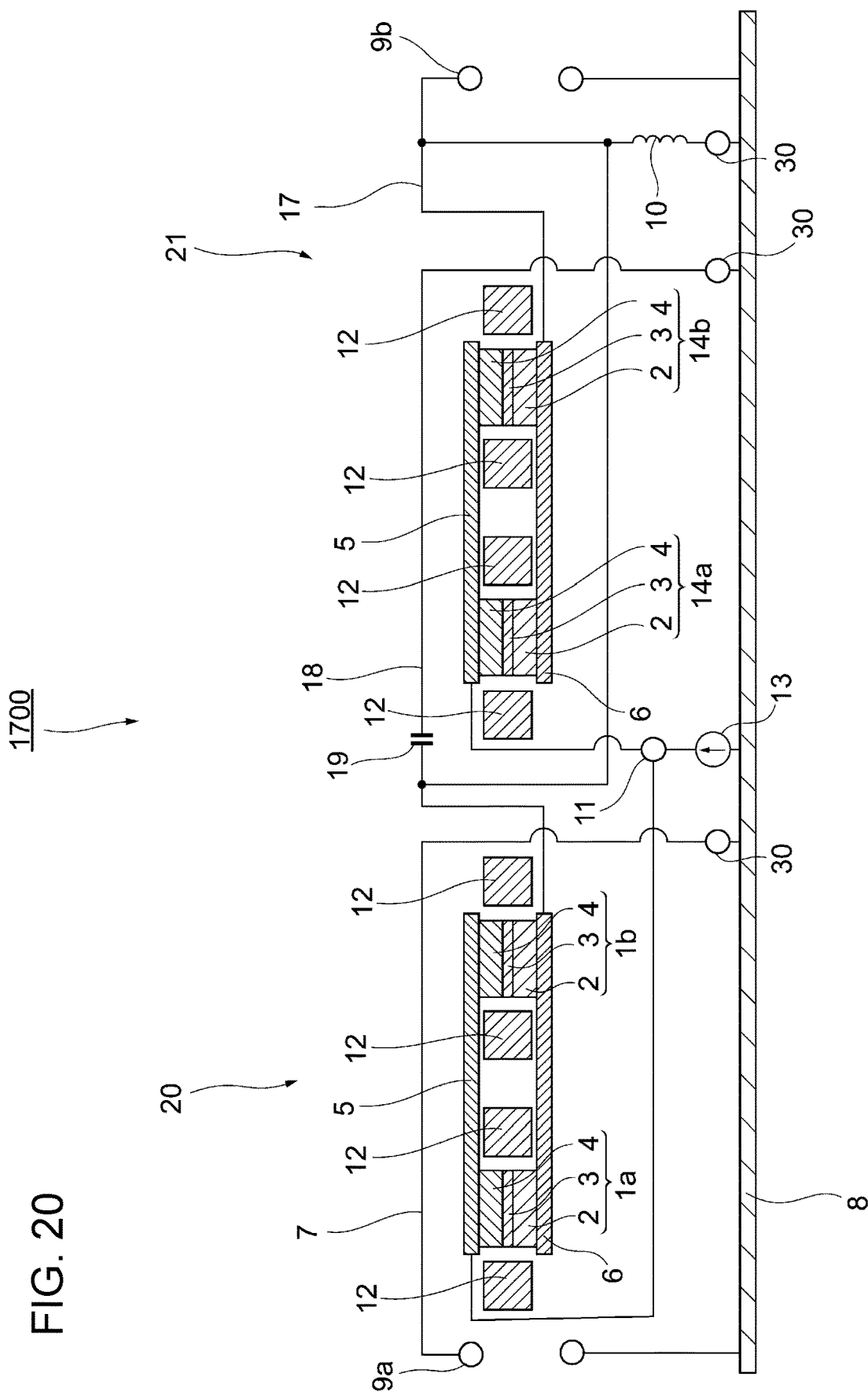
FIG. 20 is a schematic cross-sectional view illustrating the configuration of a magnetoresistive effect device according to a modification of the eighth embodiment.
Figure 21:
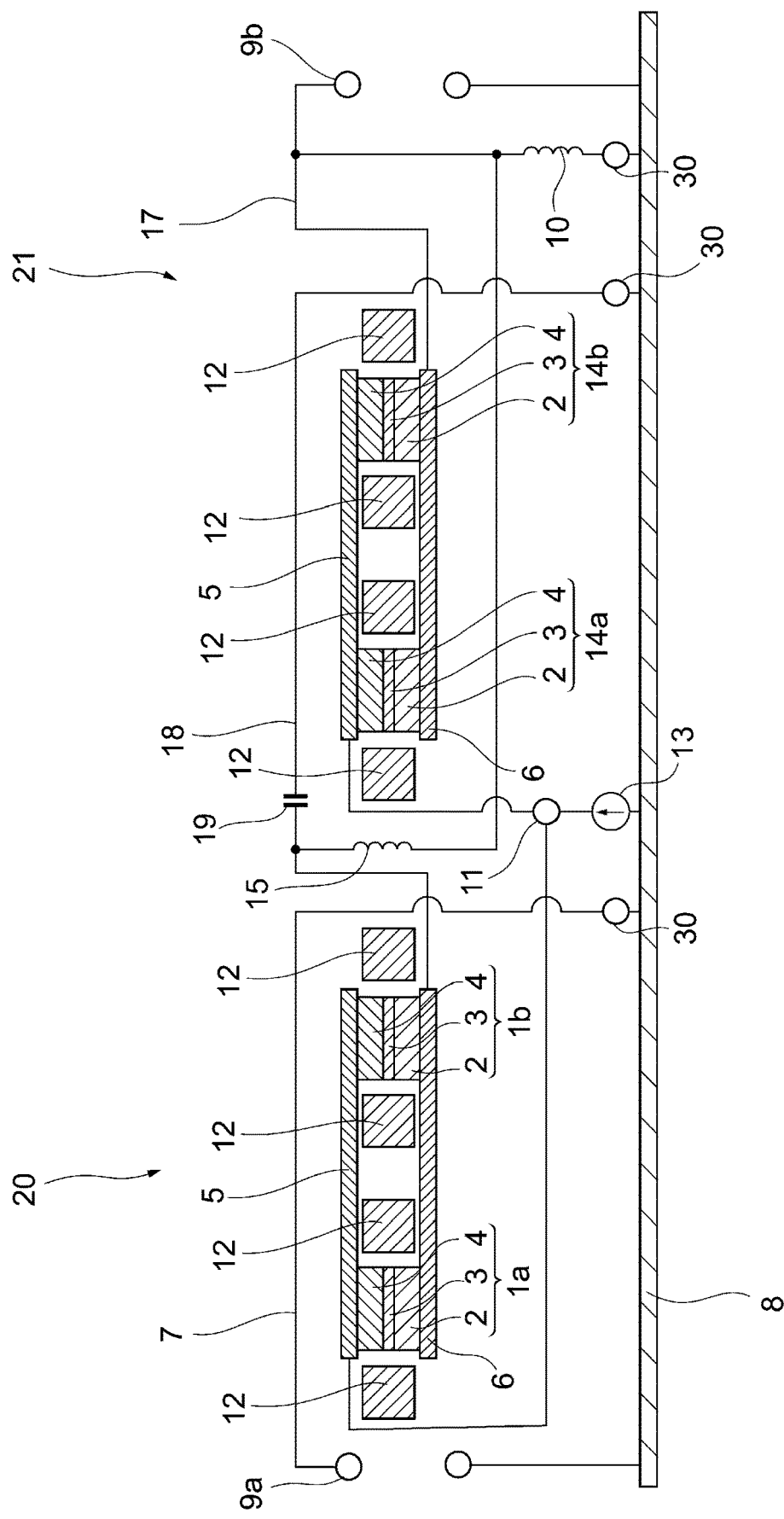
FIG. 21 is a schematic cross-sectional view illustrating the configuration of a magnetoresistive effect device according to a modification of the eighth embodiment.
Figure 22:
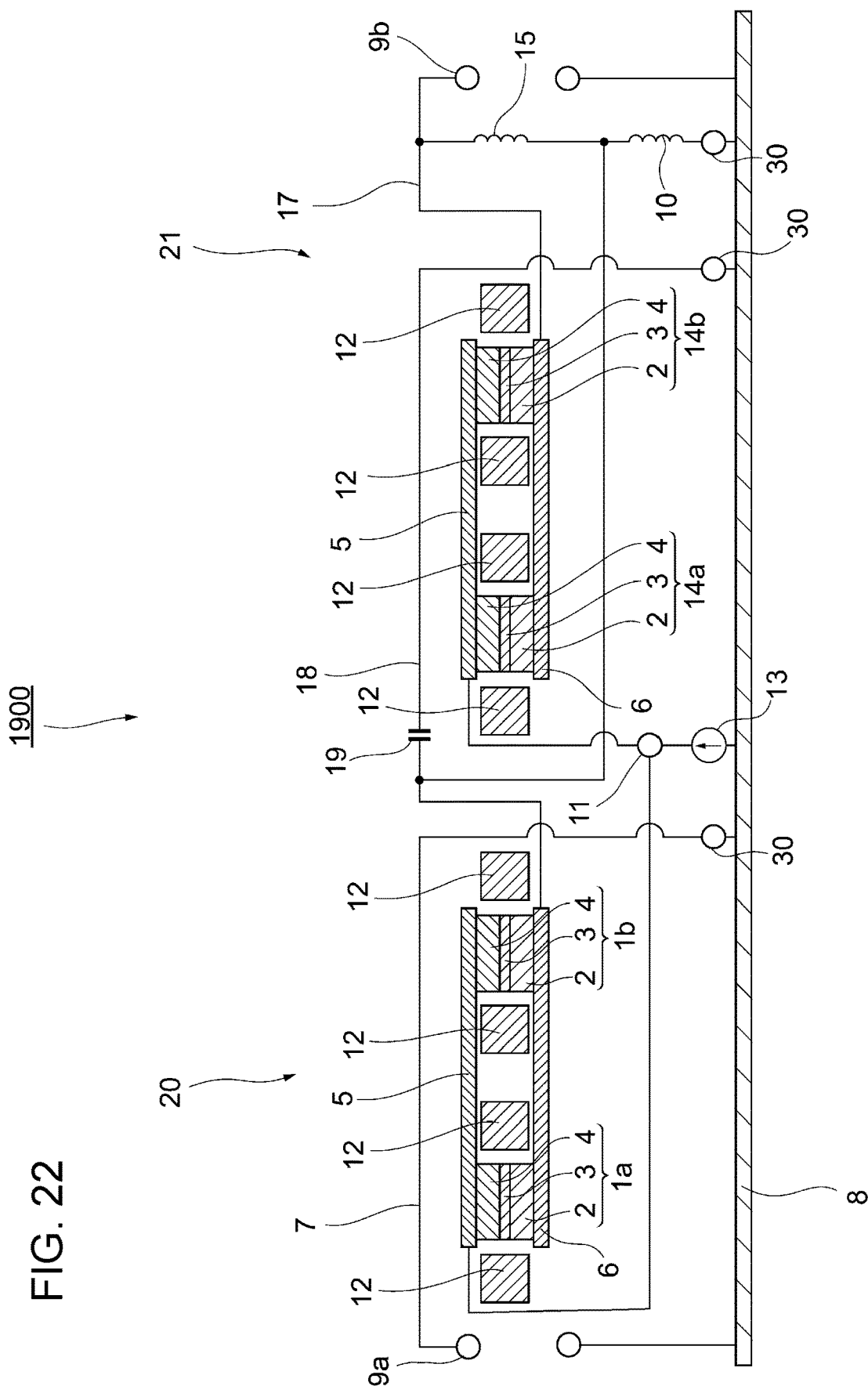
FIG. 22 is a schematic cross-sectional view illustrating the configuration of a magnetoresistive effect device according to a modification of the eighth embodiment.

In the magnetoresistive effect device 800 of the eighth embodiment, the capacitor 19 may be connected in series to the magnetic-field generating signal line 18 and the ground (the inductor 10) may be connected between the capacitor 19 and the magnetoresistive effect elements 1a and 1b, as in a magnetoresistive effect device 1700 illustrated in FIG. 20. With this configuration, the capacitor 19 prevents the DC current supplied from the DC current input terminal 11 from flowing into the magnetic-field generating signal line 18. In addition, in the magnetoresistive effect device 1700, one end of the inductor 15 may be connected between the capacitor 19 and the magnetoresistive effect elements 1a and 1b and the other end of the inductor 15 may be connected to the ground 8 (the inductor 10), as in a magnetoresistive effect device 1800 illustrated in FIG. 21. With this configuration, the inductor 15 enables the high-frequency signal output from the magnetoresistive effect elements 1a and 1b to efficiently flow through the magnetic-field generating signal line 18 to efficiently generate the high-frequency magnetic field from the magnetic-field generating signal line 18. In the magnetoresistive effect device 1700, one end of the inductor 15 may be connected between the magnetoresistive effect elements 14a and 14b and the output port 9b and the other end of the inductor 15 may be connected between the capacitor 19 and the magnetoresistive effect elements 1a and 1b, as in a magnetoresistive effect device 1900 illustrated in FIG. 22. With this configuration, the inductor 15 suppresses flowing out of the high-frequency signal output from the magnetoresistive effect elements 1a and 1b to the magnetoresistive effect elements 14a and 14b side and to the output port 9b side to enable the high-frequency signal to efficiently flow through the magnetic-field generating signal line 18, thus efficiently generating the high-frequency magnetic field from the magnetic-field generating signal line 18.

Although the example is described in the magnetoresistive effect device 900 of the ninth embodiment in which the MR-unit-side DC current input terminal 11c(11d) is connected between the upper electrode 5 connected to the magnetoresistive effect elements 1a and 1b (the magnetoresistive effect elements 24a and 24b) and the ground 8, the MR-unit-side DC current input terminal 11c(11d) may be connected between the lower electrode 6 connected to the magnetoresistive effect elements 1a and 1b (the magnetoresistive effect elements 24a and 24b) and the ground 8. For example, the magnetoresistive effect device 900 may be configured so that the MR-unit-side DC current input terminal 11c(11d) is connected in series to the magnetic-field generating signal line 18a (18b), the MR-unit-side direct-current source 13c (13d) is connected to the MR-unit-side DC current input terminal 11c(11d) and the ground 8, and the upper electrode 5 connected to the magnetoresistive effect elements 1a and 1b (the magnetoresistive effect elements 24a and 24b) is capable of being connected to the ground 8. Similarly, the magnetoresistive effect device 900 may be configured so that the output-unit-side DC current input terminal 11b is connected between the lower electrode 6 connected to the magnetoresistive effect elements 14a and 14b and the ground 8 and the upper electrode 5 connected to the magnetoresistive effect elements 14a and 14b is capable of being connected to the ground 8.

Although the example is described in the magnetoresistive effect device 1000 of the tenth embodiment in which the MR-unit-side DC current input terminal 11c(11d) is connected between the upper electrode 5 connected to the magnetoresistive effect elements 1a and 1b (the magnetoresistive effect elements 24a and 24b) and the ground 8, the MR-unit-side DC current input terminal 11c(11d) may be connected between the lower electrode 6 connected to the magnetoresistive effect elements 1a and 1b (the magnetoresistive effect elements 24a and 24b) and the ground 8. For example, the magnetoresistive effect device 1000 may be configured so that the MR-unit-side DC current input terminal 11c(11d) is connected between the inductor 15a (15b) and the ground 8, the MR-unit-side direct-current source 13c (13d) is connected to the MR-unit-side DC current input terminal 11c(11d) and the ground 8, and the upper electrode 5 connected to the magnetoresistive effect elements 1a and 1b (the magnetoresistive effect elements 24a and 24b) is capable of being connected to the ground 8. Similarly, the magnetoresistive effect device 1000 may be configured so that the output-unit-side DC current input terminal 11b is connected between the lower electrode 6 connected to the magnetoresistive effect elements 14a and 14b and the ground 8 and the upper electrode 5 connected to the magnetoresistive effect elements 14a and 14b is capable of being connected to the ground 8.

Although the example is described in the magnetoresistive effect devices 1400 and 1500 of the fourteenth and fifteenth embodiments in which the DC current input terminal 11 is connected between the inductor 10 and the ground 8, the DC current input terminal 11 may be connected between the magnetoresistive effect elements 1a and 1b, which are connected in parallel to each other, and the ground 8, between the magnetoresistive effect elements 1a and 1b, which are connected in parallel to each other, and the magnetoresistive effect elements 24a and 24b, which are connected in parallel to each other, between the magnetoresistive effect elements 24a and 24b, which are connected in parallel to each other, and the magnetoresistive effect elements 14a and 14b, which are connected in parallel to each other, or between the magnetoresistive effect elements 14a and 14b, which are connected in parallel to each other, and the inductor 10 as long as the magnetoresistive effect elements 1a and 1b, which are connected in parallel to each other, the magnetoresistive effect elements 24a and 24b, which are connected in parallel to each other, the magnetoresistive effect elements 14a and 14b, which are connected in parallel to each other, and the DC current input terminal 11 are connected in series to each other. In the above cases, the other end of the inductor 10 is configured so as to be capable of being connected to the ground 8.

Figure 23:
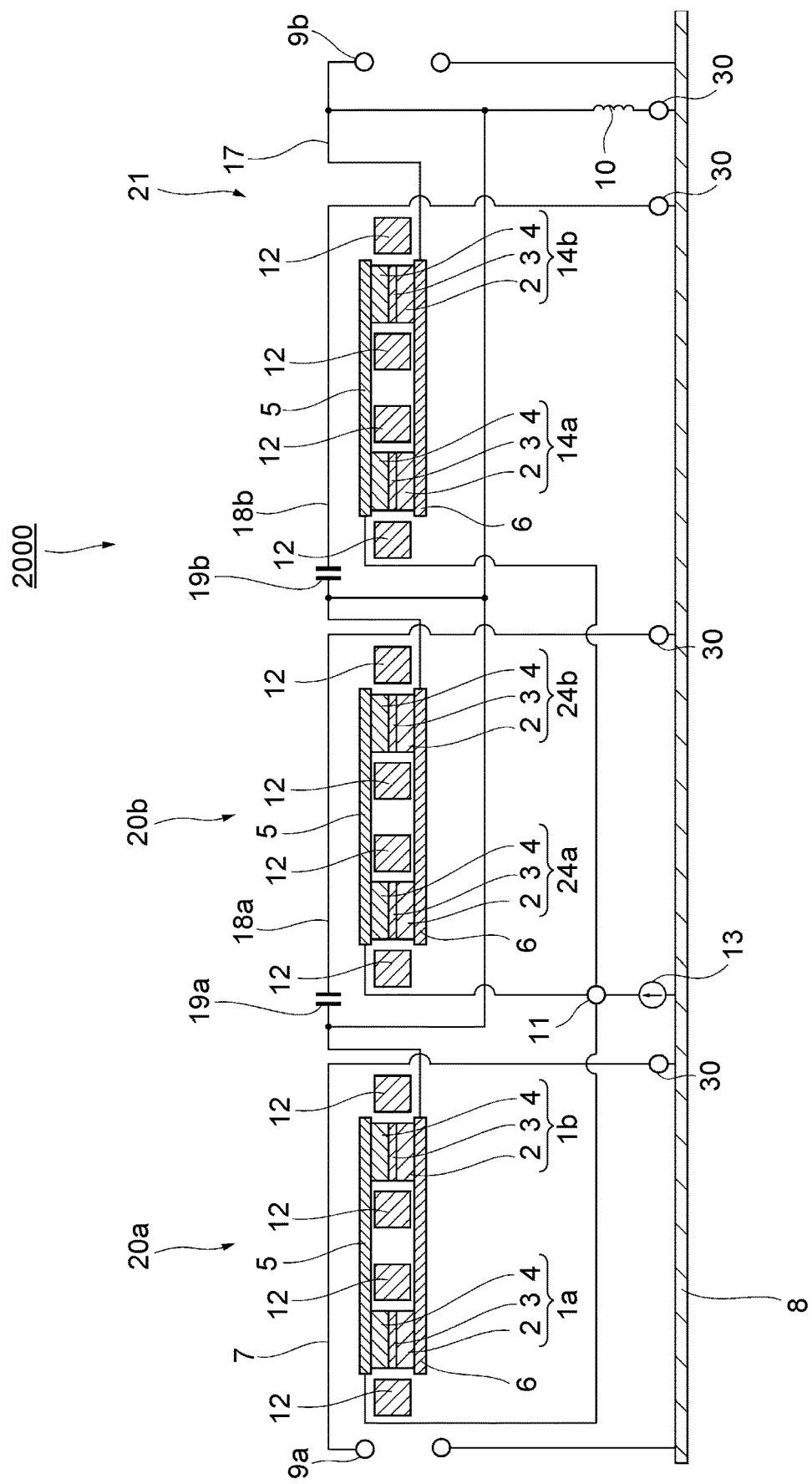
FIG. 23 is a schematic cross-sectional view illustrating the configuration of a magnetoresistive effect device according to a modification of the sixteenth embodiment.
Figure 24:
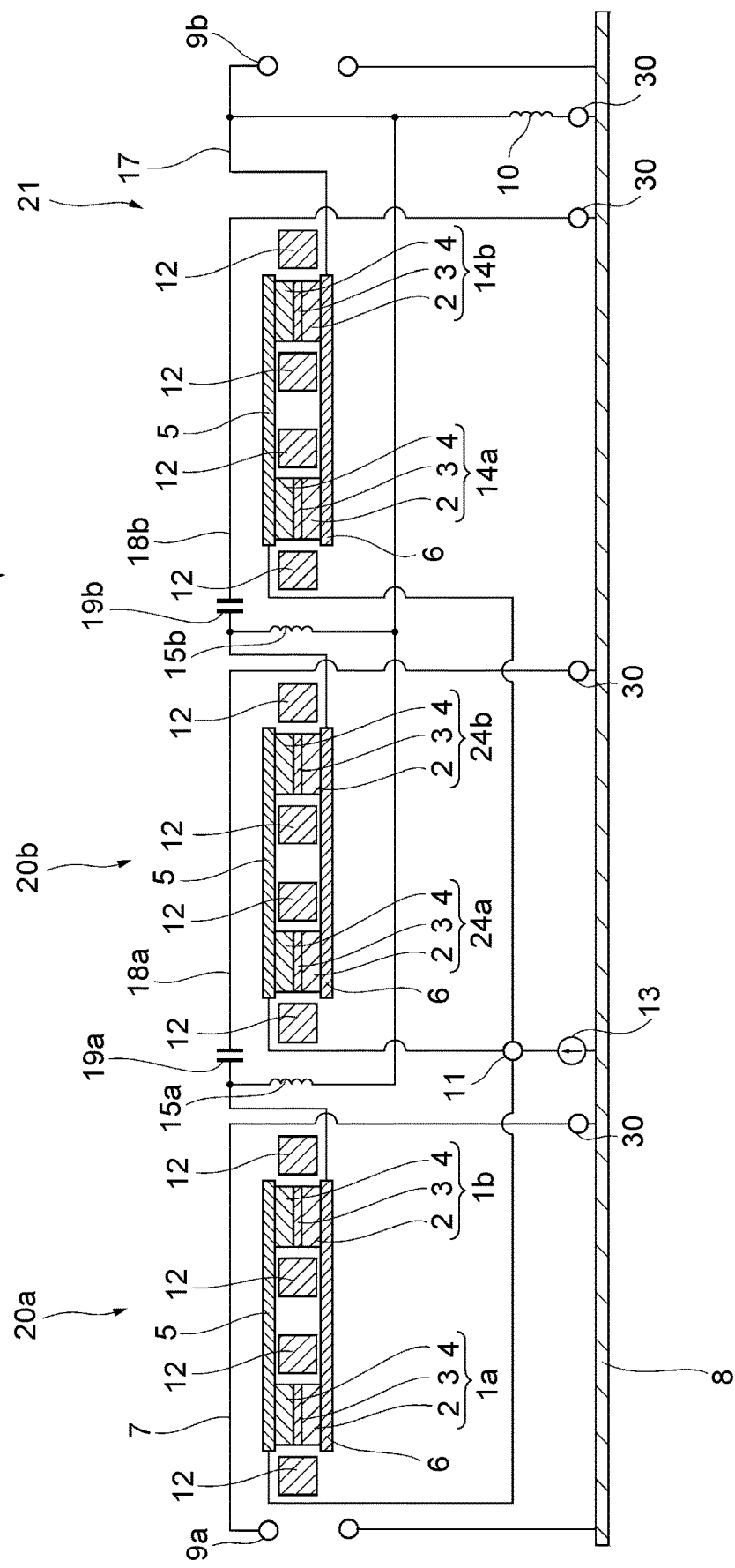
FIG. 24 is a schematic cross-sectional view illustrating the configuration of a magnetoresistive effect device according to a modification of the sixteenth embodiment.
Figure 25:
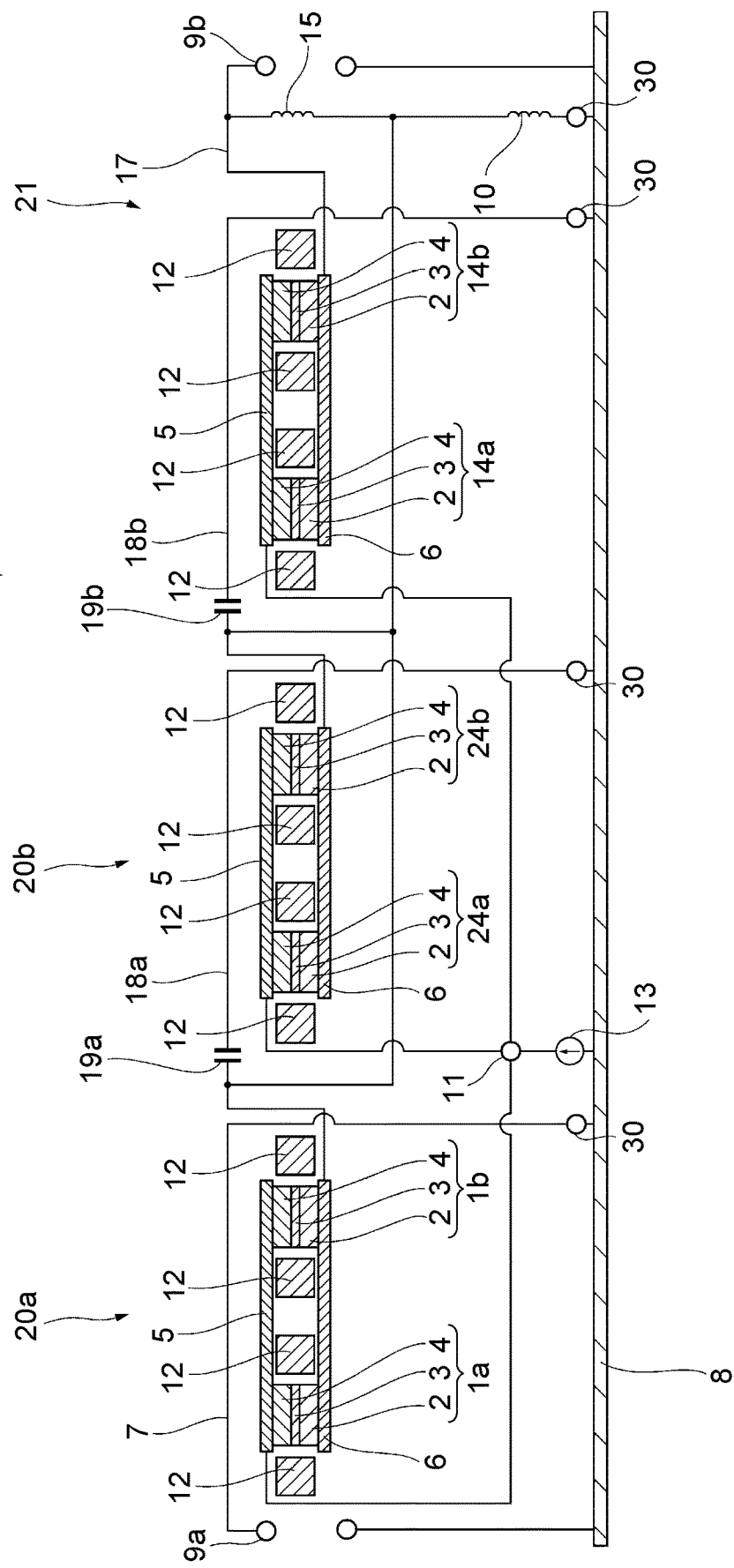
FIG. 25 is a schematic cross-sectional view illustrating the configuration of a magnetoresistive effect device according to a modification of the sixteenth embodiment.

In the magnetoresistive effect device 1600 of the sixteenth embodiment, the capacitors 19a and 19b may be connected in series to the magnetic-field generating signal lines 18a and 18b, respectively, and the ground 8 (the inductor 10) may be connected between the capacitor 19a and the magnetoresistive effect elements 1a and 1b or between the capacitor 19b and the magnetoresistive effect elements 24a and 24b, as in a magnetoresistive effect device 2000 illustrated in FIG. 23. With this configuration, the capacitor 19a (19b) prevents the DC current supplied from the DC current input terminal 11 from flowing into the magnetic-field generating signal line 18a (18b). In the magnetoresistive effect device 2000, one end of the inductor 15a may be connected between the capacitor 19a and the magnetoresistive effect elements 1a and 1b, the other end of the inductor 15a may be connected to the ground 8 (the inductor 10), one end of the inductor 15b may be connected between the capacitor 19b and the magnetoresistive effect elements 24a and 24b, and the other end of the inductor 15b may be connected to the ground 8 (the inductor 10), as in a magnetoresistive effect device 2100 illustrated in FIG. 24. With this configuration, the inductor 15a (15b) enables the high-frequency signal output from the magnetoresistive effect elements 1a and 1b (the magnetoresistive effect elements 24a and 24b) to efficiently flow through the magnetic-field generating signal line 18a (18b), thus efficiently generating the high-frequency magnetic field from the magnetic-field generating signal line 18a (18b). In the magnetoresistive effect device 2000, one end of the inductor 15 may be connected between the magnetoresistive effect elements 14a and 14b and the output port 9b and the other end of the inductor 15 may be connected between the capacitor 19a and the magnetoresistive effect elements 1a and 1b or between the capacitor 19b and the magnetoresistive effect elements 24a and 24b, as in a magnetoresistive effect device 2200 illustrated in FIG. 25. With this configuration, the inductor 15 suppresses flowing out of the high-frequency signal output from the magnetoresistive effect elements 1a and 1b (the magnetoresistive effect elements 24a and 24b) to the magnetoresistive effect elements 14a and 14b side and the output port 9b side to enable the high-frequency signal to efficiently flow through the magnetic-field generating signal line 18a (18b), thus efficiently generating the high-frequency magnetic field from the magnetic-field generating signal line 18a (18b).

Although the two magnetoresistive effect elements are connected in parallel to each other and the two magnetic-field applying mechanisms 12 for individually applying the magnetic fields to the respective magnetoresistive effect elements are provided in each of the MR unit 20 (or the first MR unit 20a and the second MR unit 20b) and the output unit 21 in the magnetoresistive effect devices 100 to 2200 of the first to sixteenth embodiments, three or more magnetoresistive effect elements may be connected in parallel to each other and three or more magnetic-field applying mechanisms 12 for individually applying the magnetic fields to the respective magnetoresistive effect elements may be provided. In this case, the width of the pass band is capable of being further increased. In addition, in each of the MR unit 20 (or the first MR unit 20a and the second MR unit 20b) and the output unit 21, multiple magnetoresistive effect elements may be connected in series to each other. Furthermore, in each of the MR unit 20 (or the first MR unit 20a and the second MR unit 20b) and the output unit 21, one magnetoresistive effect element may be provided, instead of the two magnetoresistive effect elements connected in parallel to each other. Furthermore, one magnetic-field applying mechanism 12 may apply a common magnetic field to the multiple magnetoresistive effect elements. In this case, differentiating the configurations (for example, the film configurations or the shapes) of the multiple magnetoresistive effect elements from each other enables the ferromagnetic resonant frequencies of the magnetization free layer of the multiple magnetoresistive effect elements to be differentiated from each other.

Instead of the inductors 10 and 15 (or 15a and 15b) of the first to sixteenth embodiments, resistance elements may be used. In this case, the resistance elements have a function to cut off the high-frequency components of the current with their resistance components. Each of the resistance elements may be a chip resistor or a resistor composed of a pattern line.

When the resistance element is used, instead of the inductor 10 in the output unit 21 in the first to sixteenth embodiments, a capacitor for cutting off the direct-current signal is preferably connected in series to the output-side signal line 17 between a connection portion of the resistance element to the output-side signal line 17 and the output port 9b in order to cause the DC current applied from the DC current input terminal 11 (or the output-unit-side DC current input terminal 11b) to efficiently flow through a closed circuit including the magnetoresistive effect elements 14a and 14b, the output-side signal line 17, the resistance element, the DC current input terminal 11, and the ground 8.

In the output unit 21 of the first to sixteenth embodiments, the inductor 10 may not be provided as long as the direct-current source 13 (or the output-unit-side direct-current source 13b) connected to the DC current input terminal 11 (or the output-unit-side DC current input terminal 11b) has a function to cut off the high-frequency components of the current and pass the constant components of the current. Also in this case, the DC current supplied from the DC current input terminal 11 (or the output-unit-side DC current input terminal 11b) flows through a closed circuit including the magnetoresistive effect elements 14a and 14b, the output-side signal line 17, the DC current input terminal 11 (or the output-unit-side DC current input terminal 11b), and the ground 8. With this closed circuit, it is possible to efficiently apply the DC current to the magnetoresistive effect elements 14a and 14b.

Although the example is described in the first to sixteenth embodiments in which the magnetoresistive effect device 100 (200, 300, 400, 500, 600, 700, 800, 900, 1000, 1100, 1200, 1300, 1400, 1500, 1600, 1700, 1800, 1900, 2000, 2100, or 2200) includes the magnetic-field applying mechanisms 12 as the frequency setting mechanisms (the effective magnetic field setting mechanisms), the frequency setting mechanisms (the effective magnetic field setting mechanisms) may be exemplified in the following manner. For example, applying an electric field to the magnetoresistive effect elements and varying the electric field enables the anisotropy magnetic field $H_K$ in the magnetization free layer to be varied to vary the effective magnetic field in the magnetization free layer, thus varying the ferromagnetic resonant frequencies of the magnetization free layers of the magnetoresistive effect elements. In this case, the mechanism to apply the electric field to the magnetoresistive effect elements serves as the frequency setting mechanism (the effective magnetic field setting mechanism). Alternatively, providing a piezoelectric body near the magnetization free layer, applying the electric field to the piezoelectric body to deform the piezoelectric body, and causing the magnetization free layer to strain enables the anisotropy magnetic field $H_K$ in the magnetization free layer to be varied to vary the effective magnetic field in the magnetization free layer, thus varying the ferromagnetic resonant frequencies of the magnetization free layers of the magnetoresistive effect elements. In this case, the mechanism to apply the electric field to the piezoelectric body and the piezoelectric body serve as the frequency setting mechanism (the effective magnetic field setting mechanism). Alternatively, providing a control film made of an antiferromagnetic material or a ferromagnetic material having a magnetoelectric effect so as to be magnetically coupled to the magnetization free layer, applying the magnetic field and the electric field to the control film, and varying at least one of the magnetic field and the electric field to be applied to the control film enables the exchange coupling magnetic field $H_{EX}$ in the magnetization free layer to be varied to vary the magnetic field in the magnetization free layer, thus varying the ferromagnetic resonant frequencies of the magnetization free layers of the magnetoresistive effect elements. In this case, the mechanism to apply the magnetic field to the control film, the mechanism to apply the electric field to the control film, and the control film serve as the frequency setting mechanism (the effective magnetic field setting mechanism).

The frequency setting mechanisms (the magnetic-field applying mechanisms 12) may not be provided if the magnetization free layer of each magnetoresistive effect element has a desired ferromagnetic resonant frequency even when the frequency setting mechanism is not provided (the magnetic field is not applied from the magnetic-field applying mechanisms 12).

In the first to sixteenth embodiments, the magnetoresistive effect device 100 (200, 300, 400, 500, 600, 700, 800, 900, 1000, 1100, 1200, 1300, 1400, 1500, 1600, 1700, 1800, 1900, 2000, 2100, or 2200) may include at least one of the resistance element, the inductor, and the capacitor connected to the input-side signal line 7. In this case, adjusting the impedance with the resistance element, the inductor, or the capacitor enables impedance matching at the input port 9a to be performed.

Figure 26:
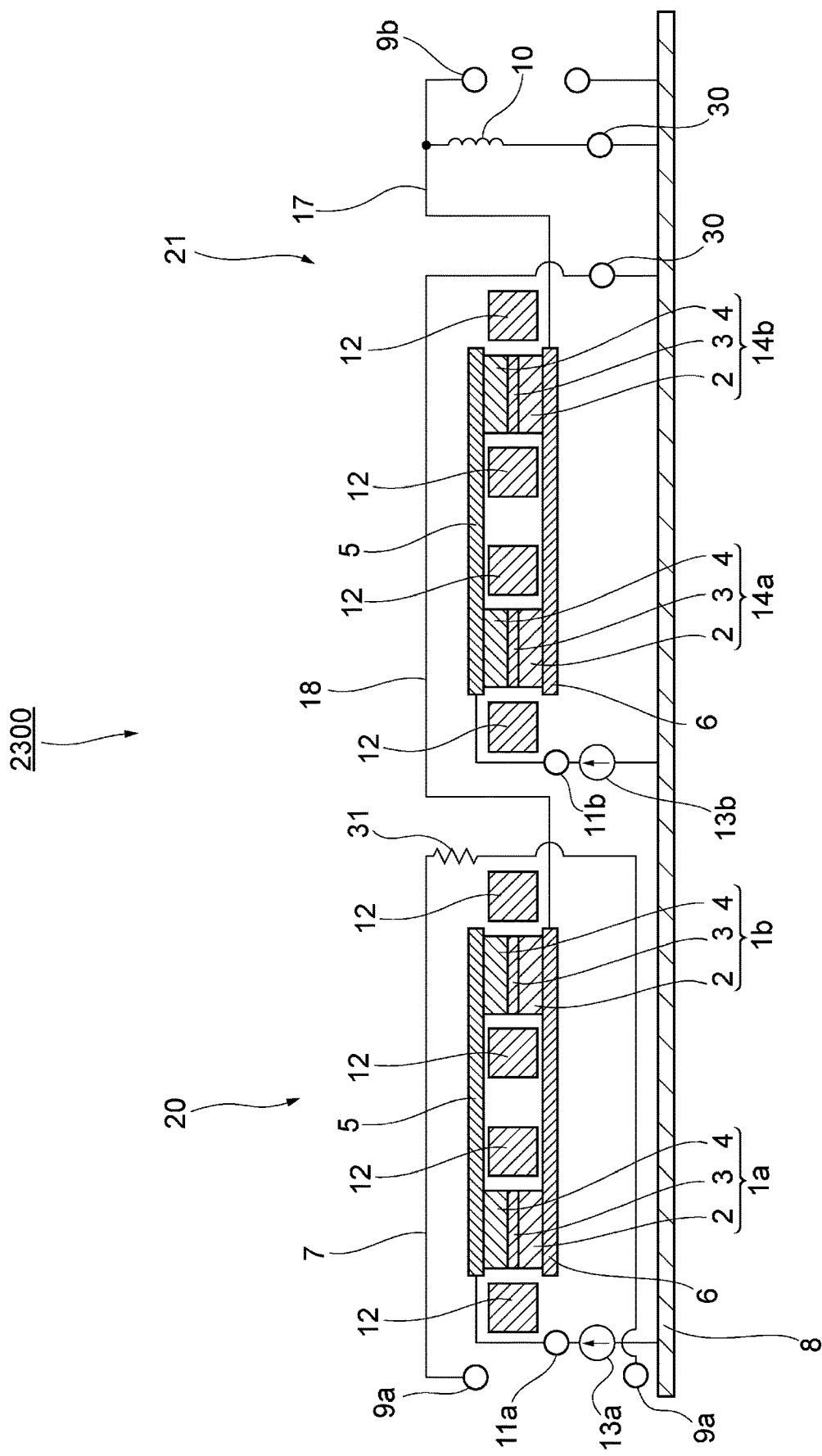
FIG. 26 is a schematic cross-sectional view illustrating the configuration of a magnetoresistive effect device according to a modification of the first embodiment.

Although the mode is exemplified in the first to sixteenth embodiments in which the high-frequency signal, which is a single-end signal, is input into the input port 9a as the magnetoresistive effect device 100 (200, 300, 400, 500, 600, 700, 800, 900, 1000, 1100, 1200, 1300, 1400, 1500, 1600, 1700, 1800, 1900, 2000, 2100, or 2200), a mode may be used in which the high-frequency signal, which is a differential signal, is input into the input port 9a. Also in this case, the magnetoresistive effect device 100 (200, 300, 400, 500, 600, 700, 800, 900, 1000, 1100, 1200, 1300, 1400, 1500, 1600, 1700, 1800, 1900, 2000, 2100, or 2200) may include at least one of the resistance element, the inductor, and the capacitor connected to the input-side signal line 7. In this case, adjusting the impedance with the resistance element, the inductor, or the capacitor enables the impedance matching at the input port 9a to be performed. FIG. 26 is a schematic cross-sectional view of a magnetoresistive effect device 2300, which results from modification of the magnetoresistive effect device 100 of the first embodiment, in a mode in which the high-frequency signal, which is the differential signal, is input into the input port 9a. In the magnetoresistive effect device 2300, the input-side signal line 7 is not connected to the ground 8 but is connected to the input port 9a into which the high-frequency signal, which is the differential signal, is input and a resistance element 31 is connected to the input-side signal line 7. Since the high-frequency signal, which is the differential signal, is input into the input port 9a and the high-frequency signal, which is the single-end signal, is output from the output port 9b in the magnetoresistive effect device 2300, the magnetoresistive effect device 2300 may function as a balun. Similarly, a magnetoresistive effect device resulting from modification of the magnetoresistive effect device 200, 300, 400, 500, 600, 700, 800, 900, 1000, 1100, 1200, 1300, 1400, 1500, 1600, 1700, 1800, 1900, 2000, 2100, or 2200 to a mode in which the high-frequency signal, which is the differential signal, is input into the input port 9a may function as the balun.

Although the example is described in the first to sixteenth embodiments in which the first ferromagnetic layer is the magnetization fixed layer and the second ferromagnetic layer is the magnetization free layer in the magnetoresistive effect elements 1a, 1b, 14a, 14b, 24a, and 24b, a magnetoresistive effect device in which the first ferromagnetic layer and the second ferromagnetic layer are the magnetization free layers may be used, instead of the magnetoresistive effect elements 1a, 1b, 14a, 14b, 24a, and 24b. Such a magnetoresistive effect element is exemplified by a magnetoresistive effect element in which the two magnetization free layers are magnetically coupled to each other via the spacer layer. More specifically, an example is given in which the two magnetization free layers are magnetically coupled to each other via the spacer layer so that the directions of the magnetization of the two magnetization free layers are not parallel to each other.

REFERENCE SIGNS LIST 1a, 1b, 14a, 14b, 24a, 24b magnetoresistive effect element
2 magnetization fixed layer
3 spacer layer
4 magnetization free layer
5 upper electrode
6 lower electrode
7 input-side signal line
8 ground
9a input port
9b output port
10, 15, 15a, 15b inductor
11 DC current input terminal
11a, 11c, 11dMR-unit-side DC current input terminal
11b output-unit-side DC current input terminal
12 magnetic-field applying mechanism
13 direct-current source
13a, 13c, 13d MR-unit-side direct-current source
13b output-unit-side direct-current source
16 insulator
17 output-side signal line
18, 18a, 18b magnetic-field generating signal line
19, 19a, 19b capacitor
20, 20a, 20b MR unit
21 output unit
23, 23a, 23b shunt capacitor
30 reference voltage terminal
100, 200, 300, 400, 500, 600, 700, 800, 900, 1000, 1100, 1200, 1300, 1400, 1500, 1600, 1700, 1800, 1900, 2000, 2100, 2200 magnetoresistive effect device

The invention claimed is:

1. A magnetoresistive effect device comprising:
an input port into which a high-frequency signal is to be input;
an input-side signal line which is connected to the input port and through which high-frequency current corresponding to the high-frequency signal input into the input port flows;
an MR unit including a first magnetoresistive effect element and a magnetic-field generating signal line; and
an output unit including a second magnetoresistive effect element, an output-side signal line, and an output port, the magnetoresistive effect device further including
at least one DC application terminal so as to be capable of applying DC current or DC voltage to at least one of the first magnetoresistive effect element in the MR unit and the second magnetoresistive effect element in the output unit,
wherein each of the first magnetoresistive effect element in the MR unit and the second magnetoresistive effect element in the output unit includes a first ferromagnetic layer, a second ferromagnetic layer, and a spacer layer arranged between the first ferromagnetic layer and the second ferromagnetic layer,
wherein the second magnetoresistive effect element in the output unit is connected to the output port via the output-side signal line,
wherein the input-side signal line is arranged so that a high-frequency magnetic field generated from the input-side signal line is applied to the first magnetoresistive effect element in the MR unit,
wherein the input-side signal line is disposed apart from the first magnetoresistive effect element in the MR unit with a first insulator there between;
wherein, in the MR unit, the first magnetoresistive effect element is connected to the magnetic-field generating signal line so that high-frequency current output from the first magnetoresistive effect element flows through the magnetic-field generating signal line,
wherein the magnetic-field generating signal line is arranged so that a high-frequency magnetic field generated from the magnetic-field generating signal line is applied to the second magnetoresistive effect element in the output unit; and
wherein the magnetic-field generating signal line is disposed apart from the second magnetoresistive effect element in the output unit with a second insulator there between.

2. The magnetoresistive effect device according to claim 1,
wherein the at least one DC application terminal comprises an MR-unit-side DC application terminal and an output-unit-side DC application terminal,
wherein, in the MR unit, the MR-unit-side DC application terminal is connected to the first magnetoresistive effect element, and
wherein, in the output unit, the output-unit-side DC application terminal is connected to the second magnetoresistive effect element.

3. The magnetoresistive effect device according to claim 2, further comprising:
a capacitor; and
an inductor,
wherein, in the MR unit, the capacitor is connected in series to the magnetic-field generating signal line and the inductor is connected between the capacitor and the first magnetoresistive effect element so as to be parallel to the magnetic-field generating signal line.

4. The magnetoresistive effect device according to claim 1, further comprising:
a capacitor,
wherein the capacitor is connected in series to the magnetic-field generating signal line, and
wherein the at least one DC application terminal is connected both between the capacitor and the first magnetoresistive effect element in the MR unit and between the output port and the second magnetoresistive effect element in the output unit.

5. The magnetoresistive effect device according to claim 4, further comprising:
an inductor,
wherein, in the MR unit, one end of the inductor is connected between the capacitor and the first magnetoresistive effect element, and
wherein the other end of the inductor is connected to the at least one DC application terminal.

6. The magnetoresistive effect device according to claim 4, further comprising:
an inductor,
wherein, in the output unit, one end of the inductor is connected between the second magnetoresistive effect element and the output port, and
wherein the other end of the inductor is connected to the at least one DC application terminal.

7. The magnetoresistive effect device according to claim 1, further comprising:
a capacitor,
wherein the capacitor is connected in series to the magnetic-field generating signal line,
wherein one end of the second magnetoresistive effect element in the output unit is connected between the capacitor and the first magnetoresistive effect element in the MR unit and the other end of the second magnetoresistive effect element in the output unit is connected to the output port, and
wherein the first magnetoresistive effect element in the MR unit, the second magnetoresistive effect element in the output unit, and the at least one DC application terminal are connected in series to each other.

8. The magnetoresistive effect device according to claim 7, further comprising:
a shunt capacitor; and
an inductor,
wherein one end of the second magnetoresistive effect element in the output unit is connected to the shunt capacitor,
wherein the other end of the second magnetoresistive effect element in the output unit is connected to the output port,
wherein one end of the inductor is connected between the first magnetoresistive effect element in the MR unit and the capacitor, and
wherein the other end of the inductor is connected between the second magnetoresistive effect element in the output unit and the shunt capacitor.

9. The magnetoresistive effect device according to claim 1,
wherein one end of the first magnetoresistive effect element in the MR unit is connected to the magnetic-field generating signal line,
wherein one end of the second magnetoresistive effect element in the output unit is connected to the output port, and
wherein the at least one DC application terminal is connected to both the other end of the first magnetoresistive effect element in the MR unit and the other end of the second magnetoresistive effect element in the output unit.

10. A magnetoresistive effect device comprising:
an input port into which a high-frequency signal is to be input;
an input-side signal line which is connected to the input port and through which high-frequency current corresponding to the high-frequency signal input into the input port flows;
an N-number MR units (N is a natural number not smaller than two) each including a respective first magnetoresistive effect element and a corresponding magnetic-field generating signal line; and
an output unit including a second magnetoresistive effect element, an output-side signal line, and an output port, the magnetoresistive effect device further including at least one DC application terminal so as to be capable of applying DC current or DC voltage to at least one of the first magnetoresistive effect elements in the N-number MR units and the second magnetoresistive effect element in the output unit,
wherein each of the first magnetoresistive effect element in the MR units and the second magnetoresistive effect element in the output unit includes a first ferromagnetic layer, a second ferromagnetic layer, and a spacer layer arranged between the first ferromagnetic layer and the second ferromagnetic layer,
wherein the second magnetoresistive effect element in the output unit is connected to the output port via the output-side signal line,
wherein the input-side signal line is arranged so that a high-frequency magnetic field generated from the input-side signal line is applied to the first magnetoresistive effect element in a first MR unit in the MR units,
wherein the input-side signal line is disposed apart from the first magnetoresistive effect element in the first MR unit with a first insulator therebetween;
wherein, in each of the MR units, the first magnetoresistive effect element is connected to the magnetic-field generating signal line so that high-frequency current output from the first magnetoresistive effect element flows through the magnetic-field generating signal line,
wherein the magnetic-field generating signal line in an M-th MR unit (M is a natural number that meets $1 \leq M \leq N-1$) in the MR units is arranged so that a high-frequency magnetic field generated from the magnetic-field generating signal line in the M-th MR unit is applied to the first magnetoresistive effect element in an M+1-th MR unit in the MR units,
wherein the magnetic-field generating signal line in the M-th MR unit is disposed apart from the first magnetoresistive effect element in the M+1-th MR unit with a second insulator therebetween;
wherein the magnetic-field generating signal line in an N-th MR unit in the MR units is arranged so that a high-frequency magnetic field generated from the magnetic-field generating signal line in the N-th MR unit is applied to the second magnetoresistive effect element in the output unit; and
wherein the magnetic-field generating signal line in the N-th MR unit is disposed apart from the second magnetoresistive effect element in the output unit with a third insulator therebetween.

11. The magnetoresistive effect device according to claim 10,
wherein the at least one DC application terminal comprises an MR-unit-side DC application terminal in each of the MR units and an output-unit-side DC application terminal in the output unit,
wherein, in each of the MR units, the MR-unit-side DC application terminal is connected to the first magnetoresistive effect element, and
wherein, in the output unit, the output-unit-side DC application terminal is connected to the second magnetoresistive effect element.

12. The magnetoresistive effect device according to claim 11, further comprising:
a capacitor; and
an inductor,
wherein, in at least one MR unit, among the N-number MR units, the capacitor is connected in series to the magnetic-field generating signal line and the inductor is connected between the capacitor and the first magnetoresistive effect element so as to be parallel to the magnetic-field generating signal line.

13. The magnetoresistive effect device according to claim 10, further comprising:
a capacitor,
wherein the capacitor is connected in series to the magnetic-field generating signal line in at least one MR unit, among the N-number MR units, and
wherein the at least one DC application terminal is connected both between the capacitor and the first magnetoresistive effect element in the at least one MR unit and between the output port and the second magnetoresistive effect element in the output unit.

14. The magnetoresistive effect device according to claim 13, further comprising:
an inductor,
wherein, in the at least one MR unit, one end of the inductor is connected between the capacitor and the first magnetoresistive effect element and the other end of the inductor is connected to the at least one DC application terminal.

15. The magnetoresistive effect device according to claim 13, further comprising:
an inductor,
wherein, in the output unit, one end of the inductor is connected between the second magnetoresistive effect element and the output port, and
wherein the other end of the inductor is connected to the at least one DC application terminal.

16. The magnetoresistive effect device according to claim 10,
wherein each of at least two MR units, among the N-number MR units, further includes a capacitor, and
wherein, in each of the at least two MR units, the capacitor is connected in series to the magnetic-field generating signal line and the at least one DC application terminal is connected between the capacitor and the first magnetoresistive effect element.

17. The magnetoresistive effect device according to claim 16,
wherein each of the at least two MR units further includes an inductor, and
wherein, in each of the at least two MR units, one end of the inductor is connected between the capacitor and the first magnetoresistive effect element and the other end of the inductor is connected to the at least one DC application terminal.

18. The magnetoresistive effect device according to claim 10, further comprising:
a capacitor,
wherein, in one MR unit, among the N-number MR units, the capacitor is connected in series to the magnetic-field generating signal line and one end of the second magnetoresistive effect element in the output unit is connected between the capacitor and the first magnetoresistive effect element,
wherein the other end of the second magnetoresistive effect element in the output unit is connected to the output port, and
wherein the first magnetoresistive effect element in the one MR unit, the second magnetoresistive effect element in the output unit, and the at least one DC application terminal are connected in series to each other.

19. The magnetoresistive effect device according to claim 18, further comprising:
a shunt capacitor; and
an inductor,
wherein one end of the second magnetoresistive effect element in the output unit is connected to the shunt capacitor,
wherein the other end of the second magnetoresistive effect element in the output unit is connected to the output port,
wherein one end of the inductor is connected between the first magnetoresistive effect element in the one MR unit and the capacitor, and
wherein the other end of the inductor is connected between the second magnetoresistive effect element in the output unit and the shunt capacitor.

20. The magnetoresistive effect device according to claim 10,
wherein each of two MR units, among the N-number MR units, further includes a capacitor,
wherein, in each of the two MR units, the capacitor is connected in series to the magnetic-field generating signal line,
wherein one end of the first magnetoresistive effect element in one MR unit in the two MR units is connected between the capacitor and the first magnetoresistive effect element in the other MR unit in the two MR units,
wherein, in the one MR unit, the other end of the first magnetoresistive effect element is connected to the magnetic-field generating signal line, and
wherein the first magnetoresistive effect elements in the two MR units and the at least one DC application terminal are connected in series to each other.

21. The magnetoresistive effect device according to claim 20, further comprising:
a shunt capacitor; and
an inductor,
wherein one end of the first magnetoresistive effect element in the one MR unit is connected to the shunt capacitor,
wherein, in the one MR unit, the other end of the first magnetoresistive effect element is connected to the magnetic-field generating signal line,
wherein one end of the inductor is connected between the first magnetoresistive effect element in the other MR unit and the capacitor, and
wherein the other end of the inductor is connected between the first magnetoresistive effect element in the one MR unit and the shunt capacitor.

22. The magnetoresistive effect device according to claim 10,
wherein one end of the first magnetoresistive effect element in at least one MR unit, among the N-number MR units, is connected to the magnetic-field generating signal line,
wherein one end of the second magnetoresistive effect element in the output unit is connected to the output port, and
wherein the at least one DC application terminal is connected to both the other end of the first magnetoresistive effect element in the at least one MR unit and the other end of the second magnetoresistive effect element in the output unit.

23. The magnetoresistive effect device according to claim 10,
wherein, in each of at least two MR units, among the N-number MR units, one end of the first magnetoresistive effect element is connected to the magnetic-field generating signal line, and wherein the at least one DC application terminal is connected to the other ends of the first magnetoresistive effect elements in the at least two MR units.

* * * * *